(12) United States Patent
Hsieh et al.

(10) Patent No.: US 7,795,063 B2
(45) Date of Patent: Sep. 14, 2010

(54) MICRO-ELECTRO-MECHANICAL SYSTEMS (MEMS) DEVICE AND PROCESS FOR FABRICATING THE SAME

(75) Inventors: Tsung-Min Hsieh, Taipei County (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 272 days.

(21) Appl. No.: 11/967,261

(22) Filed: Dec. 31, 2007

(65) Prior Publication Data
US 2009/0166772 A1 Jul. 2, 2009

(51) Int. Cl.
*H01L 21/00* (2006.01)
*H01L 29/78* (2006.01)
*H04R 25/00* (2006.01)
*H04R 11/02* (2006.01)

(52) U.S. Cl. .............. 438/53; 438/50; 257/414; 257/415; 257/416; 257/417; 257/419; 381/191; 381/396; 381/398; 381/399; 381/423; 310/12.03; 216/2

(58) Field of Classification Search ............. 438/48–98; 216/2, 58–109; 257/414–419; 381/191, 381/396, 398, 399, 423
See application file for complete search history.

(56) References Cited

U.S. PATENT DOCUMENTS

| | | | |
|---|---|---|---|
| 7,049,051 B2 | 5/2006 | Gabriel et al. | |
| 7,202,101 B2 | 4/2007 | Gabriel et al. | |
| 2007/0160247 A1 | 7/2007 | Makihata et al. | |
| 2007/0201710 A1* | 8/2007 | Suzuki et al. | 381/174 |
| 2007/0217635 A1 | 9/2007 | Ogura et al. | |
| 2009/0026561 A1* | 1/2009 | Reichenbach et al. | 257/416 |
| 2009/0108382 A1* | 4/2009 | Eriksen et al. | 257/419 |

* cited by examiner

*Primary Examiner*—Ha Tran T Nguyen
*Assistant Examiner*—Karen M Kusumakar
(74) *Attorney, Agent, or Firm*—Jianq Chyun IP Office

(57) ABSTRACT

A micro-electro-mechanical systems (MEMS) device includes a back-plate substrate, having an intended region formed with a plurality of perforating holes. A first structural dielectric layer, disposed on the back-plate substrate, wherein the dielectric layer having an opening above the intended region. An etching stop layer, disposed over the first structural dielectric layer. A second structural dielectric layer, formed over the back-plate substrate. The etching stop layer and the second structural dielectric layer form at least a part of a micro-machine diaphragm, and cover over the opening of the first structural dielectric layer to form a chamber between the micro-machine diaphragm and the back-plate substrate.

11 Claims, 40 Drawing Sheets

MICRO-ELECTRO-MECHANICAL SYSTEMS (MEMS) DEVICE AND PROCESS FOR FABRICATING THE SAME

BACKGROUND OF THE INVENTION

1. Field of Invention

The present invention relates to a micro-electro-mechanical system (MEMS) technology with semiconductor fabrication technology. More particularly, the present invention relates to a MEMS device to form a vibrating diaphragm based on semiconductor fabrication process.

2. Description of Related Art

MEMS devices have been widely fabricated using semiconductor fabricating process. However, it is still not easy to be integrated into the standard MOS (metal-oxide semiconductor) process, such as complementary MOS (CMOS) device. In general, a discrete MEMS device and a CMOS ASIC chip are packaged to a single die for application. However, the cost and performance for current technology cause not being popular. It is intended to develop a MEMS technology, so that the process for fabricating the MEMS can be compatible with the process for fabricating the CMOS device.

SUMMARY OF THE INVENTION

The invention provides a MEMS device and the fabrication process for the MEMS device, in which the fabrication process can be compatible between the CMOS and MEMS device. The MEMS device can thereby be compactly integrated with the CMOS device.

The invention provides a micro-electro-mechanical systems device, comprising a back-plate substrate, having an intended region formed with a plurality of perforating holes. A first structural dielectric layer, disposed on the back-plate substrate, wherein the dielectric layer having an opening above the intended region. An etching stop layer, disposed over the first structural dielectric layer. A second structural dielectric layer, formed over the back-plate substrate. The etching stop layer and the second structural dielectric layer form at least a part of a micro-machine diaphragm, and cover over the opening of the first structural dielectric layer to form a chamber between the micro-machine diaphragm and the back-plate substrate.

For an embodiment in the foregoing MEMS device, further for example, a metal-oxide semiconductor (MOS) device is also formed in the back-plate substrate at a region other than the MEMS device.

For an embodiment in the foregoing MEMS device, further for example, the back-plate substrate has a cavity region over the perforating holes at an opposite side to the first structural dielectric layer.

For an embodiment in the foregoing MEMS device, further for example, a side wall of the cavity has an opening angle, such as being tapered or vertical.

For an embodiment in the foregoing MEMS device, further for example, a side wall of the perforating holes in the back-plate substrate has an opening angle, such as being tapered or vertical.

For an embodiment in the foregoing MEMS device, further for example, a region of the etching stop layer within the cavity has no structure pattern.

For an embodiment in the foregoing MEMS device, further for example, the second structural dielectric layer includes a patented structure, and the patterned structure comprises a patterned conductive layer therein.

For an embodiment in the foregoing MEMS device, further for example, the patented structure comprises a dielectric layer and metal layer over the etching stop layer with a hole-distribution pattern to expose the etching stop layer.

For an embodiment in the foregoing MEMS device, further for example, the patented structure comprises a lower dielectric layer and metal layer over the etching stop layer with a hole-distribution pattern in the conductive layer to expose the lower dielectric layer.

For an embodiment in the foregoing MEMS device, further for example, a semiconductor structural is also formed in the back-plate substrate, facing to the etching stop layer.

For an embodiment in the foregoing MEMS device, further for example, the first structural dielectric layer includes a conductive pattern embedded therein.

For an embodiment in the foregoing MEMS device, further for example, a region of the etching stop layer within the chamber has an opening pattern distributed within the region of the chamber.

For an embodiment in the foregoing MEMS device, further for example, the second structural dielectric layer includes a patented structure, and the patterned structure comprises a patterned conductive layer therein.

For an embodiment in the foregoing MEMS device, further for example, the patented structure comprises a dielectric layer and metal layer over the etching stop layer with a hole-distribution pattern to expose the etching stop layer.

For an embodiment in the foregoing MEMS device, further for example, the patented structure comprises a lower dielectric layer and metal layer over the etching stop layer with a hole-distribution pattern in the conductive layer to expose the lower dielectric layer.

For an embodiment in the foregoing MEMS device, further for example, a peripheral side profile is a smooth indent curving shape.

For an embodiment in the foregoing MEMS device, further for example, the etching stop layer has an opening above the perforating holes of the back-plate substrate within the chamber.

For an embodiment in the foregoing MEMS device, further for example, the second structural dielectric layer with an embedded conductive pattern is serving as a portion of a wall of the cavity.

For an embodiment in the foregoing MEMS device, further for example, a material of the etching stop layer comprises silicon nitride, titanium nitride, conductive, or a different dielectric material from a dielectric material in the first structural dielectric layer for providing an etching stop function.

For an embodiment in the foregoing MEMS device, further for example, the first structural dielectric layer, the etching stop layer, and the second structural dielectric layer together have a perforating opening to connect the chamber to form an open path.

The invention still provides a micro-electro-mechanical systems (MEMS) device, comprising a back-plate substrate, having an intended region formed with a plurality of perforating holes. A first structural dielectric layer is disposed on the back-plate substrate, wherein the dielectric layer having an opening above the intended region. An etching stop layer is disposed over the first structural dielectric layer. Wherein, the etching stop layer serves as at least a part of a micro-machine diaphragm, and cover over the opening of the first structural dielectric layer to form a chamber between the micro-machine diaphragm and the back-plate substrate.

For an embodiment in the foregoing MEMS device, further for example, a metal-oxide semiconductor (MOS) device is also formed in the back-plate substrate at a region other than the MEMS device.

The invention still provides a micro-electro-mechanical systems (MEMS) device comprising a back-plate substrate, having an intended region formed with a plurality of perforating holes, and a first structural dielectric layer disposed on the back-plate substrate. The first structural dielectric layer has an opening above the intended region. An etching stop layer is disposed over the first structural dielectric layer at a peripheral region of the opening. A second structural dielectric layer is disposed over the etching stop layer. Wherein, the second structural dielectric layer serves as at least a part of a micro-machine diaphragm, and covers over the opening of the first structural dielectric layer to form a chamber between the micro-machine diaphragm and the back-plate substrate.

For an embodiment in the foregoing MEMS device, further for example, the first structural dielectric layer has a device structure on the back-plate structure, so as to have two electrodes respectively embedded in the first structural dielectric layer and the second structural dielectric layer.

The invention still provides a micro-electro-mechanical systems (MEMS) device, comprising a back-plate substrate, having an intended region formed with a plurality of perforating holes. A first structural dielectric layer is disposed on the back-plate substrate, wherein the dielectric layer has an opening above the intended region. A second structural dielectric layer is disposed over the first structural dielectric layer, and covering the opening of the first structural dielectric layer, wherein the second structural dielectric layer has a plurality of sub-openings in connection with the opening of the first structural dielectric layer. An etching stop layer is disposed over the second structural dielectric layer and separating the sub-openings from the opening of the first structural dielectric layer. Wherein, the etching stop layer and the second structural dielectric layer serve as at least a part of a micro-machine diaphragm, and cover over the opening of the first structural dielectric layer to form a cavity between the micro-machine diaphragm and the back-plate substrate.

For an embodiment in the foregoing MEMS device, further for example, the first structural dielectric layer has a device structure on the back-plate structure, so as to have two conductive patterns respectively embedded in the first structural dielectric layer and the second structural dielectric layer.

The invention still provides a micro-electro-mechanical systems (MEMS) device, comprising a back-plate substrate, having an intended region formed with a plurality of perforating holes. A first structural dielectric layer is disposed on the back-plate substrate, wherein the dielectric layer having an opening above the intended region. A conductive etching stop layer is disposed over the first structural dielectric layer. The conductive etching stop layer serves as at least a part of a micro-machine diaphragm, and cover over the opening of the first structural dielectric layer to form a cavity between the micro-machine diaphragm and the back-plate substrate.

For an embodiment in the foregoing MEMS device, further for example, the conductive etching stop layer has a plurality of indent regions.

The invention still provides a micro-electro-mechanical systems (MEMS) device, comprises a back-plate substrate, having an intended region formed with a plurality of perforating holes. A structural dielectric layer is disposed over the back-plate substrate, wherein the dielectric layer having an opening above the intended region. A structural conductive etching stop layer, disposed over the structural dielectric layer, wherein the structural conductive layer covers the opening of the structural dielectric layer to have a chamber.

In embodiments, for example, the structural conductive etching stop layer has two metal layers in different levels and a metal via vertically connects the two metal layers. The metal via may be in multiple pairs and a dielectric block is wrapped by two metal layers and each pair of the metal via.

The invention still provides a method for forming a micro-electro-mechanical systems (MEMS) device, comprising providing a substrate. A first structural dielectric layer is formed over the substrate, wherein the first structural dielectric layer including a conductive pattern embedded therein. An etching stop layer is formed over the first structural dielectric layer. A second structural dielectric layer is formed over the etching stop layer, wherein the second structural dielectric layer serves as at least a part of a micro-machine diaphragm. The substrate is patterned from a back side to form a plurality of perforating openings in the substrate to expose the first structural dielectric layer. The first structural dielectric layer is patterned from the perforating openings of the substrate to form a chamber in the first structural dielectric layer under the second structural dielectric layer. Wherein, the etching stop layer is used as a stop when etching the first structural dielectric layer.

For an embodiment in the foregoing method for forming a micro-electro-mechanical systems (MEMS) device, for example, further comprises forming a device structure on the substrate before forming the structural dielectric layer.

For an embodiment in the foregoing method for forming a micro-electro-mechanical systems (MEMS) device, further for example, the method further comprises the first structural dielectric layer simultaneously formed while a metal-oxide semiconductor (MOS) device is formed over the substrate at a region other the MEMS device.

For an embodiment in the foregoing method for forming a micro-electro-mechanical systems (MEMS) device, further for example, the method further comprises forming a second structural dielectric layer over the etching stop layer.

For an embodiment in the foregoing method for forming a micro-electro-mechanical systems (MEMS) device, further for example, the etching stop layer has a hole-distribution pattern or a blanket layer.

The invention still provides a method for forming a micro-electro-mechanical systems (MEMS) device, comprising providing a substrate. A first structural dielectric layer is formed over the substrate, wherein the first structural dielectric layer including a conductive pattern embedded therein. A second structural dielectric layer is formed over the etching stop layer, wherein the second structural dielectric layer serves as at least a part of a micro-machine diaphragm. An etching stop layer is formed over the first structural dielectric layer. The substrate is patterned from a back side to form a plurality of perforating openings in the substrate to expose the first structural dielectric layer. The first structural dielectric layer and the second structural dielectric layer are patterned through the perforating openings of the substrate to form a chamber in the first structural dielectric layer under the second structural dielectric layer, wherein the etching stop layer is used as a stop when etching the first structural dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention provides novel MEMS structures. This invention is directed to the integration of a MEMS device and CMOS devices by taking advantage of semiconductor fabrication process. In such technology, a MEMS device with a low cost for fabrication, a miniature size and high performance for application can be obtained. Moreover, for example, the present invention takes a few process steps to accomplish the integration of MEMS devices in addition to the CMOS process. The invention can be implemented on many MEMS devices, such as MEMS microphone, MEMS speaker or pressure sensor that needs a flexible diaphragm as a capacitive sensor; or accelerometer, switches or variable capacitor that needs various designed.

Several embodiments are provided for descriptions but not for limiting the present invention. Also noted, the disclosure in different embodiments may be properly combined as another embodiment.

Figure 1:
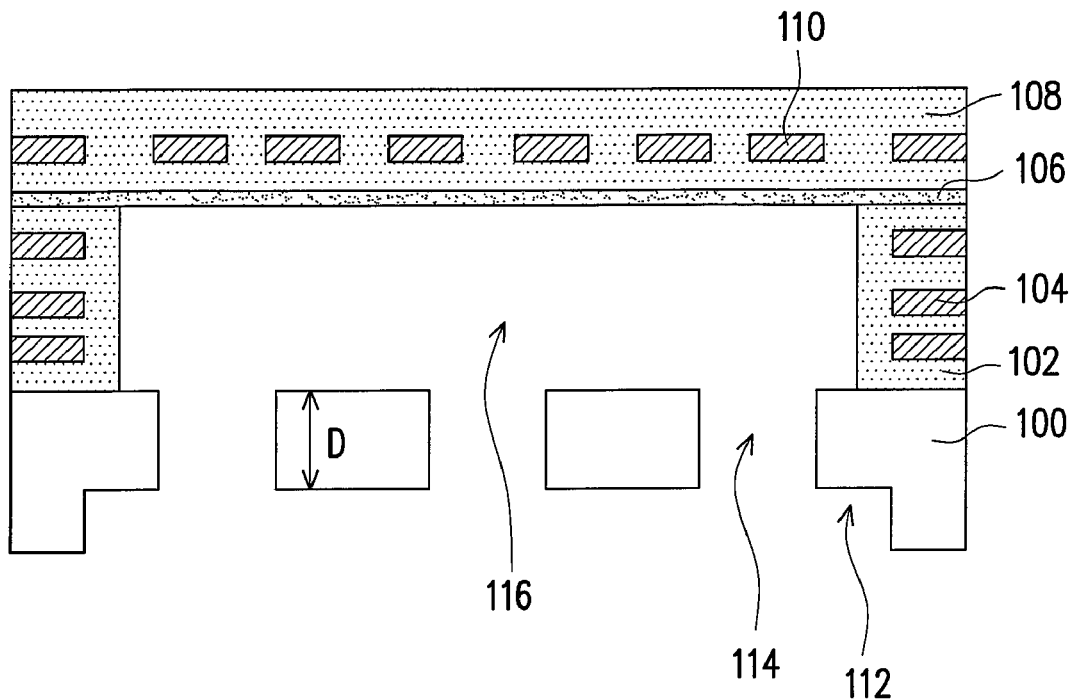
FIG. 1 is a cross-sectional view, schematically illustrating a semiconductor MEMS device, according to an embodiment of the invention.

FIG. 1 is a cross-sectional view, schematically illustrating a semiconductor MEMS device, according to an embodiment of the invention. In FIG. 1, a substrate 100, such as silicon substrate, has a region reserved for fabricating the MEMS device during fabrication process for the CMOS device. A first structural dielectric layer 102 including the embedded conductive layer 104 is formed on the substrate 100. The structural dielectric layer 102 can be, for example, a part of the dielectric layer for the CMOS device, so that some conductive pattern 104 may be embedded in the structural dielectric layer 102, which may be composed by multiple interdielectric layers. The structural dielectric layer 102 has an opening 116, which is to be a chamber later. A region of the substrate 100 within the opening 116 has some perforating hole 114, which may be serving, for example, as an air venting hole. The substrate 100 also has a cavity region 112, so that a thickness D of the substrate 100 at this region is thinned to a required thickness. Further, the depth of the opening of the dielectric layer 102 of the first structural dielectric layer may be, for example, 2-5 microns. An etching stop layer 106 is disposed over the first structural dielectric layer, and covers over the opening 116 to form the cavity 116. A second structural dielectric layer including, for example, the dielectric layer 102 and the conductive pattern 110, is disposed over the etching stop layer 106. As a result, the second structural dielectric layer with the etching stop layer can serve as a diaphragm. For example, if the diaphragm is operated in vibrating for producing a voice, the cavity 116 and the perforating holes 114 can trigger the air to produce the sound. Here, the perforating holes 114 have a distribution within the region of the opening 116.

Figure 2:
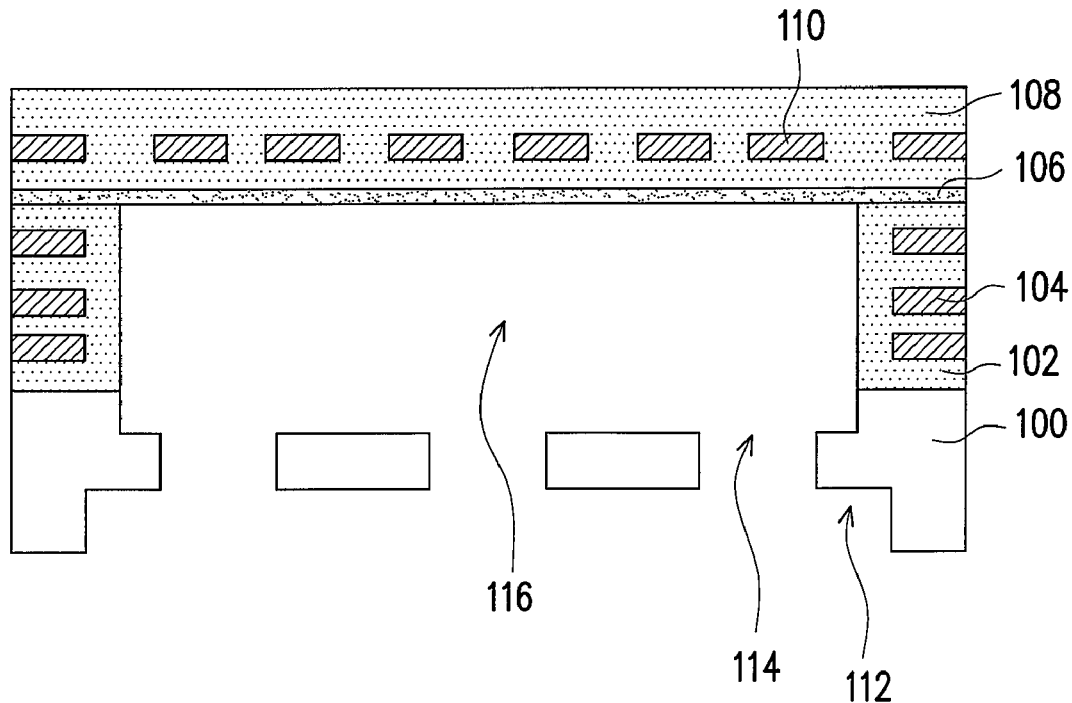
FIG. 2 is a cross-sectional view schematically illustrating another semiconductor MEMS device, according to an embodiment of the invention.

FIG. 2 is a cross-sectional view schematically illustrating another semiconductor MEMS device, according to an embodiment of the invention. In FIG. 2, if the substrate 100 has been had a shallow trench isolation (STI) thereon, the isolation material is etched away, so that the substrate has a trench (indention) from the top side of the substrate 100. As a result, the thickness D, shown in FIG. 1, is smaller.

Figure 3:
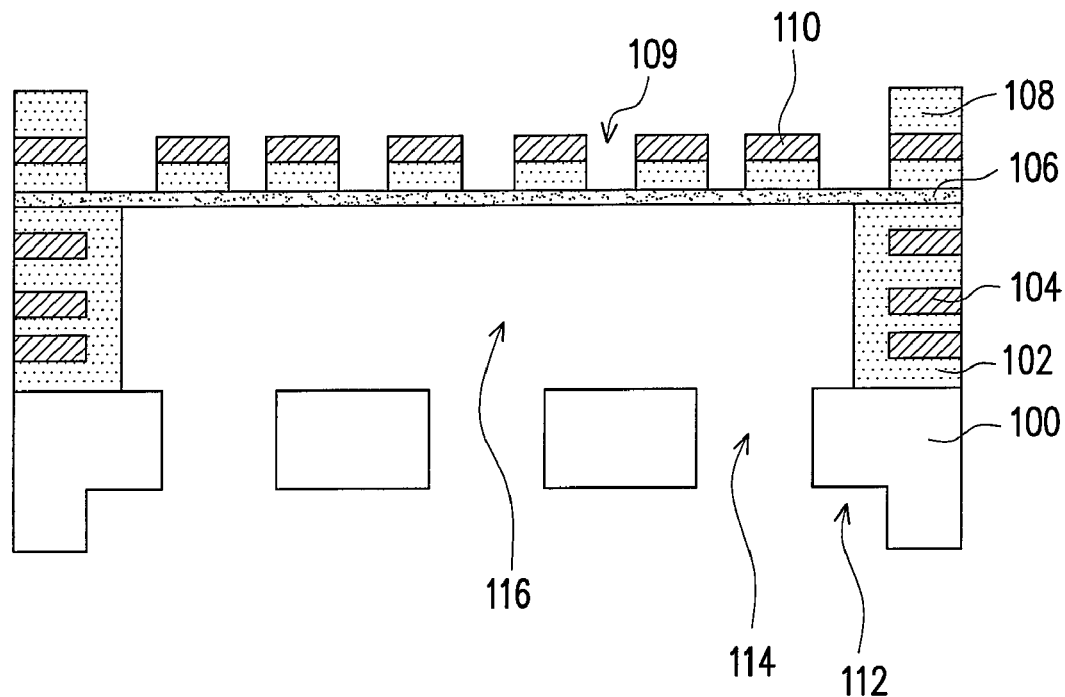
FIG. 3 is a cross-sectional view schematically illustrating another semiconductor MEMS device, according to an embodiment of the invention.

FIG. 3 is a cross-sectional view schematically illustrating another semiconductor MEMS device, according to an embodiment of the invention. In FIG. 3, the structural dielectric layer 108 with the conductive pattern 110 can be further patterned into the desires pattern by also using the etching stop as the base without affecting the substrate 100 and the structural dielectric layer 102. As a result, some sub-openings 109 can be formed, distributing above the cavity 116. In further, a portion of the etching stop layer not under the conductive pattern 110 can also be removed at the end.

Figure 4:
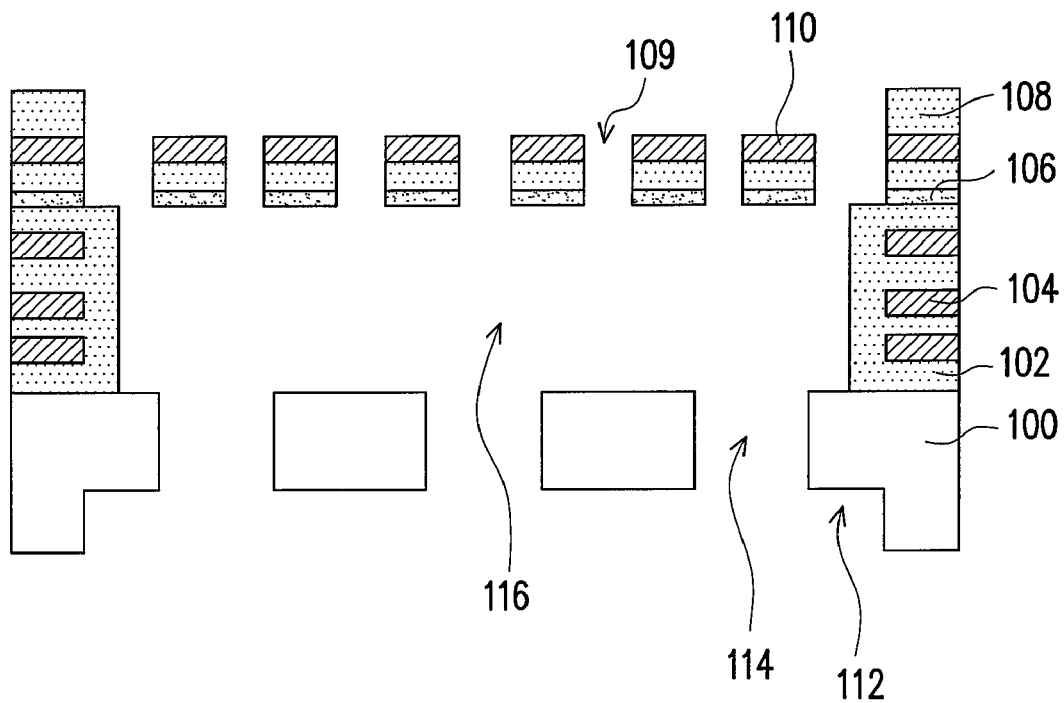
FIG. 4 is a cross-sectional view schematically illustrating another semiconductor MEMS device, according to an embodiment of the invention.

FIG. 4 is a cross-sectional view schematically illustrating another semiconductor MEMS device, according to an embodiment of the invention. In FIG. 4, for the further process, a portion of the etching stop layer 106 within the sub-opening 109 can be etched away, so that the subs-openings 109 are connected to the cavity 116, allowing an open path.

Figure 5:
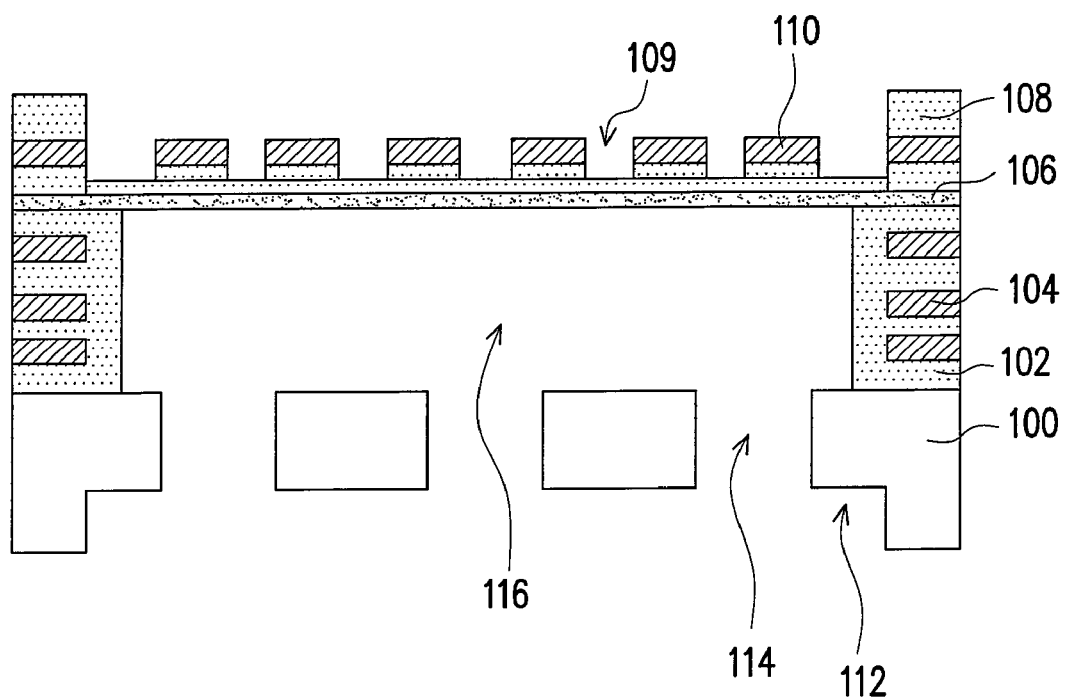
FIG. 5 is a cross-sectional view schematically illustrating another semiconductor MEMS device, according to an embodiment of the invention.

FIG. 5 is a cross-sectional view schematically illustrating another semiconductor MEMS device, according to an embodiment of the invention. Alternatively in FIG. 5, based on the structure in FIG. 1, the dielectric layer 108 can be just etched by a portion without exposing the etching stop layer 106.

Figure 6:
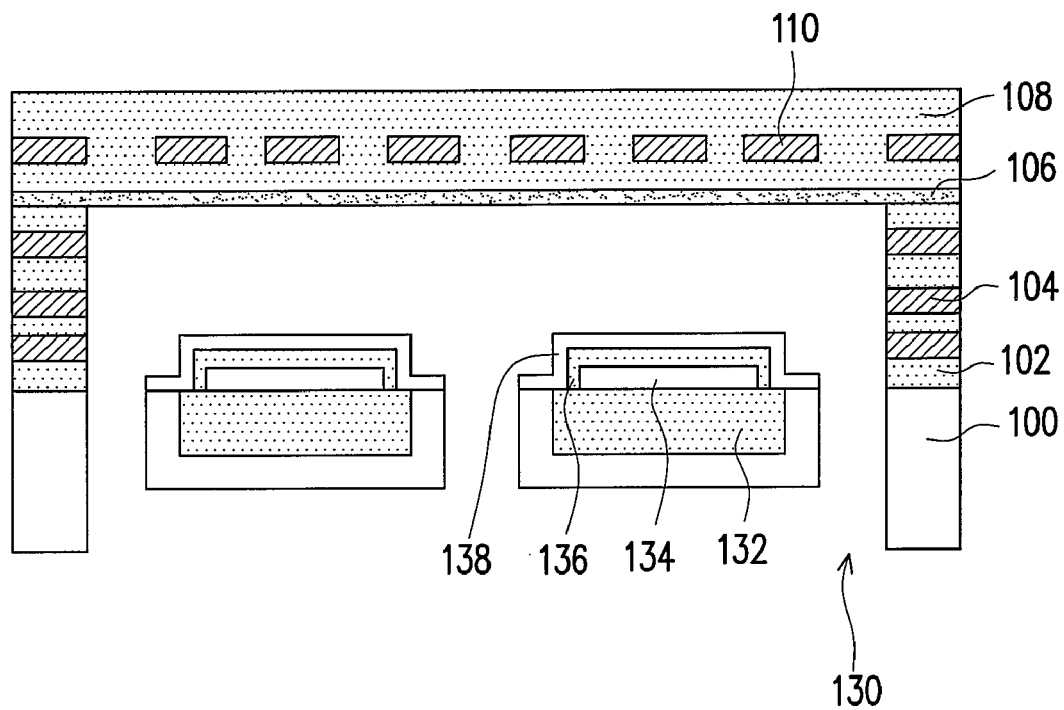
FIG. 6 is a cross-sectional view schematically illustrating another semiconductor MEMS device, according to an embodiment of the invention.

FIG. 6 is a cross-sectional view schematically illustrating another semiconductor MEMS device, according to an embodiment of the invention. In FIG. 6, in comparing with the structure in FIG. 1, the substrate 100 may be formed with another device, for example including the shallow trench isolation 132, the conductive layer 134 such as polysilicon or metal, the oxide layer 136 and a nitride layer 138 such as the silicon nitride layer or titanium nitride. The nitride layer 138 maybe have the same material as that of the etching stop layer. The perforate holes 130 are also formed. It should be noted that the device on the substrate can be formed, based on the semiconductor fabrication process, without introducing other mechanical technology.

Figure 7:
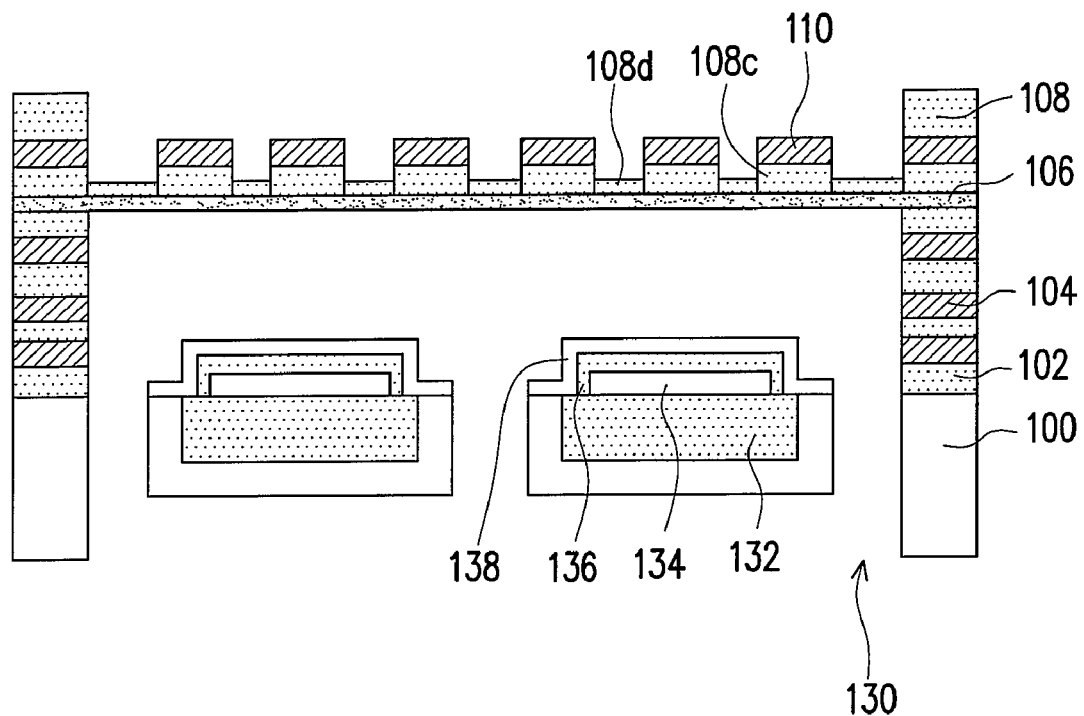
FIG. 7 is a cross-sectional view schematically illustrating another semiconductor MEMS device, according to an embodiment of the invention.

FIG. 7 is a cross-sectional view, schematically illustrating another semiconductor MEMS device, according to an embodiment of the invention. In FIG. 7, being continuous from FIG. 6, the further processes can be performed to pattern the structural dielectric layer 108. For example, another etching back process is performed from the top side of the substrate, so as to remove a top portion of the structural dielectric layer 108. Here, when the conductive pattern 110 is exposed, the metal pattern 110 is also used as the etching mask. As a result, the portion 108c of the structural dielectric layer 108 under the conductive pattern 110 remains while the other portion 108d of the structural dielectric layer 108 is etched down with lower level but, for example, without exposing the etching stop layer 106.

Figure 8:
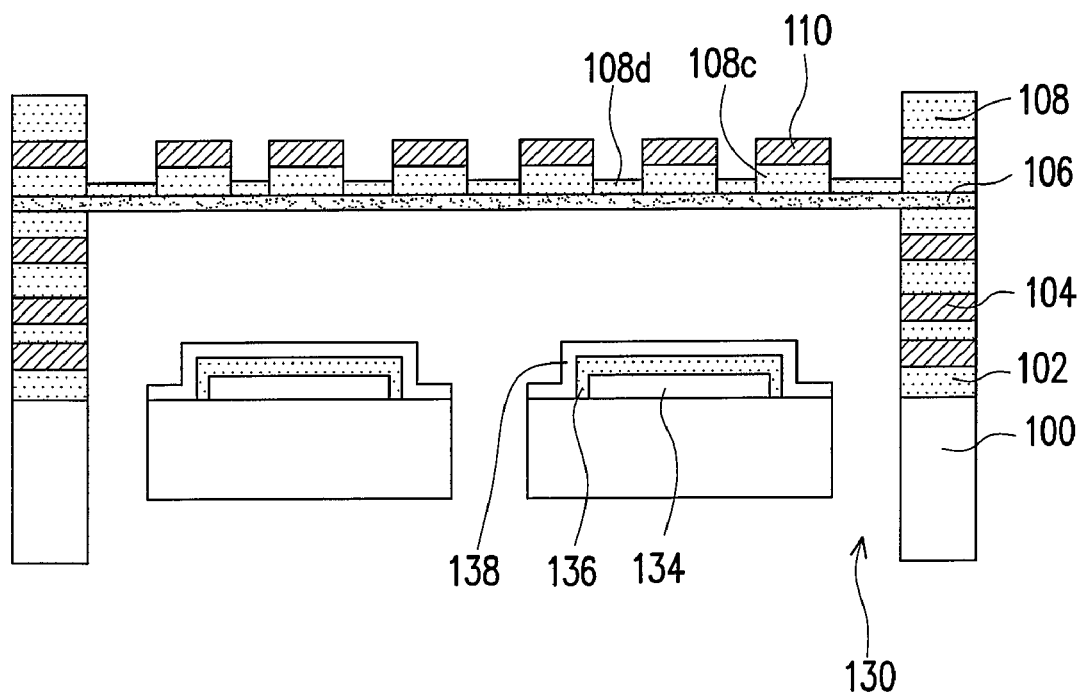
FIG. 8 is a cross-sectional view schematically illustrating another semiconductor MEMS device, according to an embodiment of the invention.

FIG. 8 is a cross-sectional view, schematically illustrating another semiconductor MEMS device, according to an embodiment of the invention. In FIG. 8, alternatively, the substrate 100 may need no the shallow trench isolation structure 132 in FIG. 7. In this situation, the process to form FIG. 7, as to be described FIGS. 27A-27E, can be applied but the substrate 100 in FIG. 27A does not need to form the STI structure. The structure in FIG. 8 is then similar to the structure in FIG. 7 but without the STI structure in the substrate 100. This is depending on the design choice.

Figure 9:
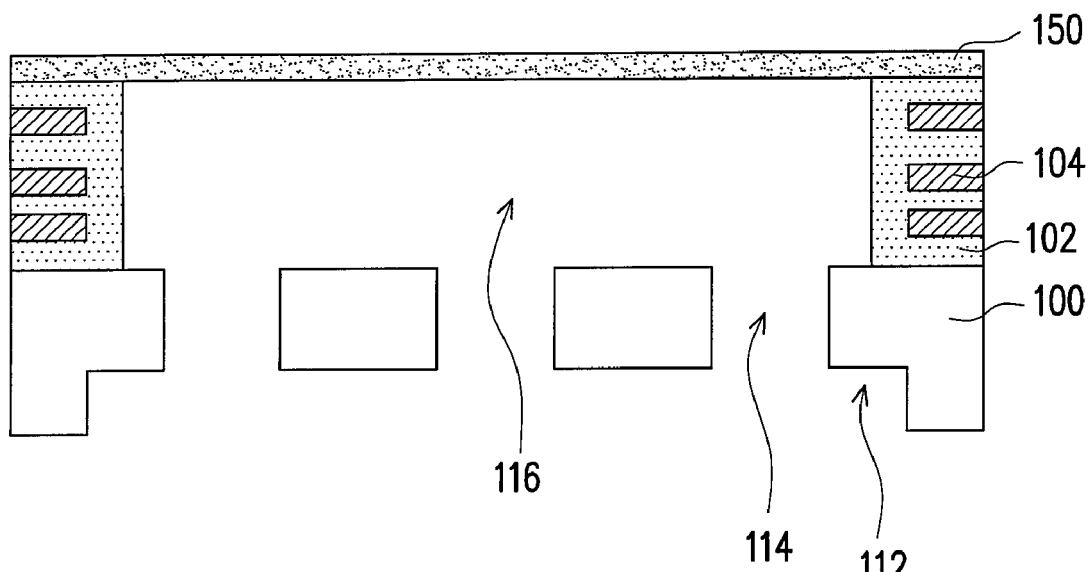
FIG. 9 is a cross-sectional view schematically illustrating another semiconductor MEMS device, according to an embodiment of the invention.

FIG. 9 is a cross-sectional view, schematically illustrating another semiconductor MEMS device, according to an embodiment of the invention. In FIG. 9, with the help of the etching stop layer, it allows the dielectric layers 102 and 108 to be patterned into desired structure based on the semiconductor fabricating process. However, according to the intended function of diaphragm, the etching stop layer itself may be sufficient without the other structure. As a result, a single etching stop layer 150 may be sufficient to serve as the diaphragm on the structural dielectric layer 102.

FIGS. 10-24 cross-sectional views, schematically illustrating several semiconductor MEMS devices, according to several embodiments of the invention. Based on different process flow, several different structures of MEMS device can be formed.

Figure 10:
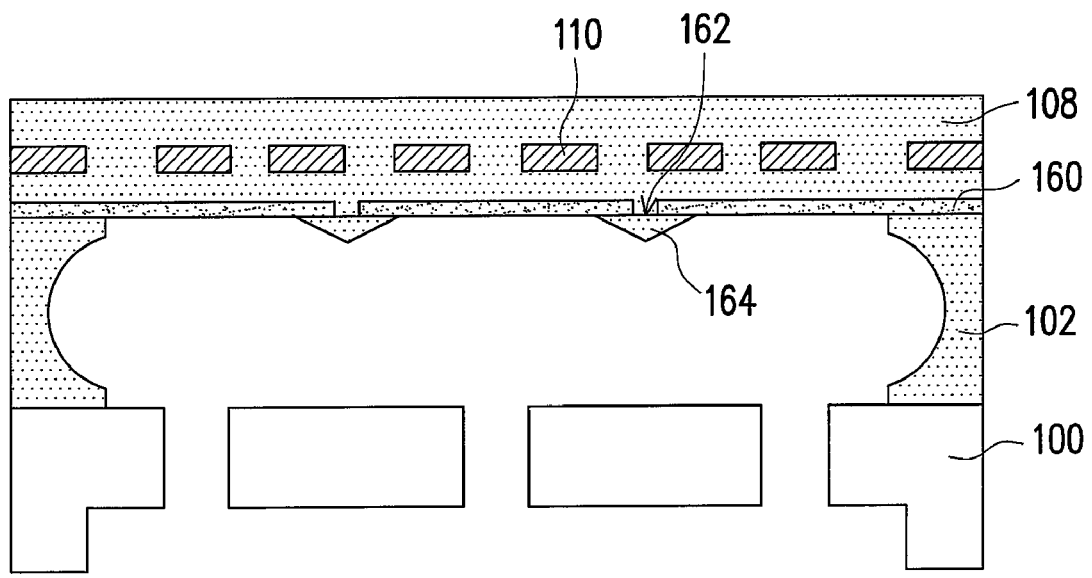
FIGS. 10-24 are cross-sectional views, schematically illustrating several semiconductor MEMS devices, according to several embodiments of the invention.

In FIG. 10, a structural dielectric layer 102 is formed over the substrate 100. An etching stop layer 160 is disposed over the structural dielectric layer 102. The structural dielectric layer 102 may have the conductive pattern at other region. The etching stop layer 160 is patterned to have the opening 162 for serving as a chamber. The sidewall of the chamber may be, for example, a curving shape. Another structural dielectric layer 108 is formed over the etching stop layer 160. The structural dielectric layer 108 may have the conductive pattern 110. The substrate 100 has the vent hole and the cavity. Some residue 164 of the structural dielectric layer 102 due to the fabrication process may still remain and cover the openings 162 of the etching stop layer 160. This is another structure of MEMS device, for example.

Figure 11:
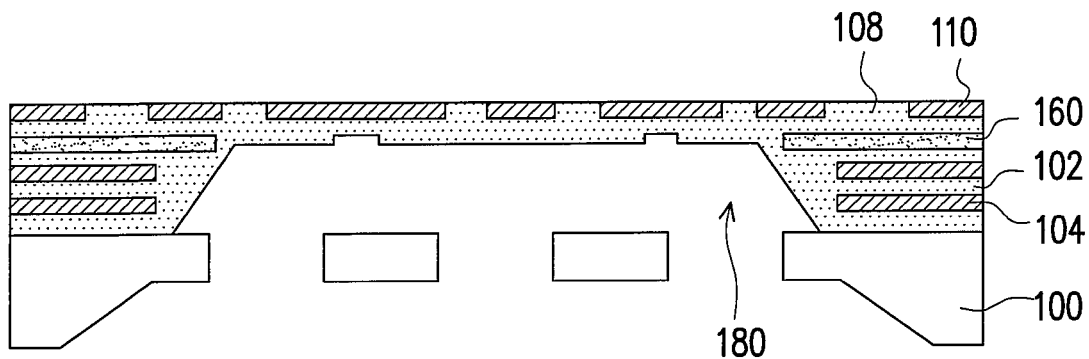

In FIG. 11, another embodiment for another MEMS device is to be formed. The structural dielectric later 102 is formed over the substrate 100. The etching stop layer 160 is formed over the structural dielectric later 102. The etching stop layer may have, for example, the opening 162. Another structural dielectric layer 108 is formed over the etching stop layer 160. A portion of the structural dielectric layer is removed to form a chamber 180, wherein a portion of the etching stop 160 may be, for example, the removed also. Therefore, the diaphragm of the MEMS device is formed, including the second structural dielectric layer with the conductive pattern 110. As a result, another MEMS device has the structure, for example, shown in FIG. 11.

Figure 12:
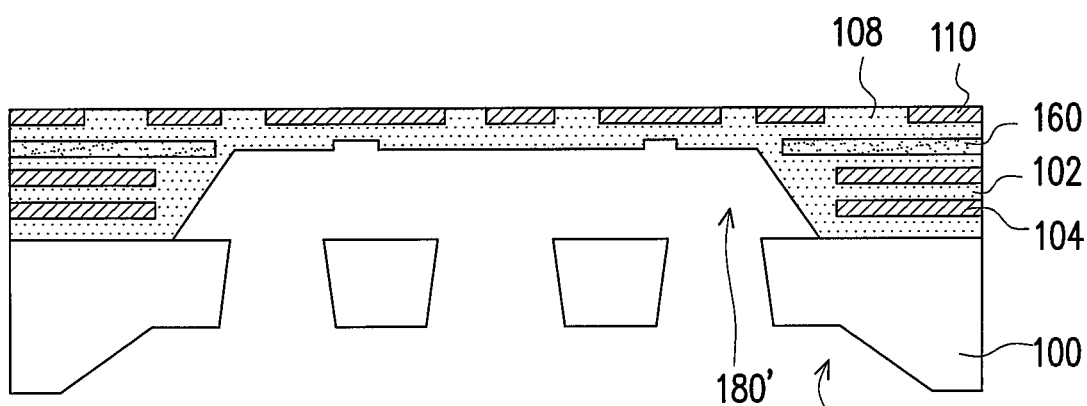

In FIG. 12, alternatively, due to different fabrication process, the structure may be slightly different. The sidewall of the perforating hole may be almost vertical to the substrate 100 or slightly slant to the substrate 100 and is thicker. The cavity 170' may is be the same. These are the design choice.

Figure 13:
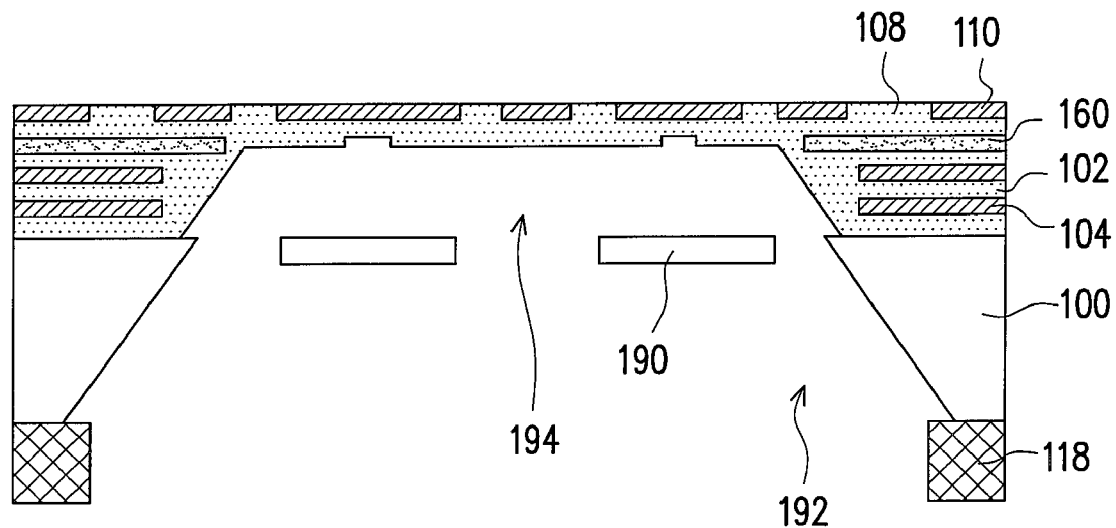

In FIG. 13, in further considering the structure of the MEMS device, another fabrication process flow is alternatively described. The substrate 100 may have been formed with a doped area 190 in the substrate 100, in which the dopant type, the dopant density, and the doped depth are the design choice. Then the structural dielectric layer 102 is formed over the substrate 100. The etching stop layer 160 is formed over the structural dielectric layer 102. Another structural dielectric layer 108 is formed over the etching stop layer 160. For example, as previously described, the etching stop layer may have opening 162. The structural dielectric layer 102 may have the conductive pattern 104. The structural dielectric layer 108 may have the conductive layer 110. A portion of the structural dielectric layer 102 is removed by etching with photoresist layer 118 on the backside of the substrate 100 to have the chamber 194 while the substrate 100 has the cavity 192. As a result, the MEMS device can also be accomplished.

Figure 14:
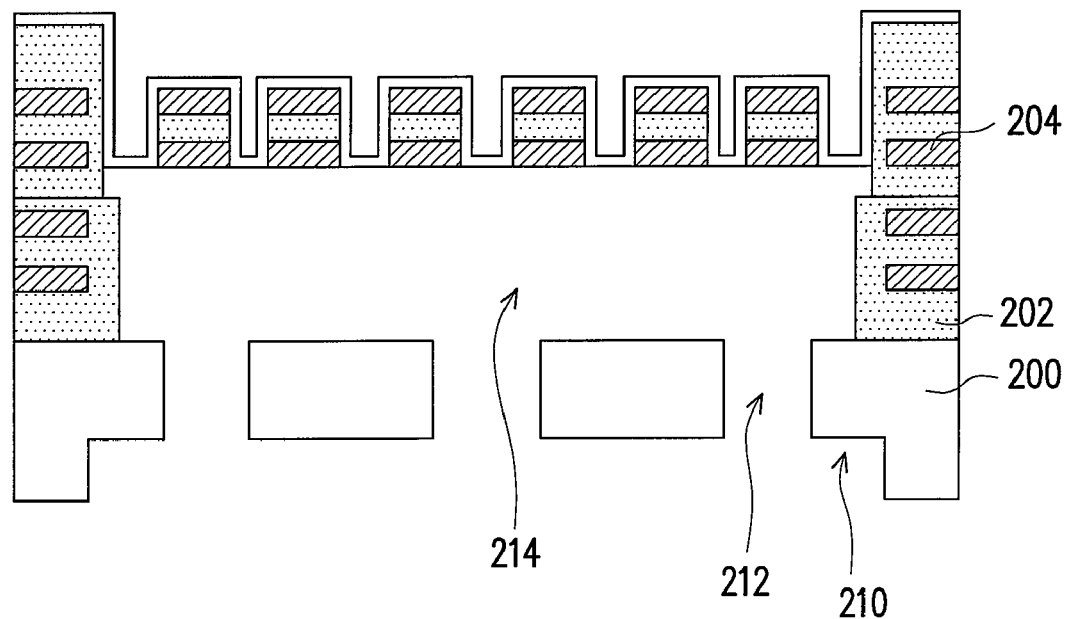

FIG. 14 is a cross-sectional view, schematically illustrating another semiconductor MEMS device, according to an embodiment of the invention. In FIG. 14, the substrate 200 can have the concave region 210 with the perforating holes 212. The structural dielectric layer 202 can be formed with a chamber 214, by using the perforating holes 212 for etching. The conductive pattern 204 can be formed in structural dielectric layer 202. However, the etching stop layer can be over the structural dielectric layer 204, in which the chamber 214 can expose a portion of the etching stop layer.

Figure 15:
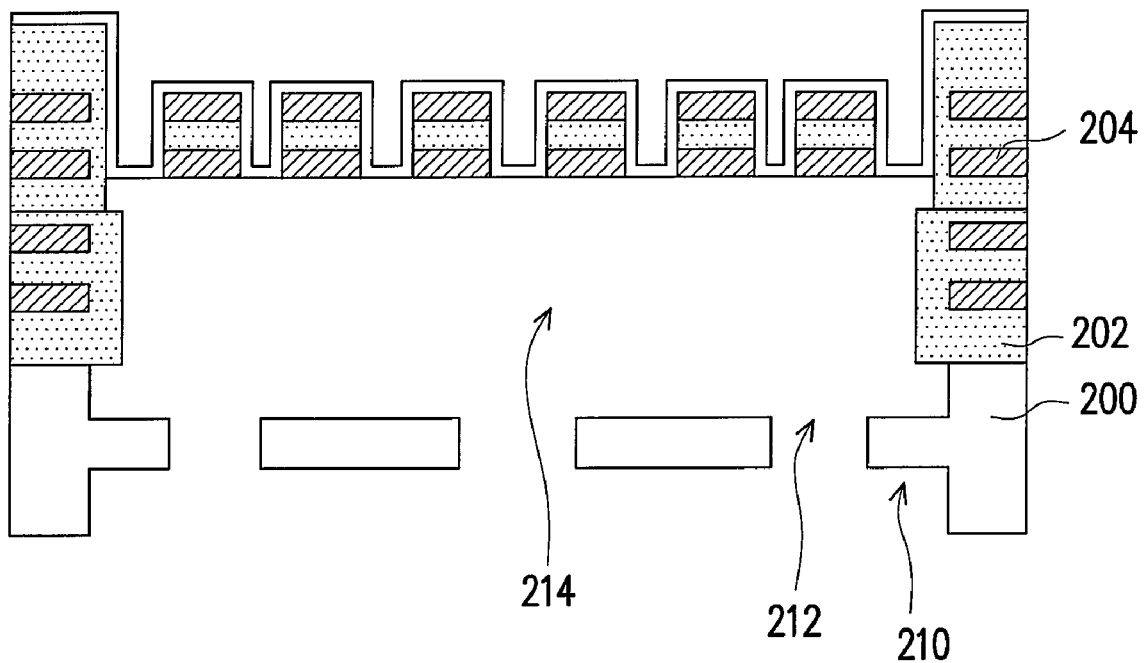

In FIG. 15, based on the different process flow, the substrate 200 can, for example, have other structure, in which the front-side of the substrate 200 may have also been also removes by a portion. As a result, the chamber 214 can be larger in depth.

Figure 16:
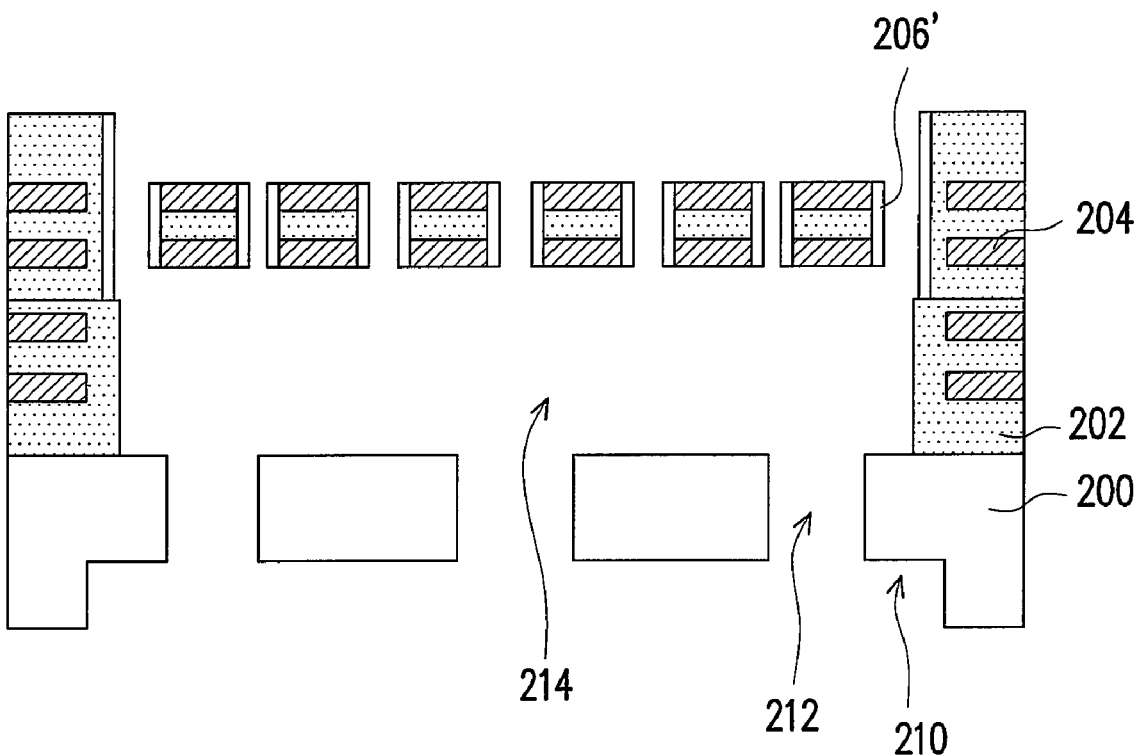
Figure 17:
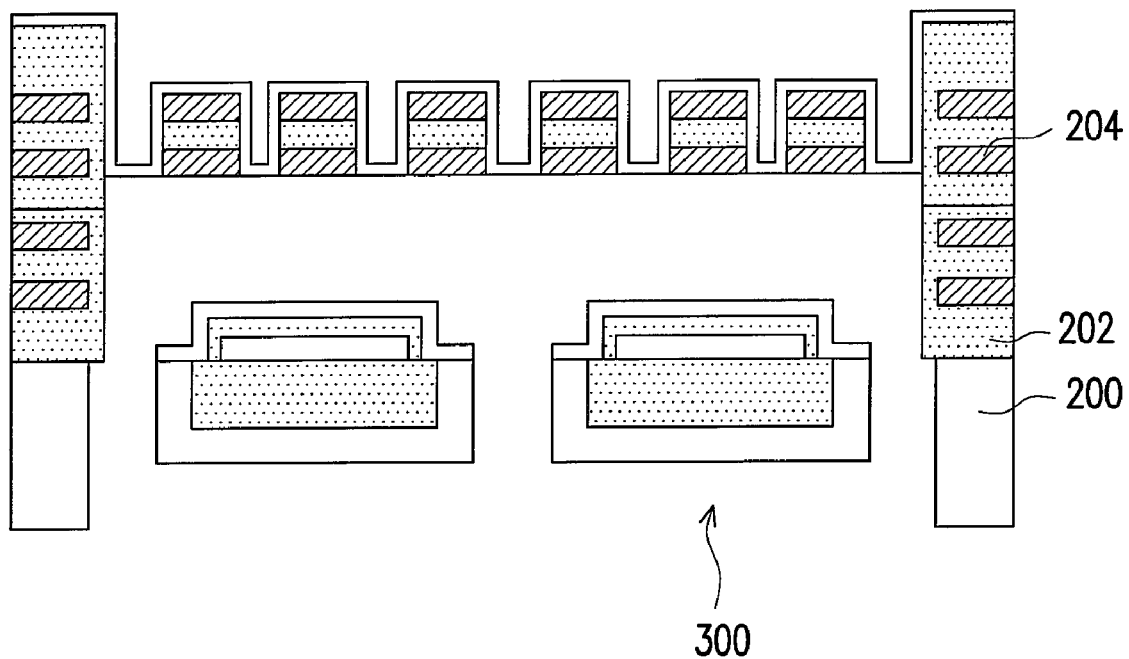

In FIG. 16, alternatively, the etching stop layer can be further etched back to remove the horizontal portion. As a result, the spacer 206' of etching stop remains at the sidewall of the stack 208. In this situation, the chamber 214 is connected to outside.

As sated at the beginning, all the provided embodiments can be properly combined to have the other combined structure. For example in FIG. 17, the substrate 200 may have been formed with a device structure 300. There is no conflict in fabrication process. Other combinations are not described one by one but are understandable by the one in ordinary skill.

Figure 18:
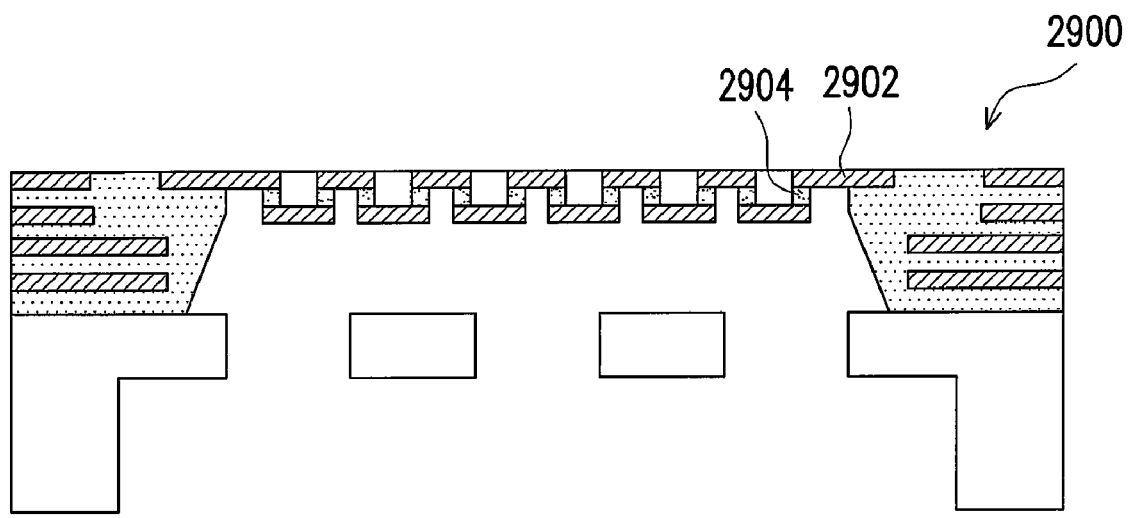

In FIG. 18, alternatively, the MEMS device 2900 can have the metal layer 2902 in two different levels and the metal via 2904 to form the diaphragm. In other words, the conductive etching stop is used instead. The indent region within the sidewall 2904 of the diaphragm may have the dielectric material or not, depending on whether or not including the etching process to remove it.

Figure 19:
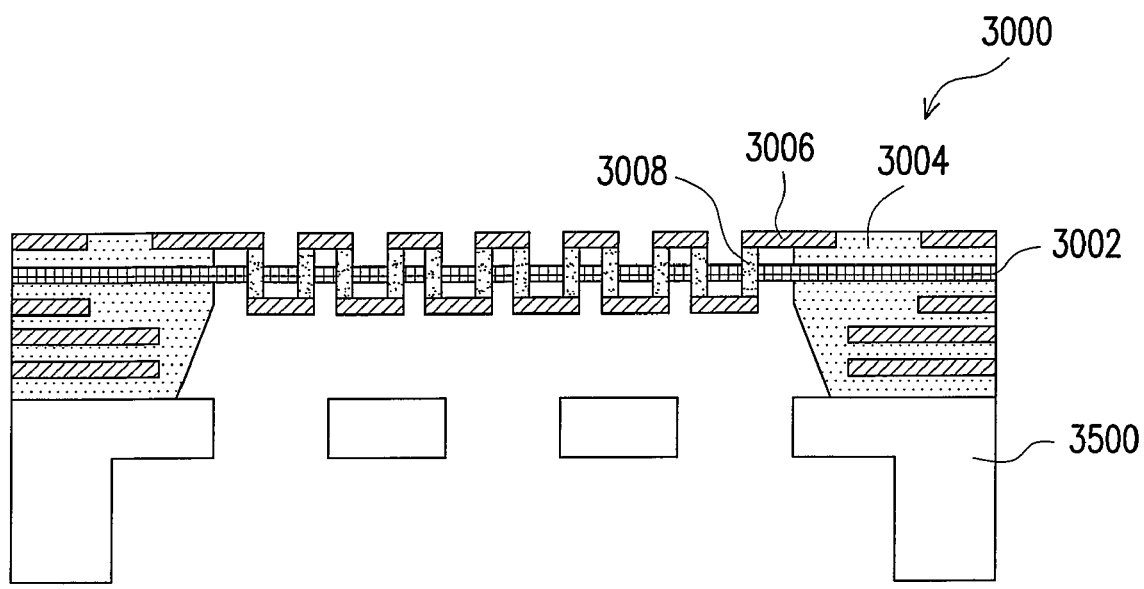

Further in FIG. 19, a MEMS structure 3000 includes a structural dielectric layer formed on the substrate 3500. The structural dielectric layer, as previously described for example, includes a dielectric layer with embedded metal. An etching stop layer 3002 is formed on the first structural dielectric layer. A second structural dielectric layer, including the dielectric layer 3004 and the conductive layer 3006, is formed on the etching stop layer 3002. However, indent structure is formed in the first structural dielectric layer, the second structural dielectric layer, and the etching stop layer 3002. The indent structure includes the metal layers in two different levels and the metal via 3008 at sidewall of the indent structure to connect the metal layers in two different levels. The substrate 3500 has vent hole, chamber, and cavity. The structure 3000 can be fabricated in the process of FIGS. 35AS-35E.

Figure 20:
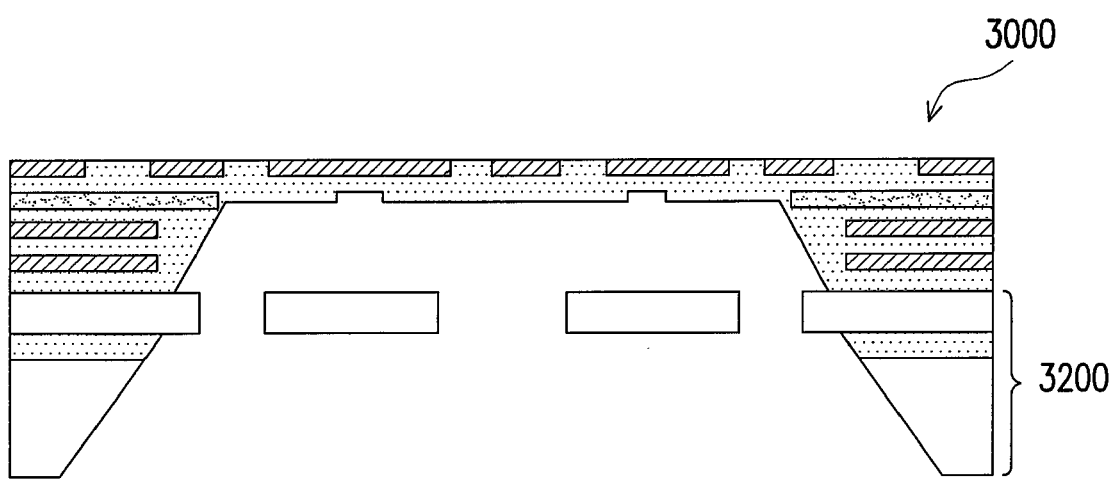

In FIG. 20, further, the substrate 3200 may, for example, have the silicon on isolation (SOI) layer on the silicon substrate. In this situation of the MEMS device 3000, the substrate includes the isolation layer. However, for the one with ordinary skill know the SOI structure, and then the fabrication process can be modified to accomplish the desired structure. Again, there is no confliction in fabrication with the standard process to form the MOS device, such as the CMOS device.

Since the SOI has the isolation on the substrate and a silicon layer on the isolation layer, the silicon layer may be patterned first, so as to have the vent hole structure, then the first structural dielectric layer can be formed over the SOI layer. Then, the chamber, the cavity and the vent hole can be formed.

Figure 21:
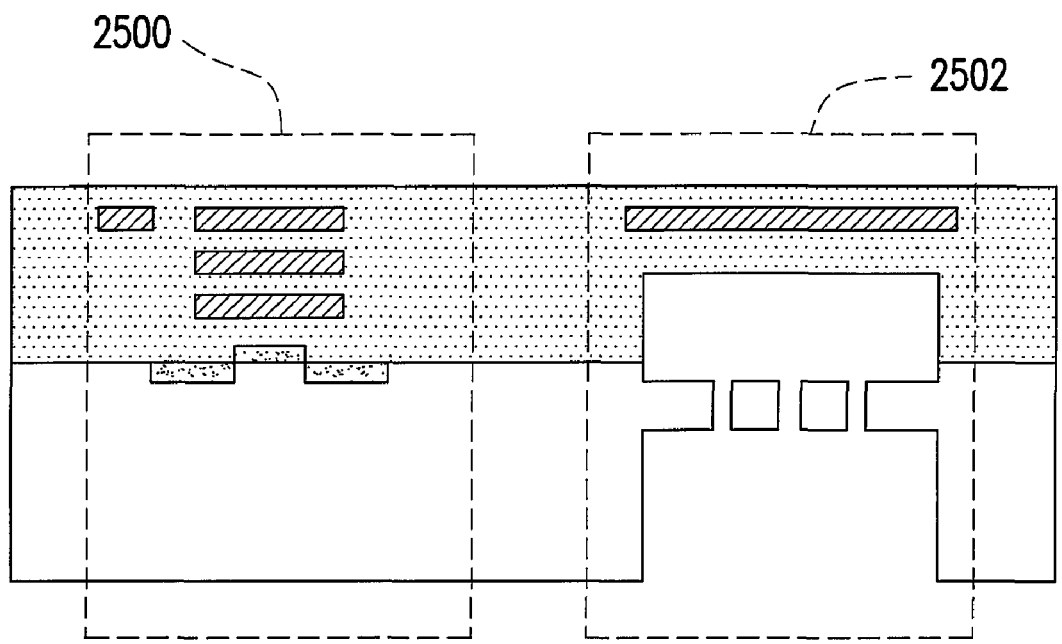
Figure 22:
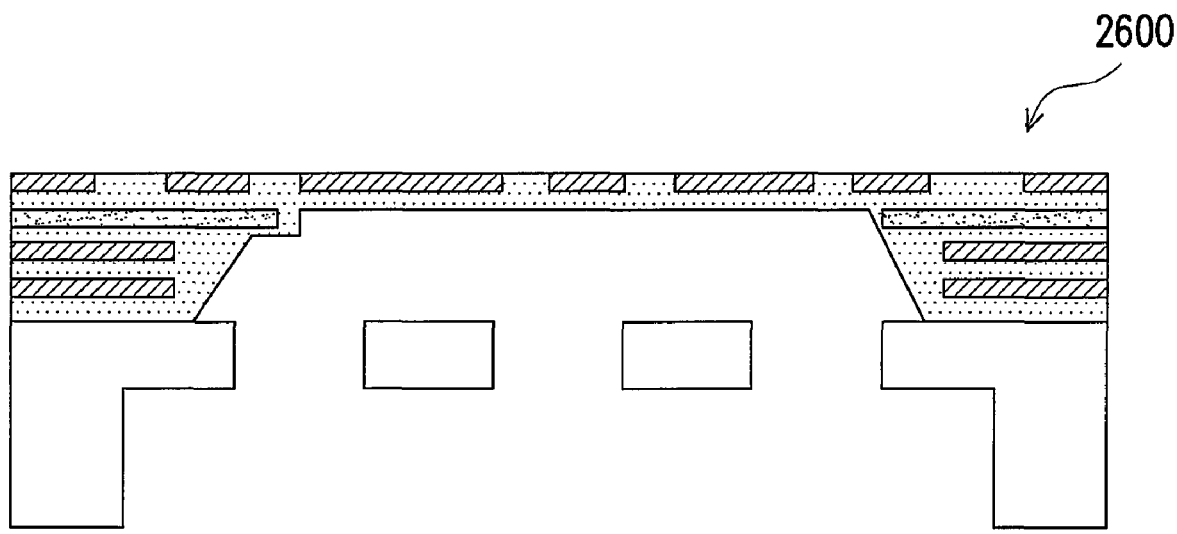

In FIG. 21, for the more general structure, the usual MOS device 2500 is formed at one region of the substrate while the MEMS device 2502 of the invention is formed at another region of the same substrate. As a result, the MEMS device can be fabricated by the semiconductor process without confliction. The present invention uses the etching stop layer to allow the substrate can be patterned for the MEMS device from the backside of the substrate. The MEMS device is integrated into the single chip. The conventional technology needs to form the MEMS device, separately, and then the two device pieces are assembled together by the packaging process.

The MEMS device has various applications. For example in FIG. 22, the MEMS device 2600 can have the application that the diaphragm serves to sense a pressure or a pressure fluctuation from the voice. As a result, a micro-phone can be formed.

Figure 23:
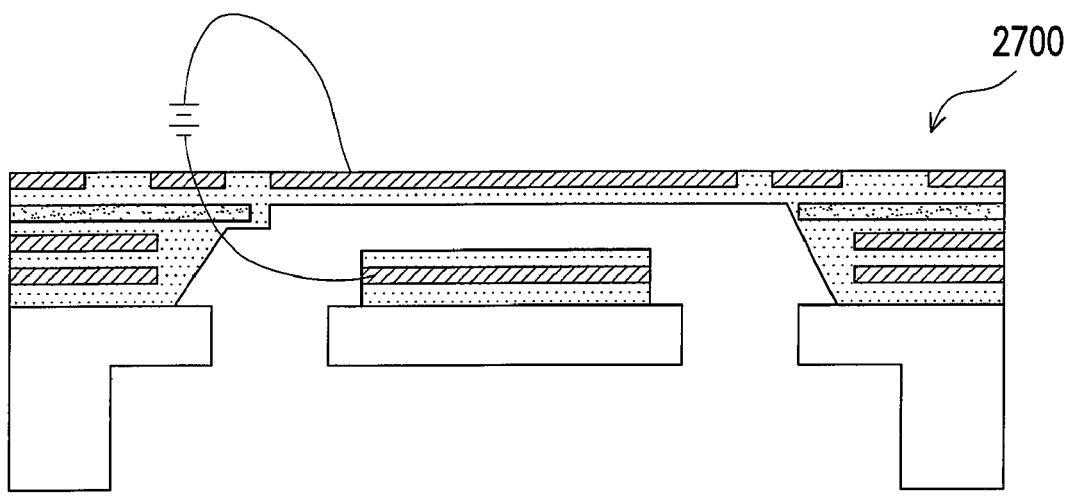

In FIG. 23, for another application, the MEMS device 2700 can serve as a variable capacitor, controlled by the voltage. The electrode structure is formed on the substrate while the conductive pattern, serving as another electrode, is embedded in the structural dielectric layer. Then, the voltage can be applied to the two electrodes. When the diaphragm is shifted, the capacitance is changed.

Figure 24:
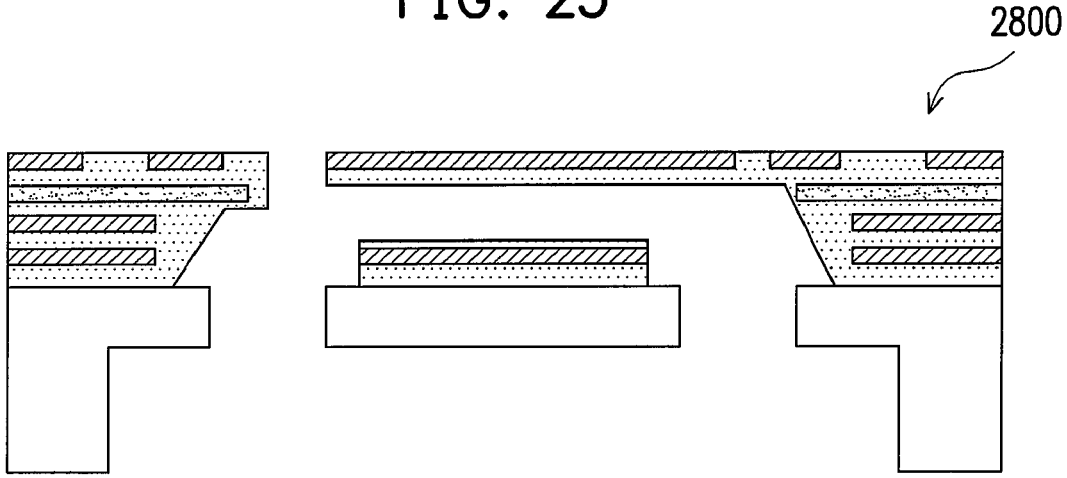

In FIG. 24, the MEMS device 2800 may have one hole at one end in the diaphragm. As a result, it can serve as a beam for switcher, accelerometer, or gyroscope.

Figure 25A:
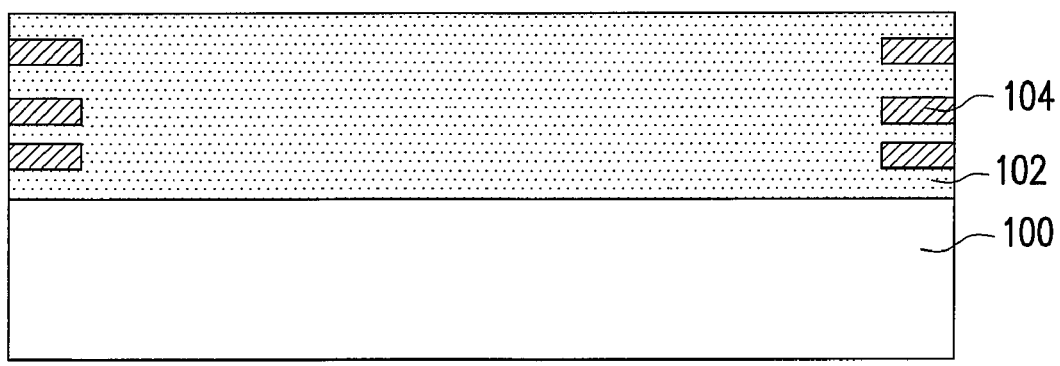
FIGS. 25A-25E are cross-sectional views, schematically illustrating a process flow for fabricating the semiconductor MEMS device in FIG. 1, according to an embodiment of the invention.
Figure 25B:
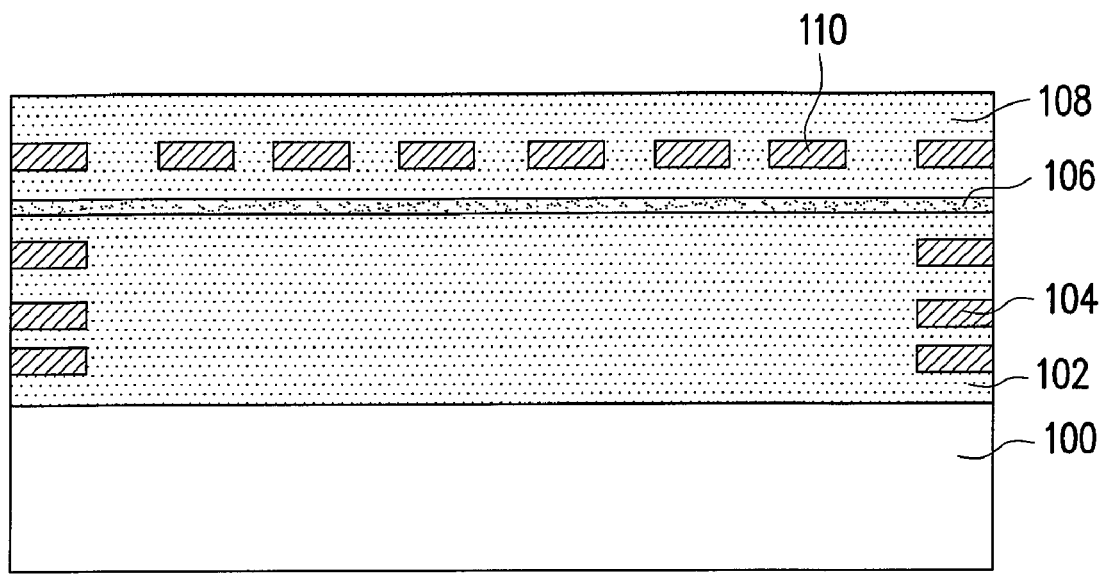

FIGS. 25A-25E are cross-sectional views, schematically illustrating a process flow for fabricating the semiconductor MEMS device in FIG. 1, according to an embodiment of the invention. In FIG. 25A, a structural dielectric layer 102 is formed over the substrate 100. The structural dielectric layer 102 may have some conductive pattern 104, such as metal layer pattern 104 or doped polysilicon, embedded therein. Basically, the structural dielectric layer 102 can be formed while the MOS device at the other region of the substrate 100 is formed. In FIG. 25B, an etching stop layer 106 is formed over the structural dielectric layer 102. Another structural dielectric layer 108, including the embedded conductive pattern 110 is formed over the etching stop layer 106. Usually, the vapor deposition process for material and the patterning process in semiconductor fabrication can be employed, in which the patterning process usually includes a photolithographic process and the etching process. The conductive pattern 110 is distributed above a region where the chamber of the MEMS to be formed.

Figure 25C:
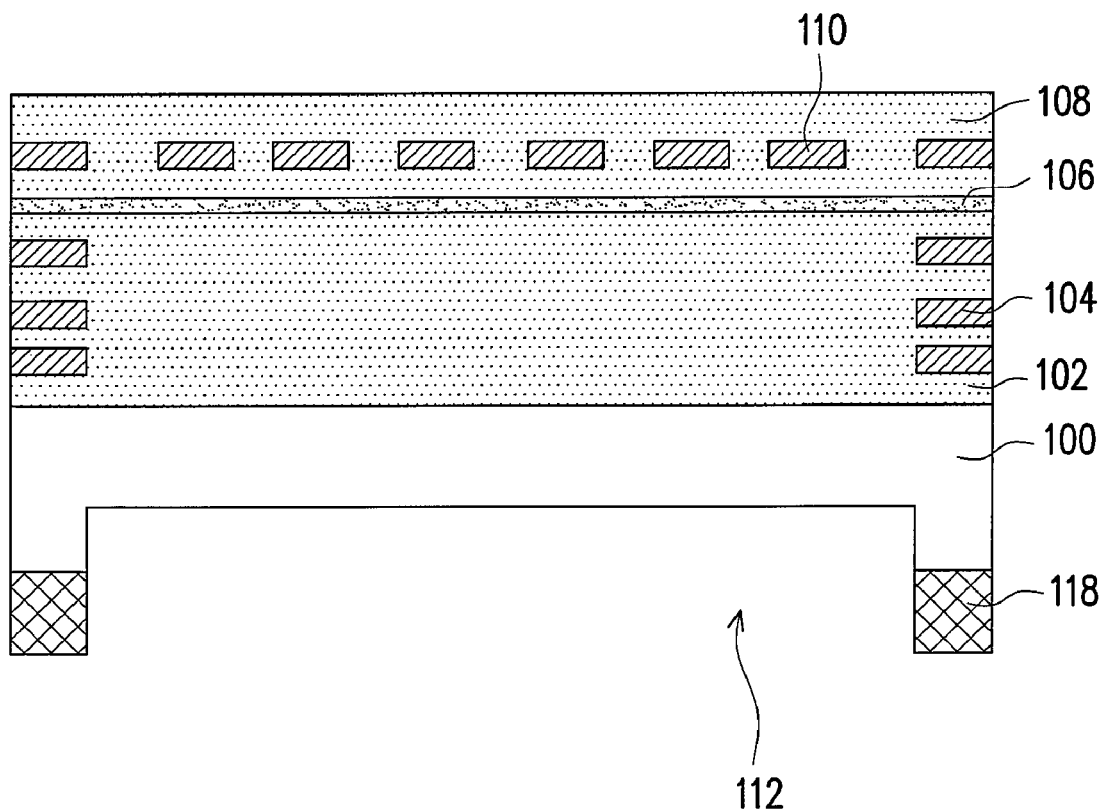
Figure 25D:
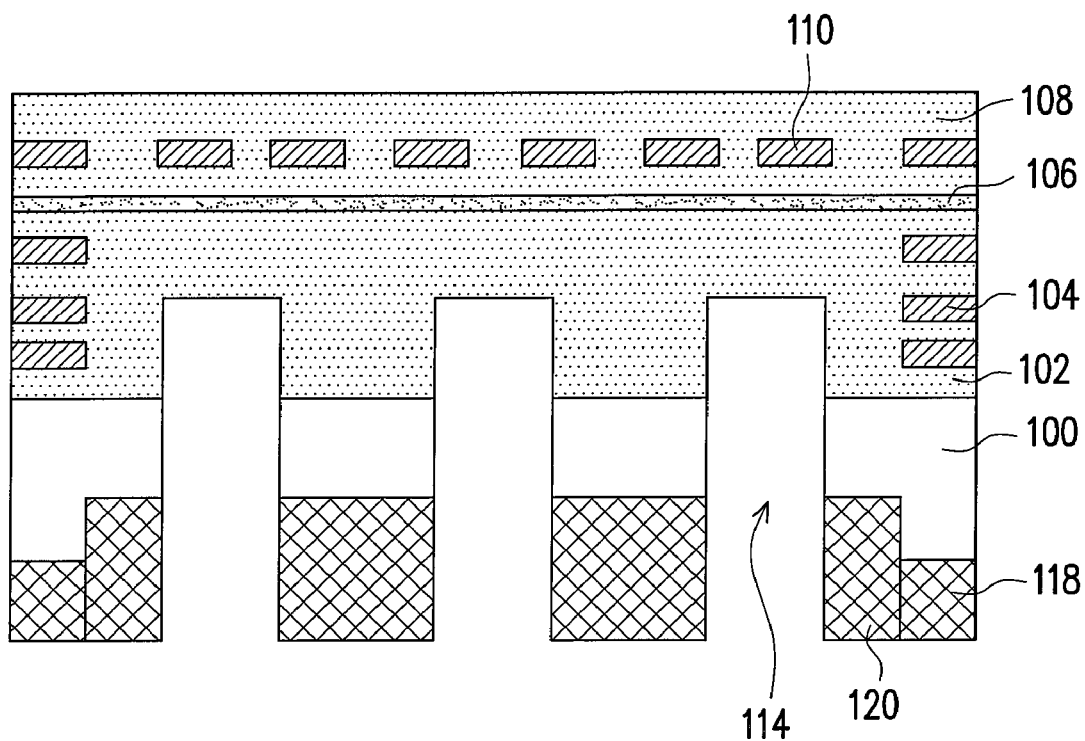
Figure 25E:
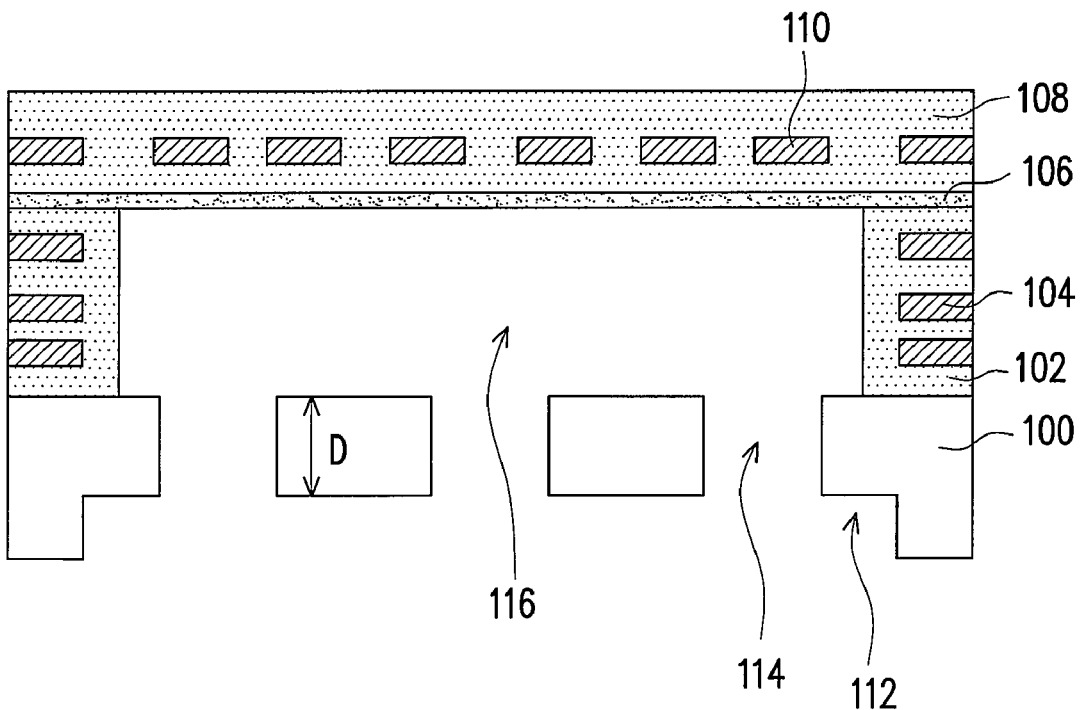

In FIG. 25C, the photoresist layer 118 is formed on the substrate 100 from the back side. The photoresist layer 118 is used as an etching mask for etching the substrate 100 from the back, so as to form a cavity 112, in which a desired thickness of the substrate 100 is also achieved. In FIG. 25D, another photoresist layer 120 is formed on the substrate 100 from the back side of the substrate 100 within the concave 112. Then, the etching back process is performed again by using the photoresist layer 118 and 120 as the etching mask. As a result, several perforating holes 114 in the substrate 100 are formed. Then, the dielectric layer 102 is continuously etched. In FIG. 26E, by using the etching stop layer 106, the dielectric layer 102 is etched to have an opening 116, which is also referred as a chamber. It should be noted that the etching stop provides the base for patterning the substrate and the dielectric layer 102 from the backside without affecting the structural dielectric layer 108.

Figure 26A:
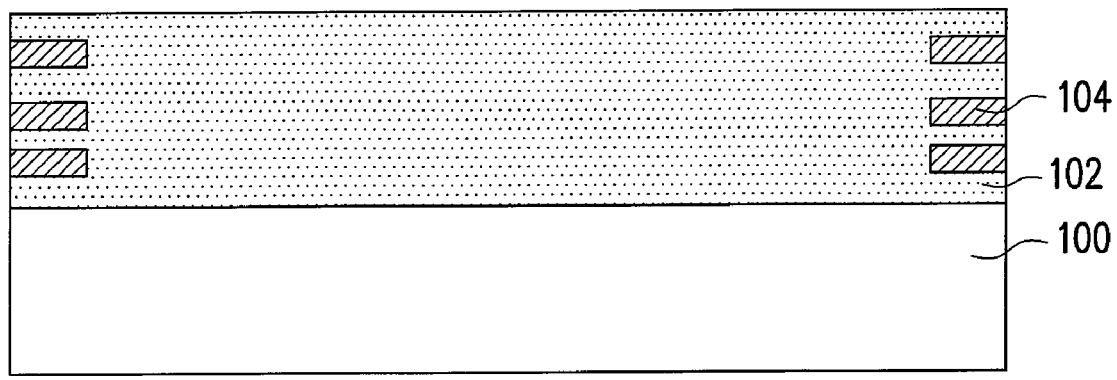
FIGS. 26A-26F are cross-sectional views, schematically illustrating a process flow for fabricating the semiconductor MEMS device in FIG. 5, according to an embodiment of the invention.
Figure 26B:
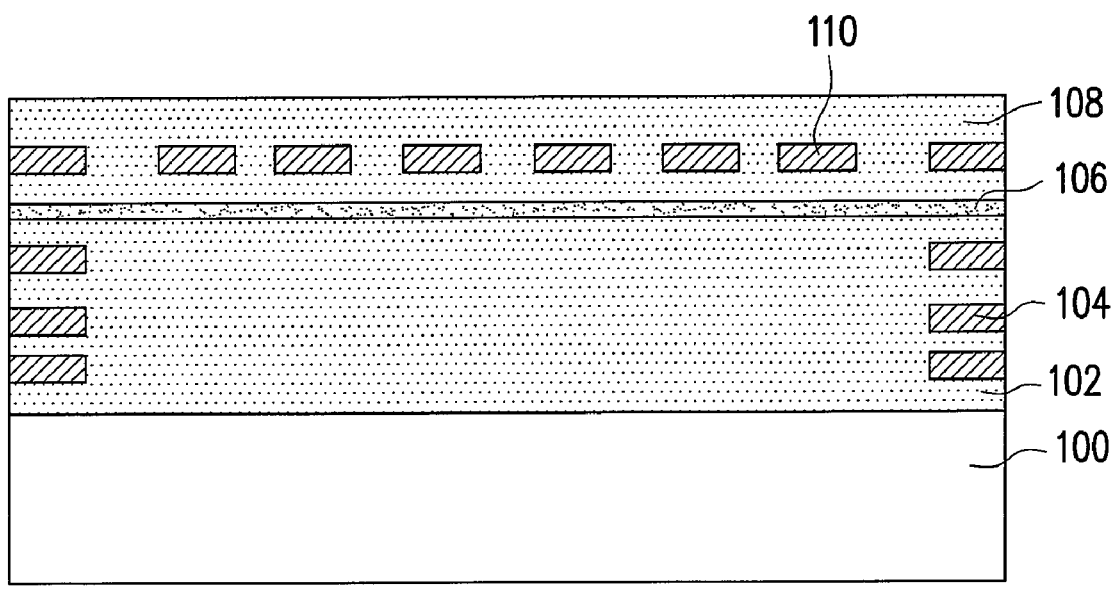
Figure 26C:
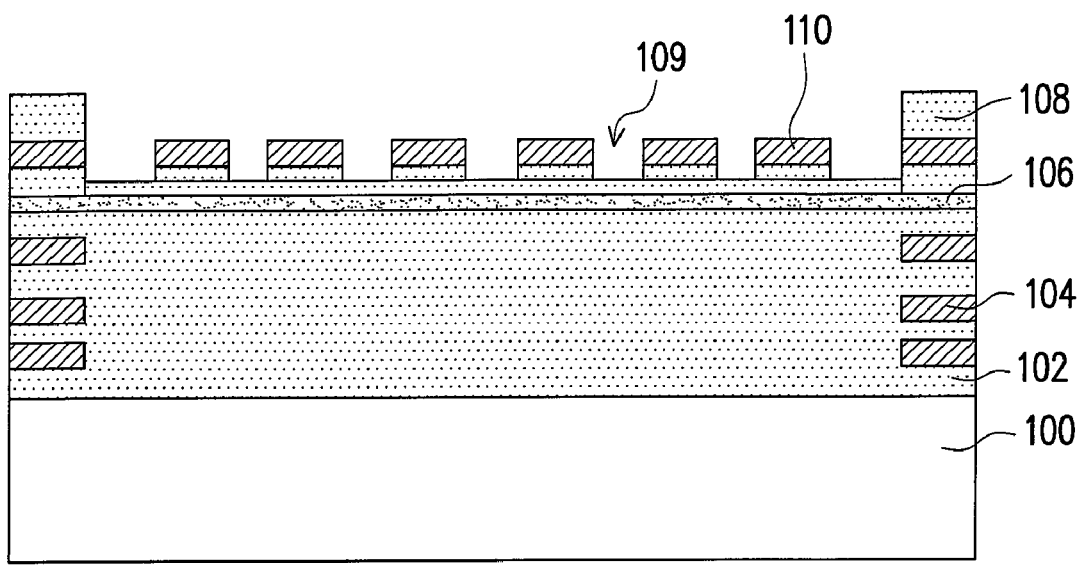
Figure 26D:
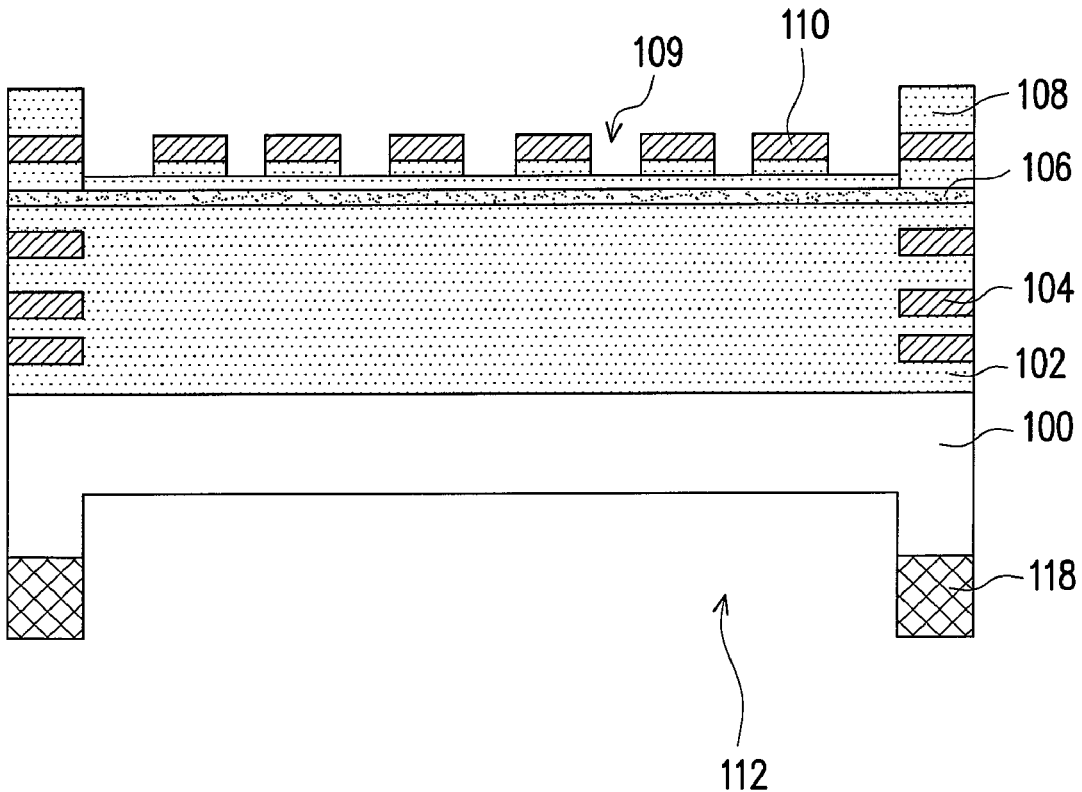
Figure 26E:
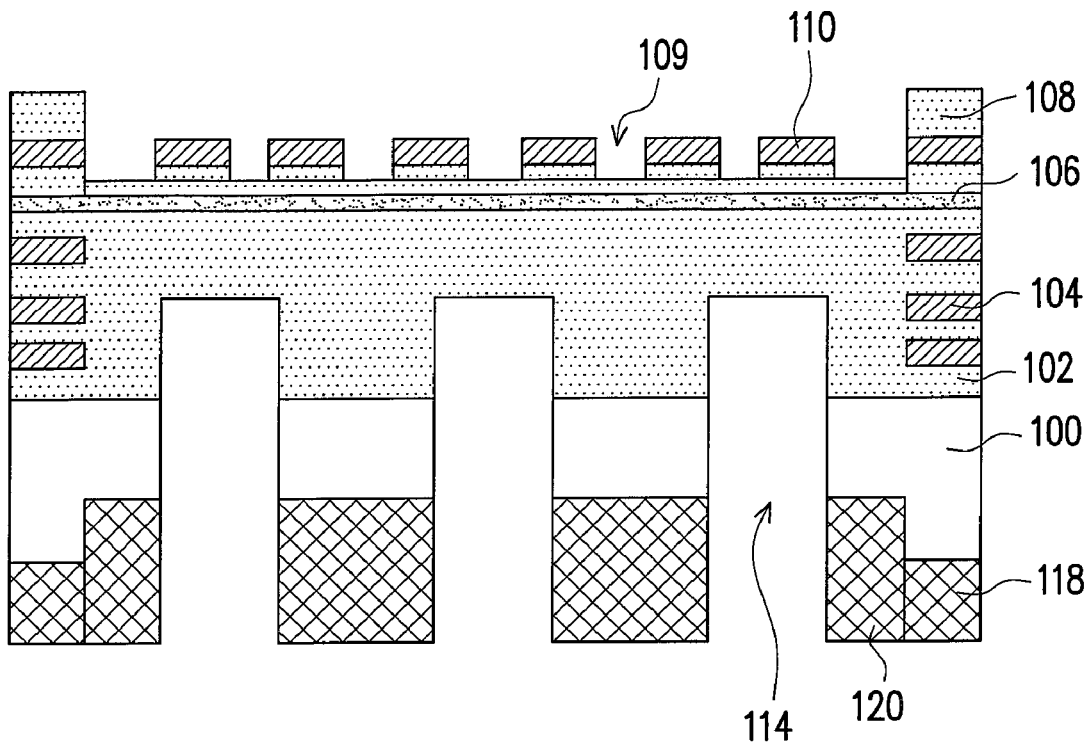

FIGS. 26A-26F are cross-sectional views, schematically illustrating a process flow for fabricating the semiconductor MEMS device in FIG. 5, according to an embodiment of the invention. In FIG. 26A, the structural dielectric layer 102 is formed over the substrate 100. The structural dielectric layer 102 may include the conductive pattern 104. In FIG. 26B, an etching stop layer 106 and a structural dielectric layer 108 are sequentially formed over the structural dielectric layer 102. The structural dielectric layer 108 may include the conductive pattern 110. In FIG. 26C, the structural dielectric layer 108 is patterned to remove a top portion of the dielectric layer 108 to expose the conductive pattern 110 but without exposing the etching stop layer 106.

Figure 26F:
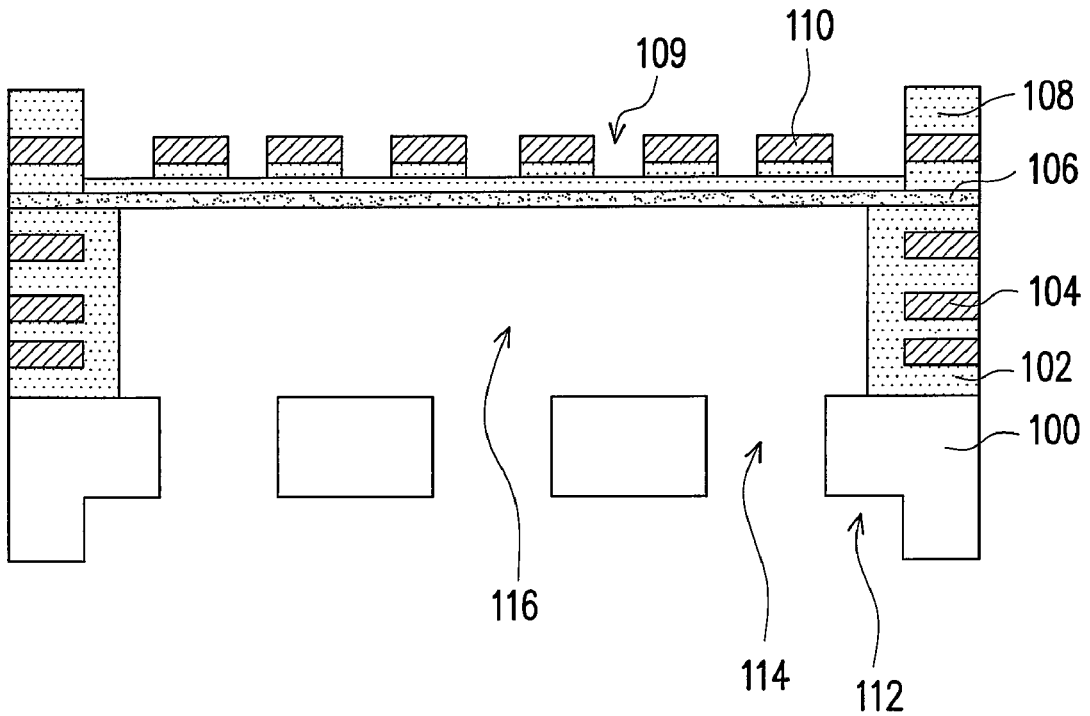

In FIG. 26D, a photoresist layer 118 is formed on the substrate 100 at the backside. By using the photoresist layer 118 as the etching mask, the substrate 100 is etched by a back portion. In FIG. 26E, another photoresist layer 120 are additionally formed with the photoresist layer 118. Another etching process is performed to etching the substrate 100 to form multiple perforating holes 114. Then, for example, another etching process is performed to remove a portion of the dielectric layer 102. In FIG. 26F, as a result, a portion of the structural dielectric layer 102 is etched to form an opening 116 to expose the etching stop layer 106. The opening 116 functions as a chamber in the structure of the MEMS device.

Figure 27A:
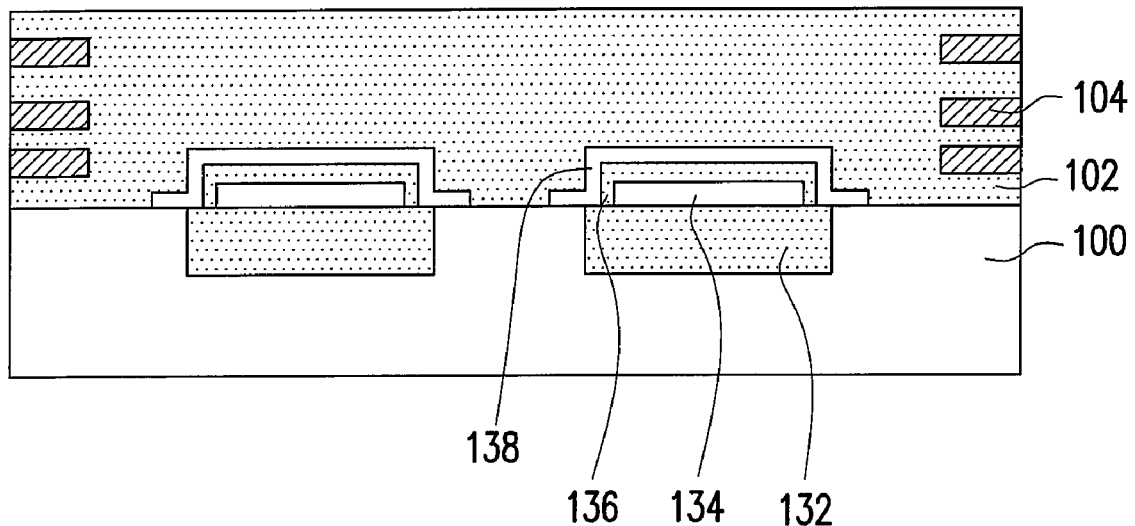
FIGS. 27A-27E are cross-sectional views, schematically illustrating a process flow for fabricating the semiconductor MEMS device in FIG. 6, according to an embodiment of the invention.

FIGS. 27A-27E are cross-sectional views, schematically illustrating a process flow for fabricating the semiconductor MEMS device in FIG. 6, according to an embodiment of the invention. In FIG. 27A, a substrate 100 has been formed a structure device. For example, a shallow trench isolation (STI) 132 is formed in the substrate 100. The STI process includes, form example, forming a trench in the substrate 100 and filling an isolation material into the trench, in which a planarization process may also be needed. Then, a conductive layer 134, such as polysilicon layer or metal layer are formed and patterned. The conductive layer 134 is then isolated from the substrate 100. Another isolation layer 136, such as silicon oxide, is formed over the conductive layer 134. Another dielectric layer 138 is formed over the isolation layer 136. The dielectric layer 138 may be silicon nitride, titanium nitride, or any material can perform like an etching mask or etching stop. Then, the structural dielectric layer 102 is formed over the substrate 100. The dielectric layer 138 separates the device from the dielectric layer 102, having its effect to be described later.

Figure 27B:
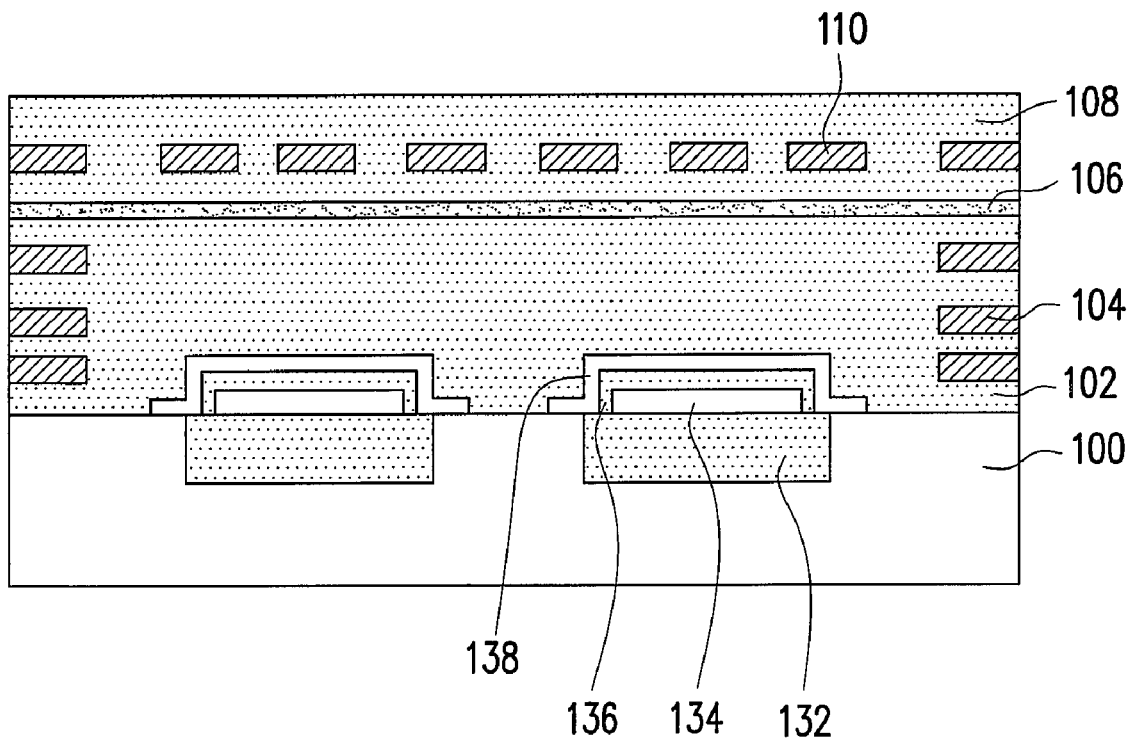

In FIG. 27B, an etching stop layer 106 is formed over the structural dielectric layer 102. The material of the etching stop layer 106 may be the same as the dielectric layer 138, so as to serving as an etching stop with respect to the dielectric layer 102, which usually is silicon oxide. Another structural dielectric layer 108 is formed over the etching stop layer 106. The structural dielectric layer 108 may, for example, include the conductive pattern 110.

Figure 27C:
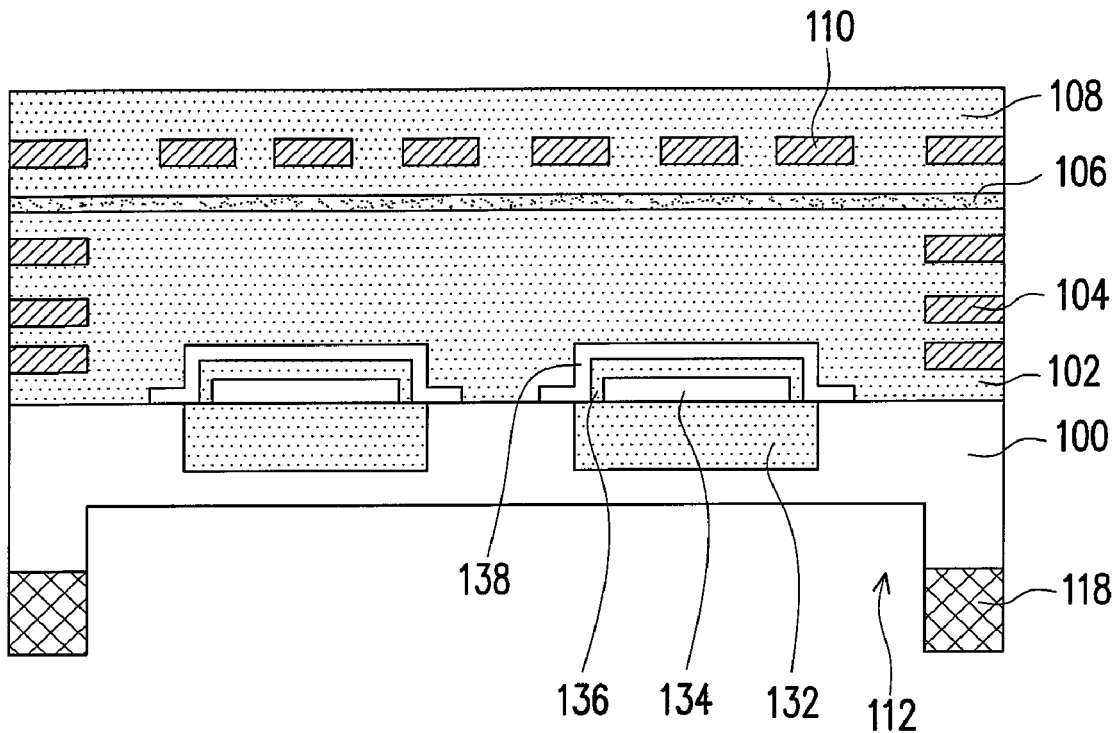
Figure 27D:
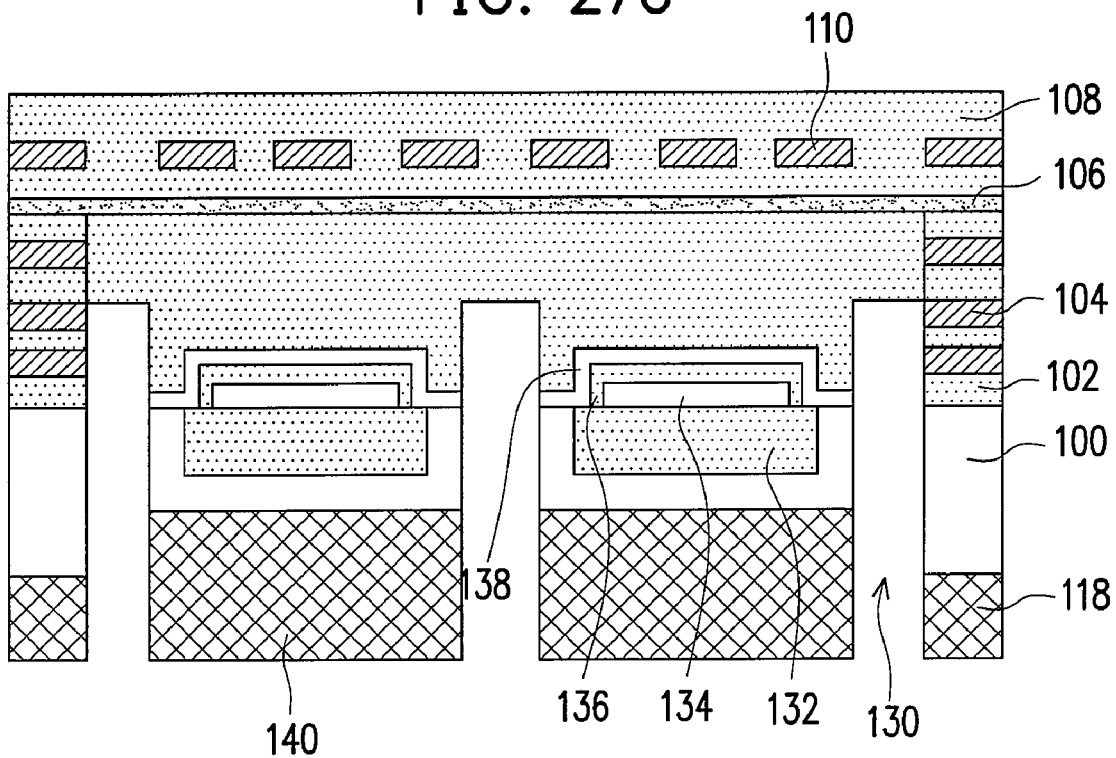
Figure 27E:
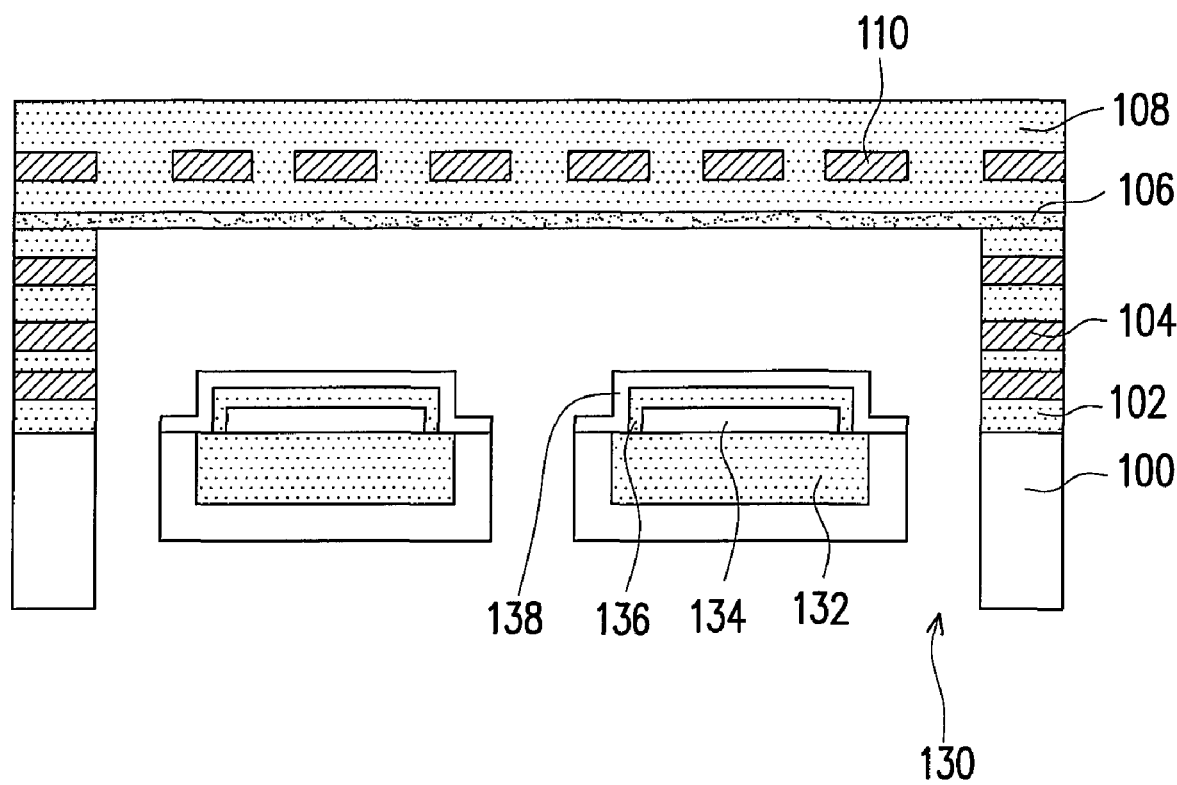

In FIG. 27C, like previous process, a photoresist layer 118 is formed on the substrate at the backside. The photoresist layer 118 is used as the etching mask, and an etching back process is performed from the backside of the substrate 100 to form the concave region 112 and to reduce the thickness of the substrate 100 within the desired region for MEMS. In FIG. 27D, another photoresist layer 140 is formed on the backside of the substrate within the concave region 112 but having the holes to expose the substrate 100. The holes of the photoresist layer 140 are corresponding to the position for forming the perforating holes 130. The photoresist layer 140 with the photoresist layer 118 are used as the etching mask, then the etching process is performed to etch the substrate 100 to form the perforating holes 130 and to further etch the dielectric layer 102, in which the etching condition may be the same or different. Since the structure on the substrate 100 is protected from the etching stop 138, and the structural dielectric layer 108 is protect by the etching stop layer 106, both the structural dielectric layer 108 and the structures on the substrate 100 are not affected. In FIG. 27E, as a result, a portion of the structural dielectric layer 102 is removed to form an opening, which serves as a chamber between the etching stop layer 106 and 138.

Figure 28A:
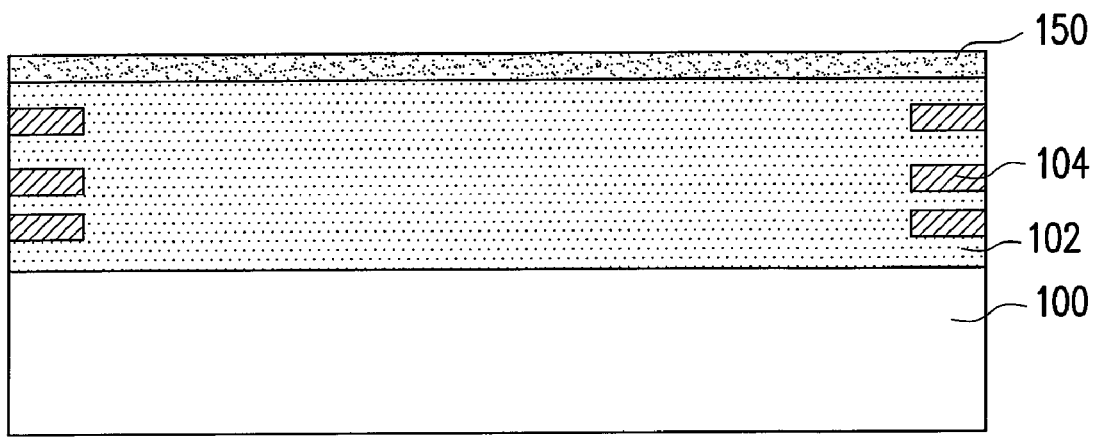
FIGS. 28A-28D are cross-sectional views, schematically illustrating a process flow for fabricating the semiconductor MEMS device in FIG. 9, according to an embodiment of the invention.
Figure 28B:
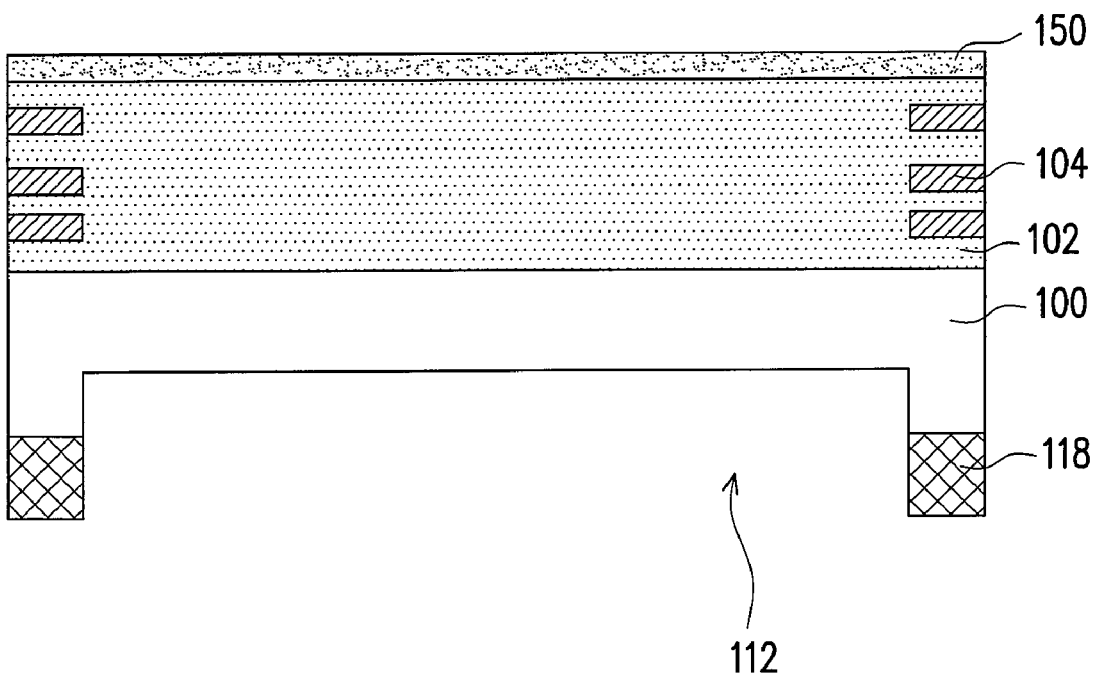

FIGS. 28A-28D are cross-sectional views, schematically illustrating a process flow for fabricating the semiconductor MEMS device in FIG. 9, according to an embodiment of the invention. To form the structure in FIG. 9, an example of process flow is provided. In FIG. 28A, as previously described, a structural dielectric layer 102 is formed over the substrate 100. The structural dielectric layer 102 may have, for example, the conductive pattern 104. An etching stop layer 150 with a sufficient thickness is formed over the structural dielectric layer 102. In FIG. 28B, the photoresist layer 118 with a mask pattern is formed on the backside of the substrate 100 to expose a portion of the substrate 100. Then, for example, an etching back process is performed to etching the exposed portion of the substrate 100. As a result, a desired thickness of the substrate 100 for the MEMS device is obtained.

Figure 28C:
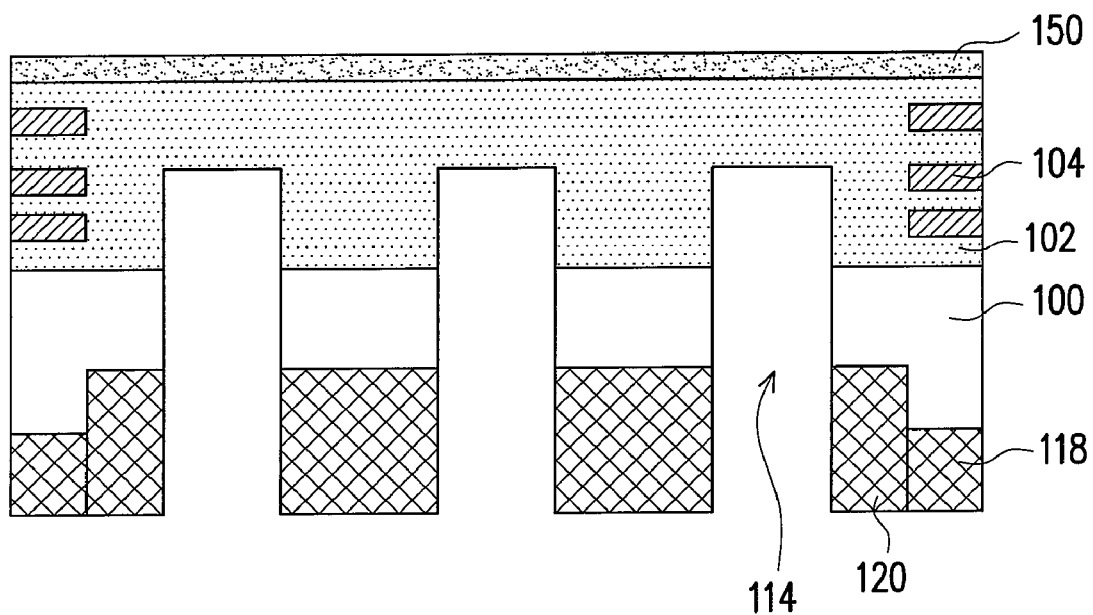
Figure 28D:
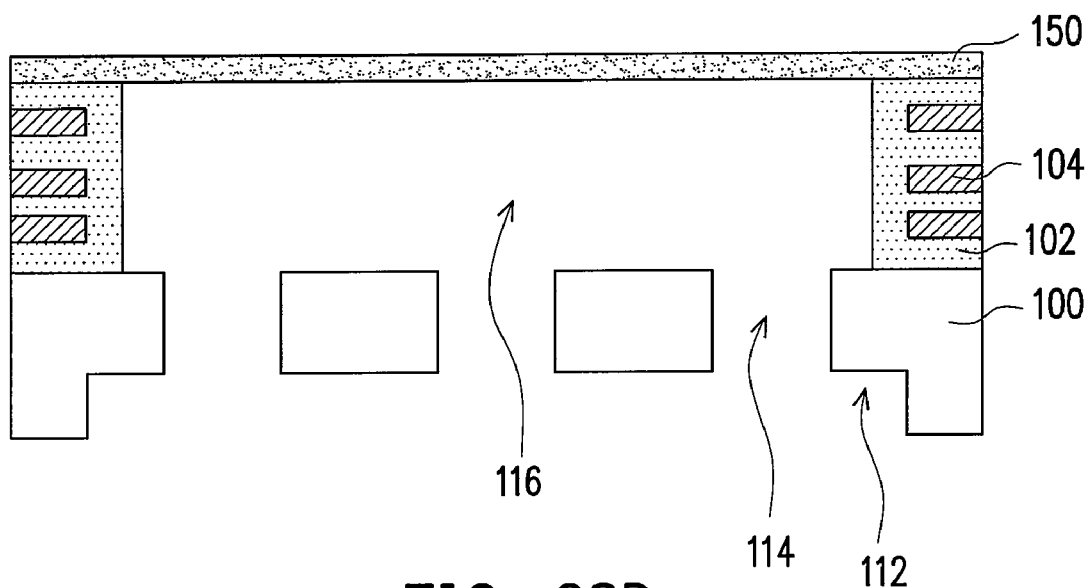

In FIG. 28C, another photoresist layer 120 with a pattern is further formed on the backside of the substrate 100. The photoresist layer 120 with the photoresist layer 118 together covers the backside of the substrate 100 but expose a portion, at which perforating holes 114 are to be formed in the substrate 100. Then, the substrate is etched by, for example, anisotropic etching process to etch the substrate 100 to form the perforating holes 114. Then in FIG. 28D, for example, an isotropic etching process may be performed to remove a portion of the structural dielectric layer 102, so as to form an opening 116, functioning as the chamber for the MEMS device.

Figure 29A:
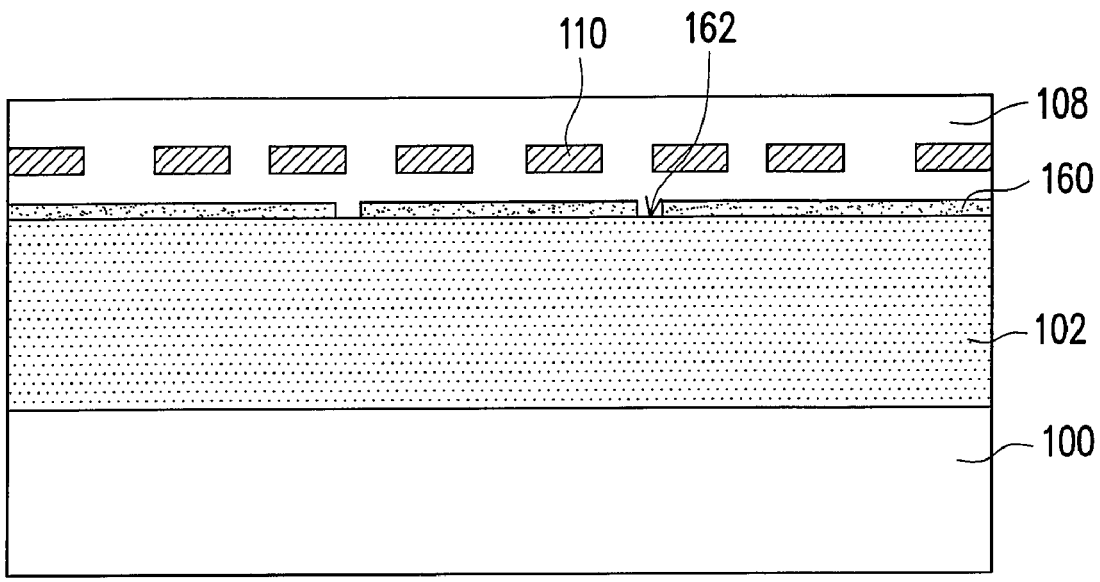
FIGS. 29A-29D are cross-sectional views, schematically illustrating a process flow for fabricating another semiconductor MEMS device, according to an embodiment of the invention.

Alternatively, the etching stop layer may be removed to have opening pattern. FIGS. 29A-29D are cross-sectional views, schematically illustrating a process flow for fabricating another semiconductor MEMS device, according to an embodiment of the invention. In FIG. 29A, a structural dielectric layer 102 is formed over the substrate 100. An etching stop layer 160 is subsequently formed over the structural dielectric layer 102. The structural dielectric layer 102 may have the conductive pattern at other region. The etching stop layer 160 is patterned to have the opening 162. Another structural dielectric layer 108 is formed over the etching stop layer 160. The structural dielectric layer 108 may have the conductive pattern 110.

Figure 29B:
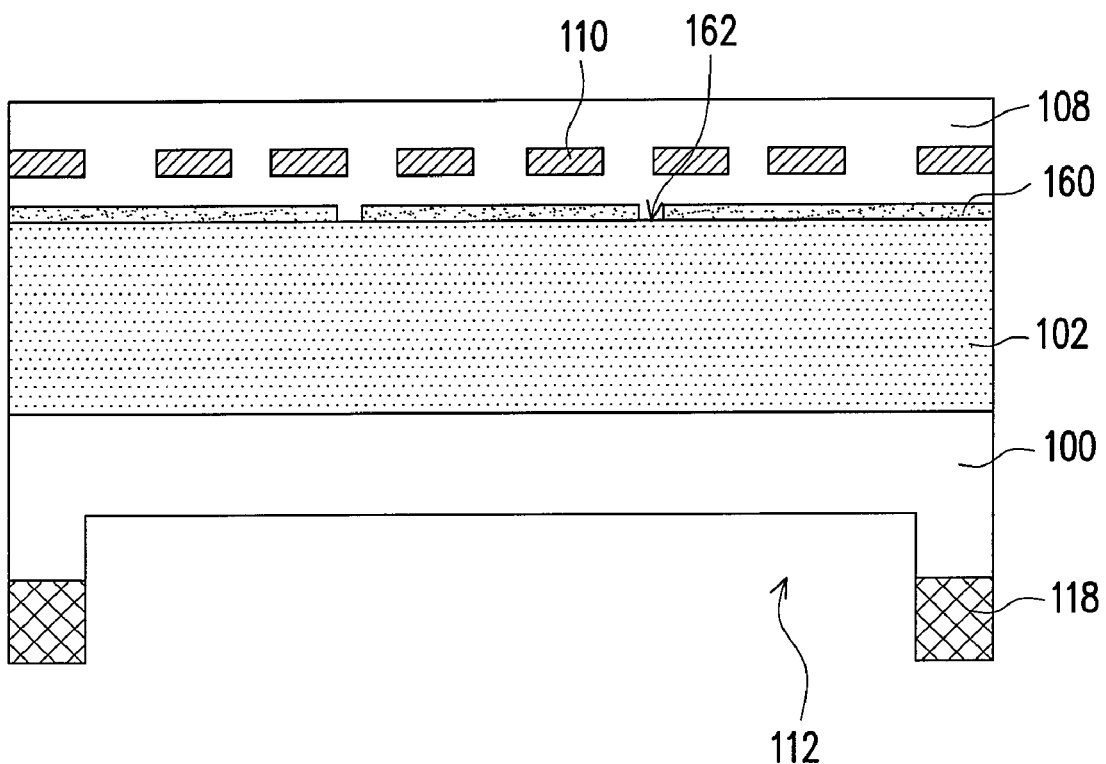
Figure 29C:
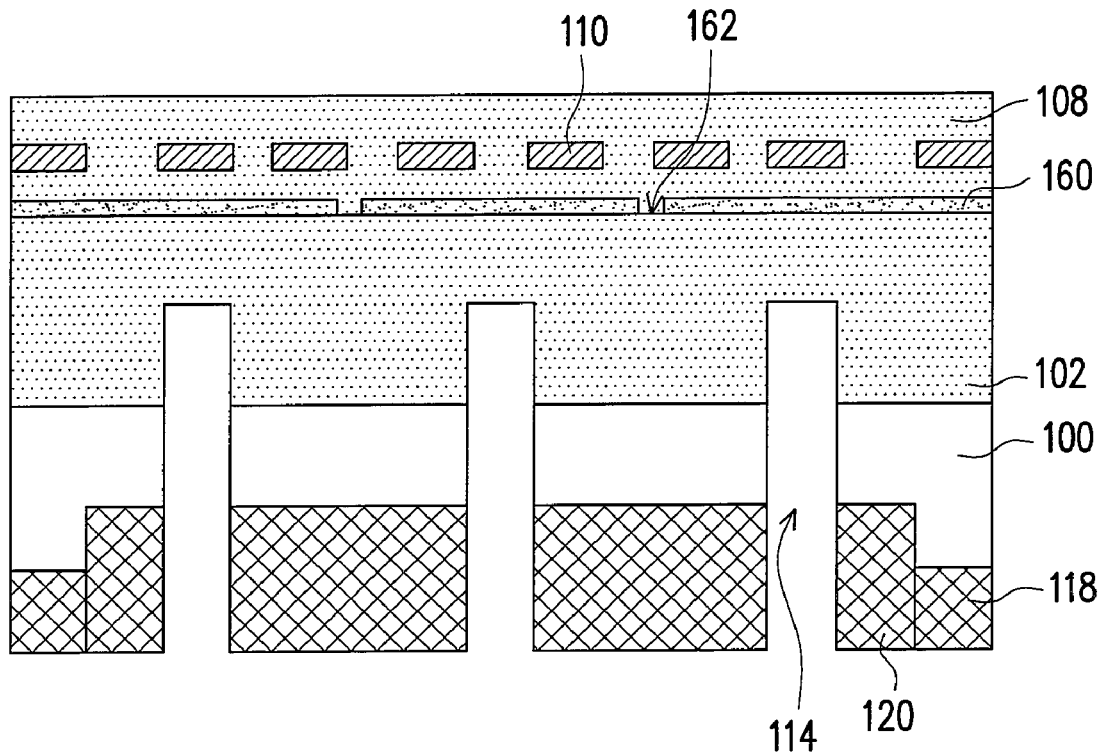

In FIG. 29B, the photoresist layer 118 with a pattern is formed on the backside of the substrate 100, and then the substrate 100 is etched to have the desired thickness at the cavity region 112. In FIG. 29C, another photoresist layer 120 is further formed on the backside of the substrate 100 within the concave region 112. The photoresist layer 118 with the photoresist layer 120 together have several holes which expose the substrate 100 at the positions to formed the perforating holes 114 in the substrate 100. Then, another etching process, such as the anisotropic etching process is performed to etch the substrate 100, so as to form the perforating holes 114 and the structural dielectric layer 102 is exposed.

Figure 29D:
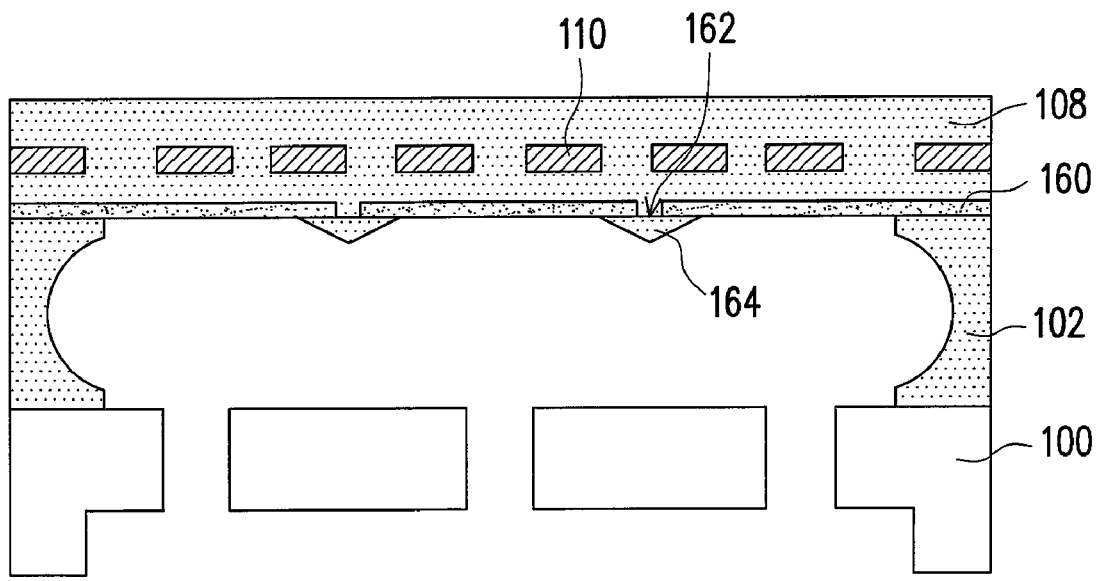

In FIG. 29D, then for example, further another isotropic etching process is performed to remove a portion of the structural dielectric layer 102. However, some residue 164 of the structural dielectric layer 102 may still remain and cover the openings 162 of the etching stop layer 160. This is another structure of MEMS device, for example.

Figure 30A:
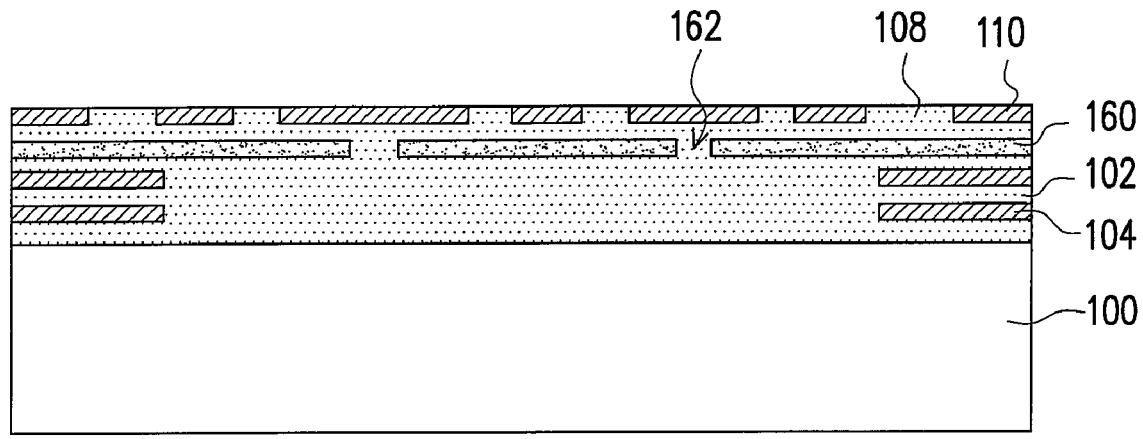
FIGS. 30A-30E are cross-sectional views, schematically illustrating a process flow for fabricating another semiconductor MEMS device, according to an embodiment of the invention.
Figure 30B:
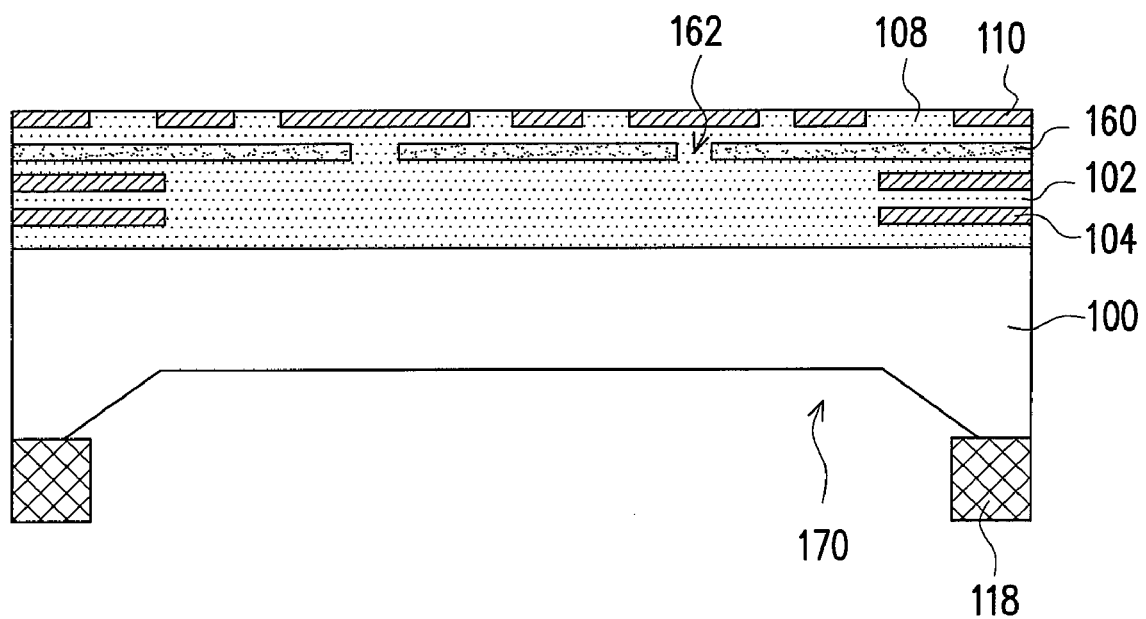

FIGS. 30A-30E are cross-sectional views, schematically illustrating a process flow for fabricating another semiconductor MEMS device, according to an embodiment of the invention. In FIG. 30A, a further another embodiment for another MEMS device is to be formed. The structural dielectric later 102 is formed over the substrate 100. The etching stop layer 160 is formed over the structural dielectric later 102. The etching stop layer may have, for example, the opening 162. Another structural dielectric layer 108 is formed over the etching stop layer 160. In FIG. 30B, the photoresist layer 118 is formed on the backside of the substrate 100. An etching process is performed to etching the backside of the substrate 100, so as to obtain the desired thickness in the concave region 170. Here, according to the different condition of the etching process, the cavity region 170 has the slant sidewall.

Figure 30C:
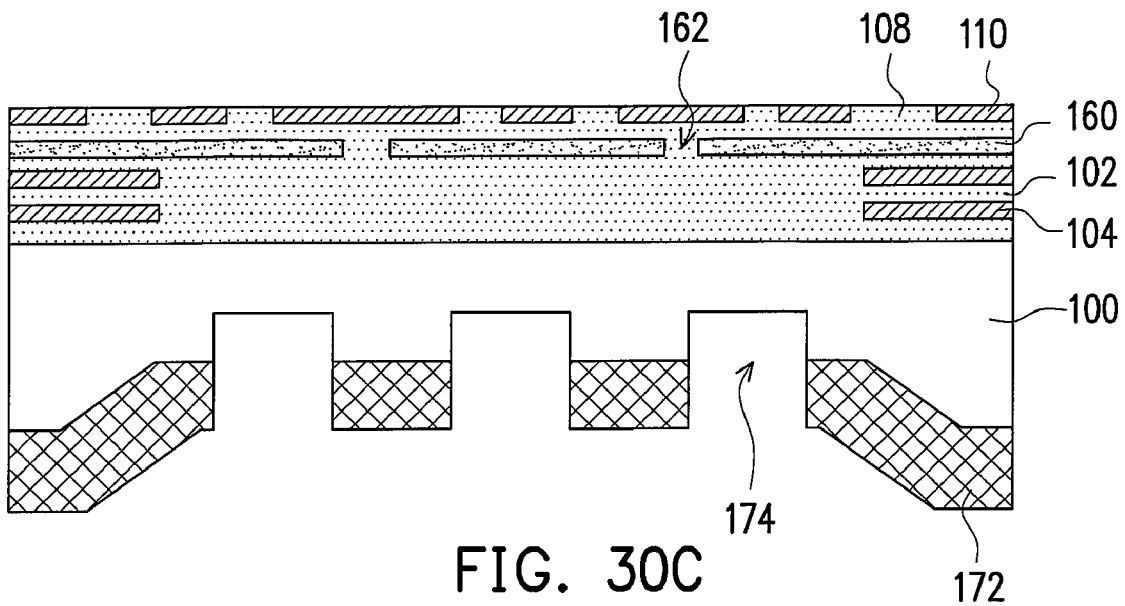
Figure 30D:
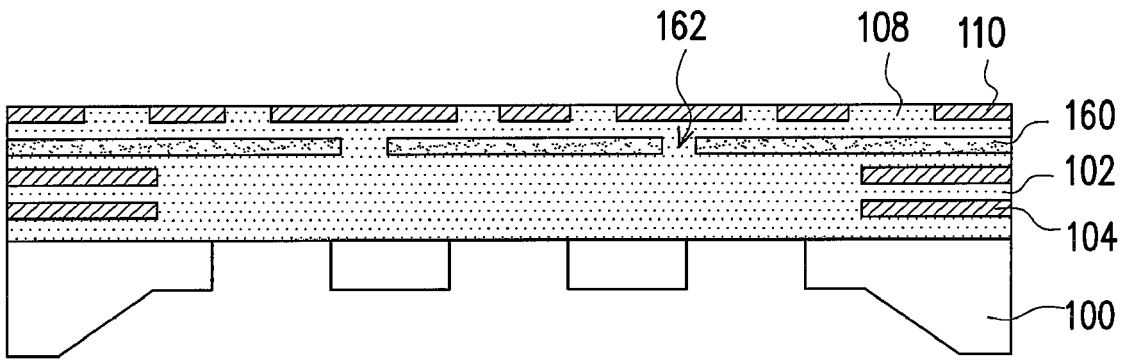

In FIG. 30C, another photoresist layer with the photoresist layer 118 is formed over the backside of the substrate 100 to form the photoresist layer 172, which has several holes to expose the substrate. The substrate is then further etched to have indent regions, which are corresponding to the positions of the perforating holes 174 to be formed. In FIG. 30D, then, the photoresist layer 172 is removed to expose the substrate 100. And then, the substrate without photoresist layer is etched back until the structural dielectric layer 102 is exposed, due the indent regions of the substrate. As a result, the substrate 100 has the perforating holes 174 to expose a portion of the structural dielectric layer 102.

Figure 30E:
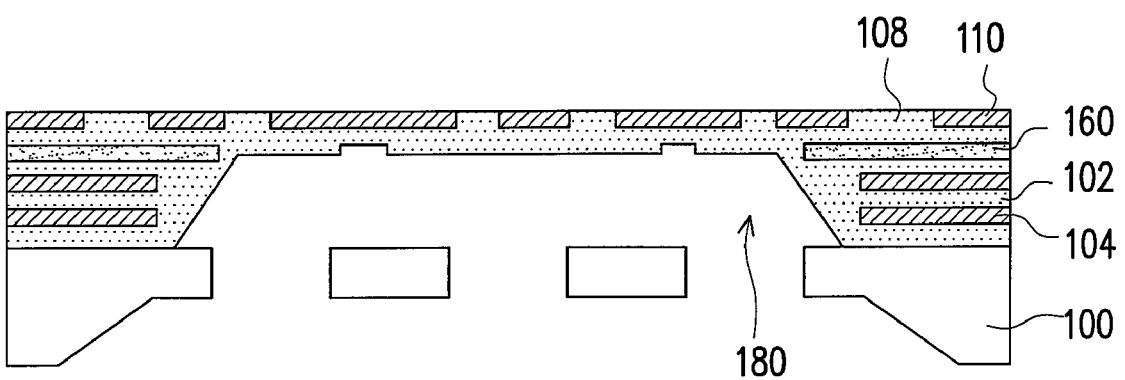

In FIG. 30E, another etching process is performed from the backside of the substrate, using the substrate 100 as the etching mask. As a result, a portion of the structural dielectric layer is removed to form a chamber 180, wherein a portion of the etching stop 160 is the removed also. Therefore, the diaphragm of the MEMS device is formed, including the second structural dielectric layer with the conductive pattern 110. As a result, the MEMS device has the structure, for example, shown in FIG. 11.

Figure 31A:
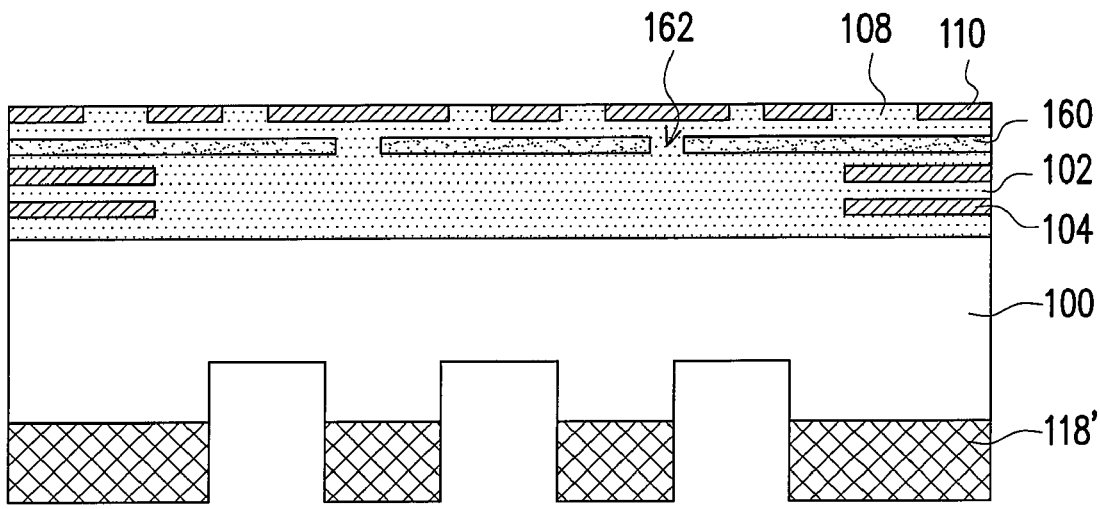
FIGS. 31A-31C are cross-sectional views, schematically illustrating a process flow for fabricating another semiconductor MEMS device, according to an embodiment of the invention.
Figure 31B:
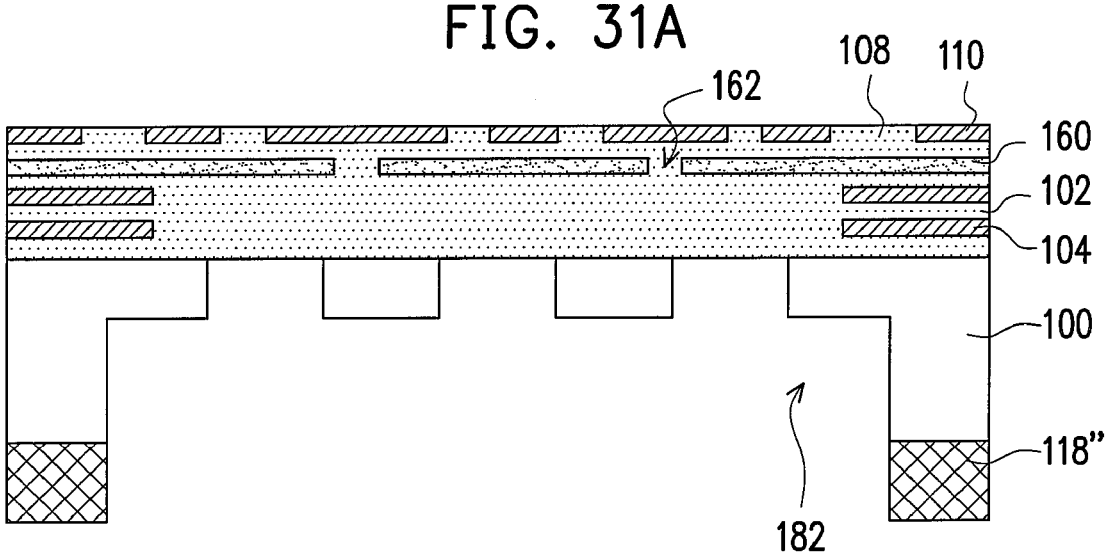
Figure 31C:
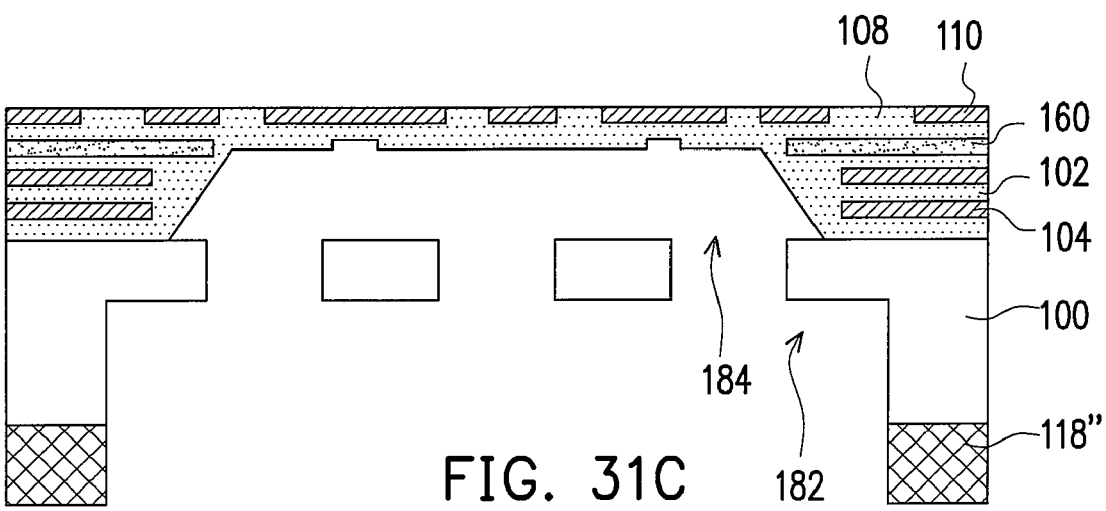

FIGS. 31A-31C are cross-sectional views, schematically illustrating a process flow for fabricating another semiconductor MEMS device, according to an embodiment of the invention. Alternatively, in FIG. 31A, a different process flow can be performed. After the structural dielectric layer 102, the etching stop layer 160 and the structural dielectric layer 108 are sequentially formed over the substrate 100, a photoresist layer 118' with opening pattern is formed at the backside of the substrate 100. Then, the substrate 100 is etching by an intended depth.

In FIG. 31B, a portion of the photoresist layer 118's is further removed to further expose the backside of the substrate 100, becoming the photoresist layer 118". Then the photoresist layer 118" is used as the etching mask, the substrate 100 is further etched from the backside until the structural dielectric layer 102 is exposed. The indent regions of the substrate 100 in FIG. 16A now become the perforating holes. The depth results in the thickness of the substrate 100. In FIG. 31C, another etching process is performed to remove a portion of the structural dielectric layer 102, so as to form the chamber 184. The structure in FIG. 31C is similar to the structure in FIG. 30E.

Figure 32A:
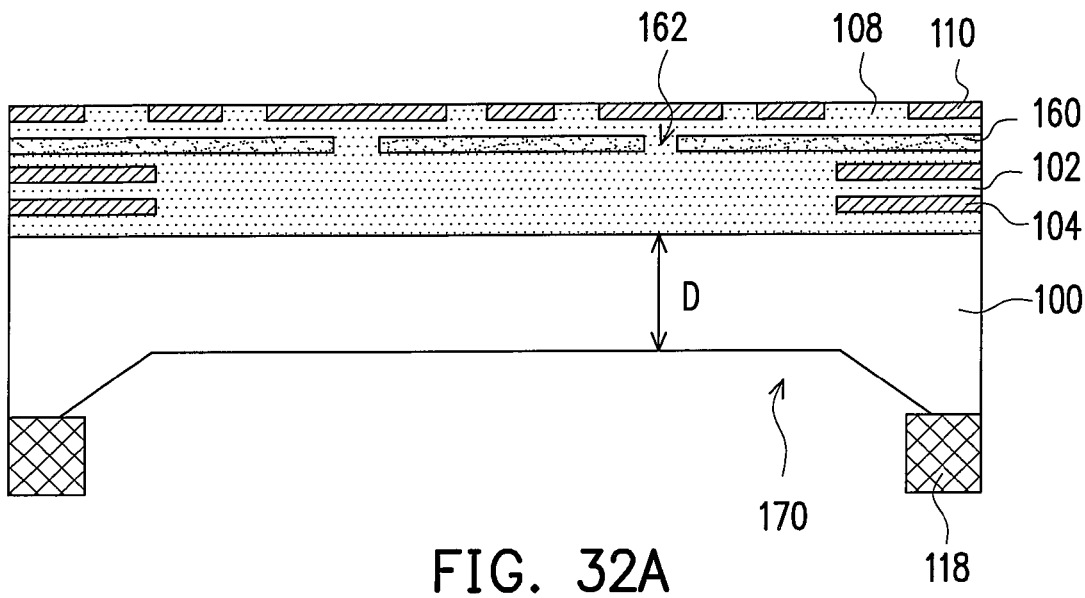
FIGS. 32A-32C are cross-sectional views, schematically illustrating a process flow for fabricating another semiconductor MEMS device, according to an embodiment of the invention.
Figure 32B:
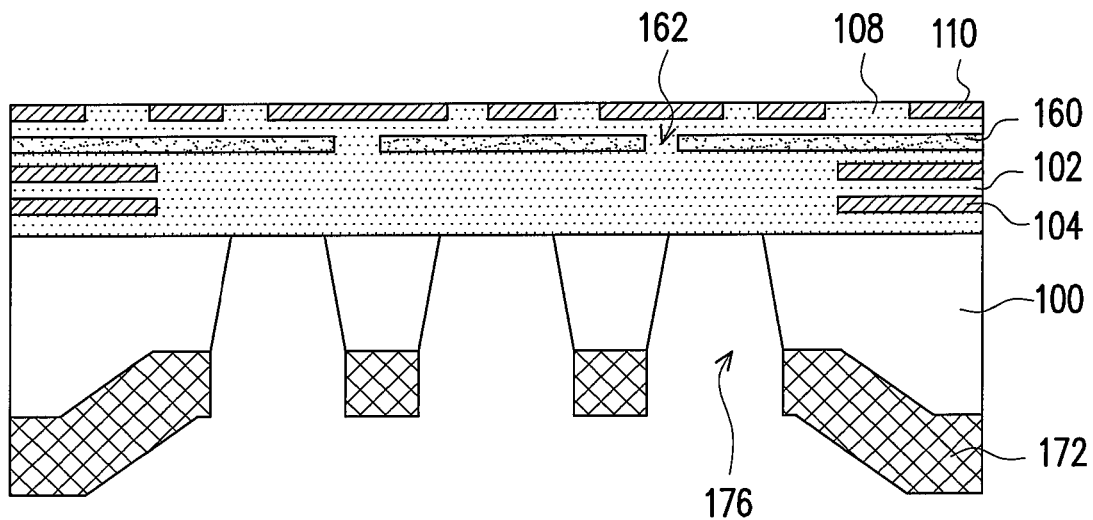
Figure 32C:
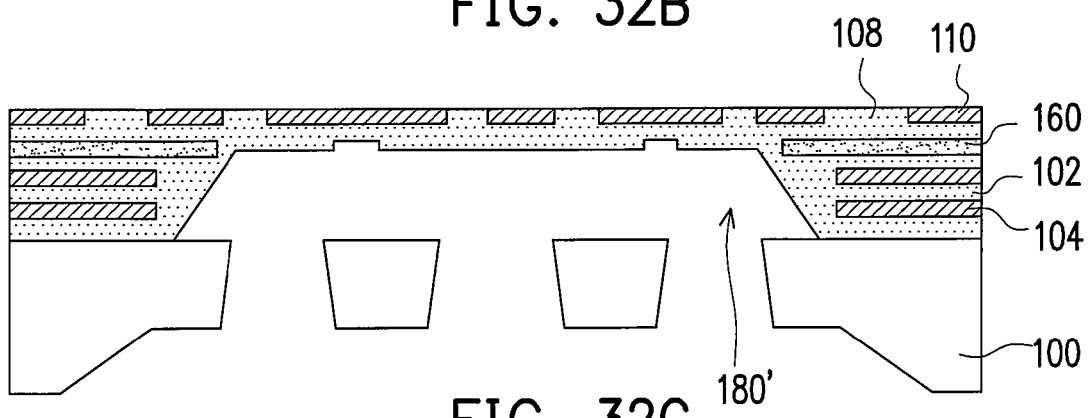

Further, another fabrication flow can also form the similar MEMS structure. FIGS. 32A-32C are cross-sectional views, schematically illustrating a process flow for fabricating another semiconductor MEMS device, according to an embodiment of the invention. In FIG. 32A, like the process in FIGS. 32A and 32B, the substrate 100 has the thickness D within the concave region 170, as a cavity. In FIG. 32B, the photoresist layer 172 is formed on the backside of the substrate 100. An etching process is performed to etch a portion of the substrate 100 until the structural dielectric layer 102 is exposed by the openings 176. In FIG. 32C, a portion of the structural dielectric layer 102 is removed to have the chamber 180'. The photoresist layer 172 is then removed. As a result, the MEMS structure of FIG. 32C is accomplished.

Figure 33A:
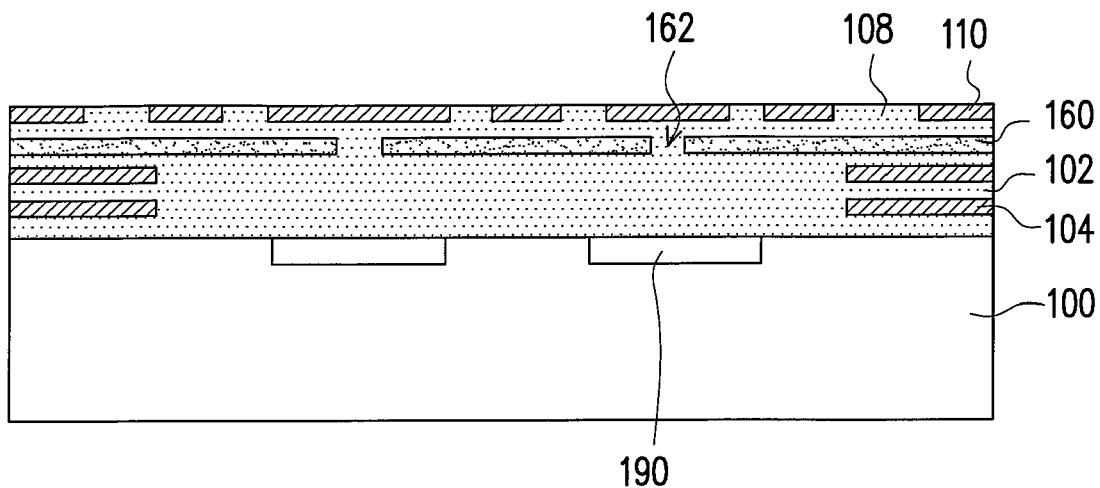
FIGS. 33A-33C are cross-sectional views, schematically illustrating a process flow for fabricating another semiconductor MEMS device, according to an embodiment of the invention.
Figure 33B:
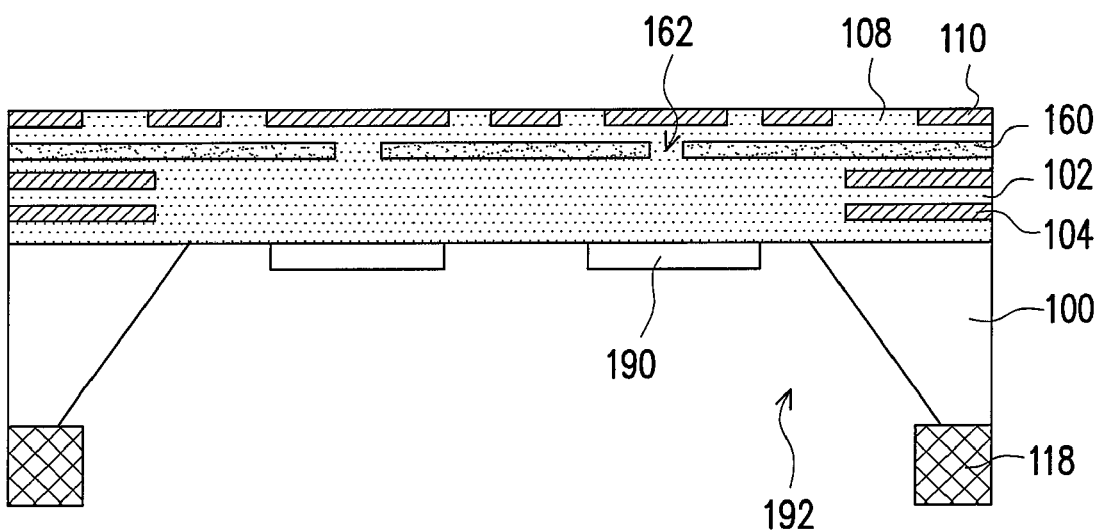
Figure 33C:
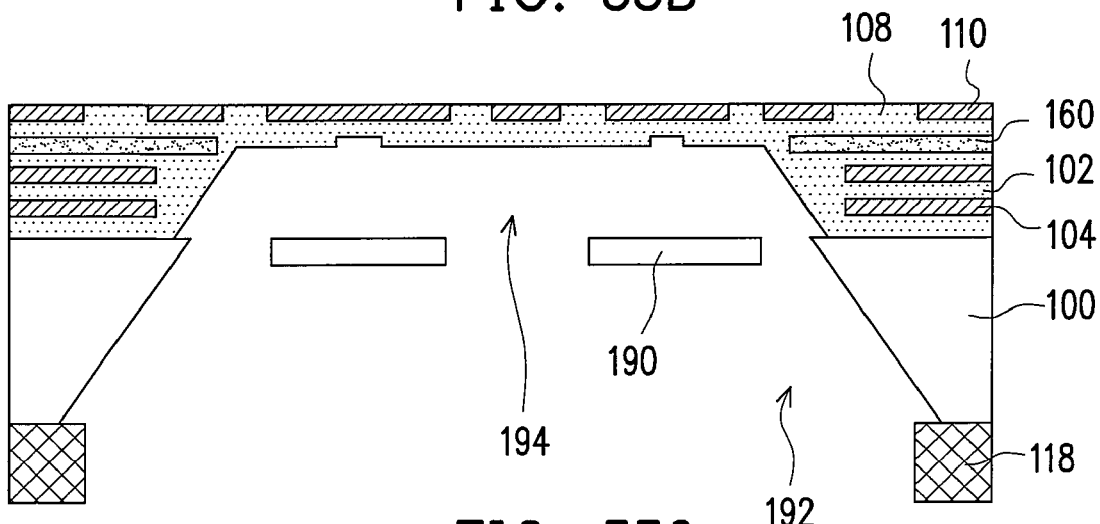

FIGS. 33A-33C are cross-sectional views, schematically illustrating a process flow for fabricating another semiconductor MEMS device, according to an embodiment of the invention. In FIG. 33A, to further consider the structure of the MEMS device, another fabrication process flow is alternatively described. In FIG. 33A, the substrate 100 may have been formed with a doped area 190 in the substrate 100, in which the dopant type, the dopant density, and the doped depth are the design choice. Then the structural dielectric layer 102 is formed over the substrate 100. The etching stop layer 160 is formed over the structural dielectric layer 102. Another structural dielectric layer 108 is formed over the etching stop layer 160. For example, as previously described, the etching stop layer may have opening 162. The structural dielectric layer 102 may have the conductive pattern 104. The structural dielectric layer 108 may have the conductive layer 110.

In FIG. 33B, the photoresist layer 118 is formed on the backside of the substrate 100. Then, the substrate 100 is etched to have the opening 192. Here, since the doped area 190 has different material property, the etching process selectively etches the substrate but not the doped regions 190, which remain. In FIG. 33C, the another etching process is performed to remove a portion of the structural dielectric layer 102 to have the chamber 194. As a result, the MEMS device can also be accomplished.

Figure 34A:
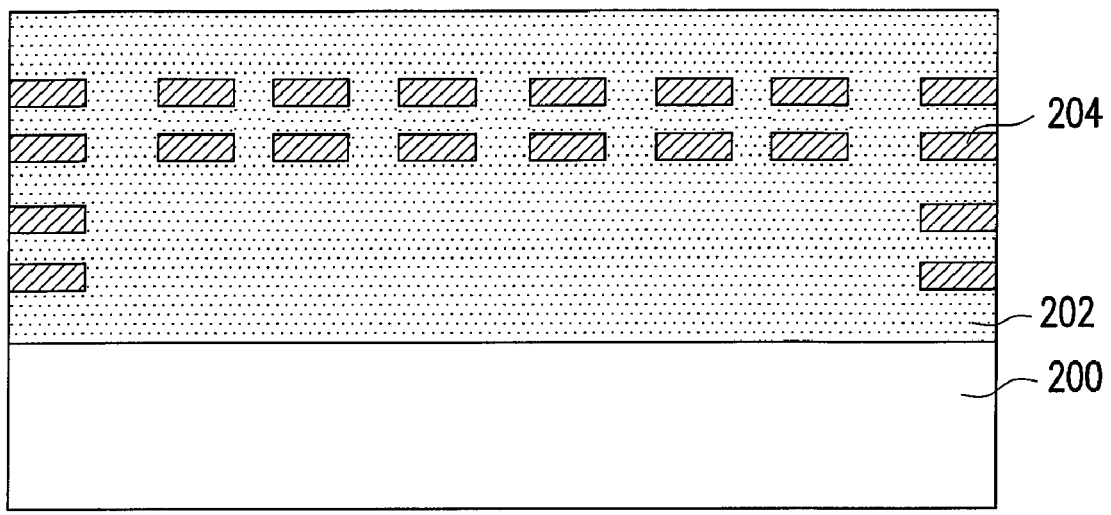
FIGS. 34A-34F are cross-sectional views, schematically illustrating a process flow for fabricating another semiconductor MEMS device, according to an embodiment of the invention.
Figure 34B:
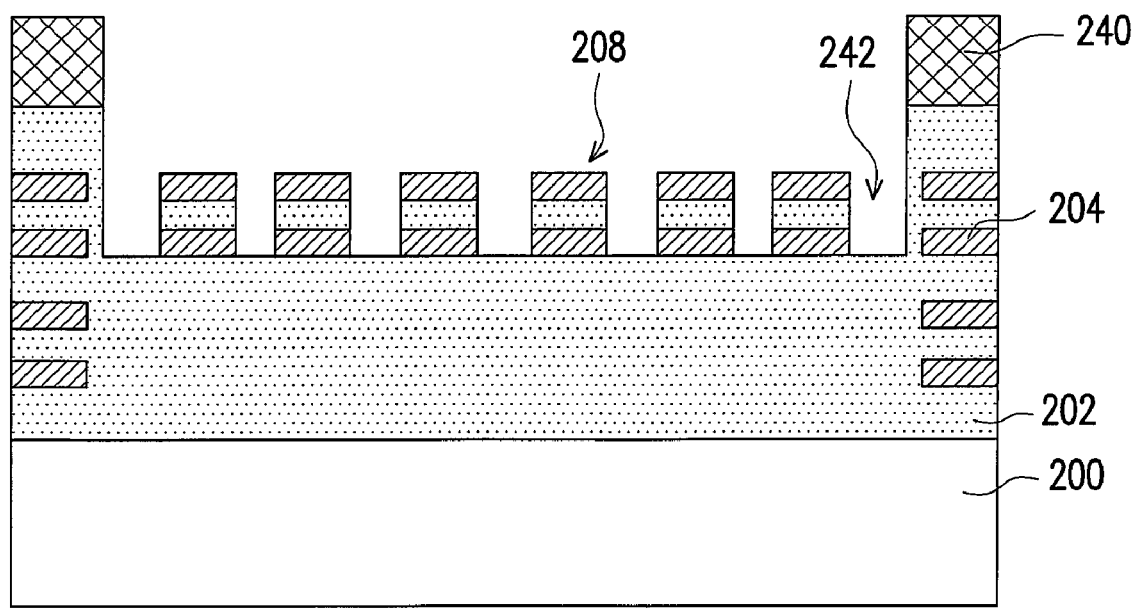

FIGS. 34A-34F are cross-sectional views, schematically illustrating a process flow for fabricating another semiconductor MEMS device, according to an embodiment of the invention. In FIG. 34A, a structural dielectric layer 200 is formed over the substrate 200. The structural dielectric layer 200 can have embedded conductive pattern 204. The structural dielectric layer 200, for example, has several dielectric layers for forming the several conductive layers by patterning process. In FIG. 34B, a photoresist layer 240 is formed on the structural dielectric layer 202. The photoresist layer 240 is used as the etching mask, the anisotropic etching process is performed to etch the dielectric of the structural dielectric layer 202. When the conductive pattern 204 is exposed, the conductive pattern 204 is also serving as the etching mask. As a result, the stack 208 is formed while the etched holes 242 are formed between the stacks 208.

Figure 34C:
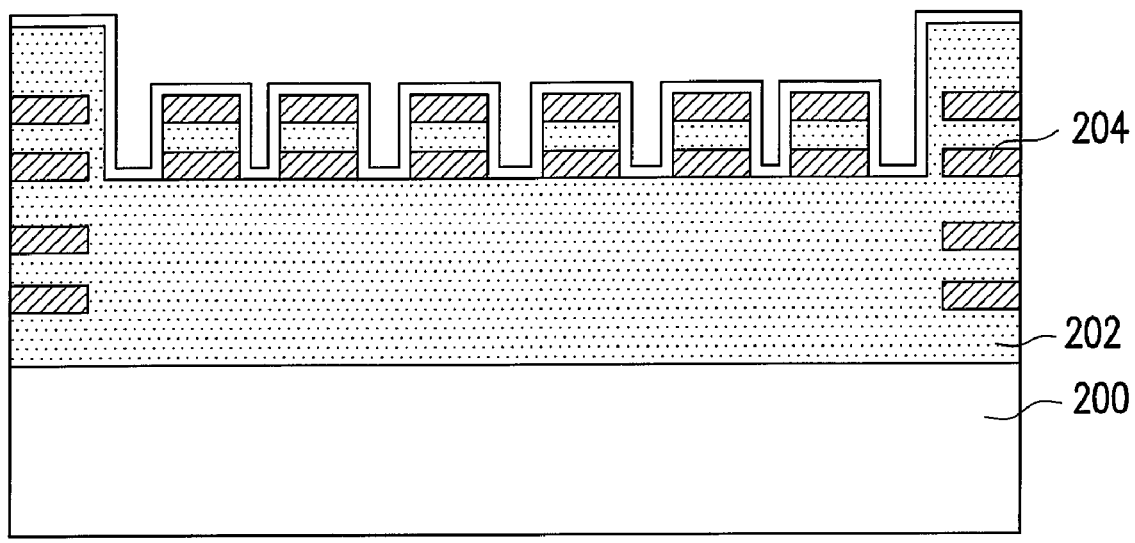
Figure 34D:
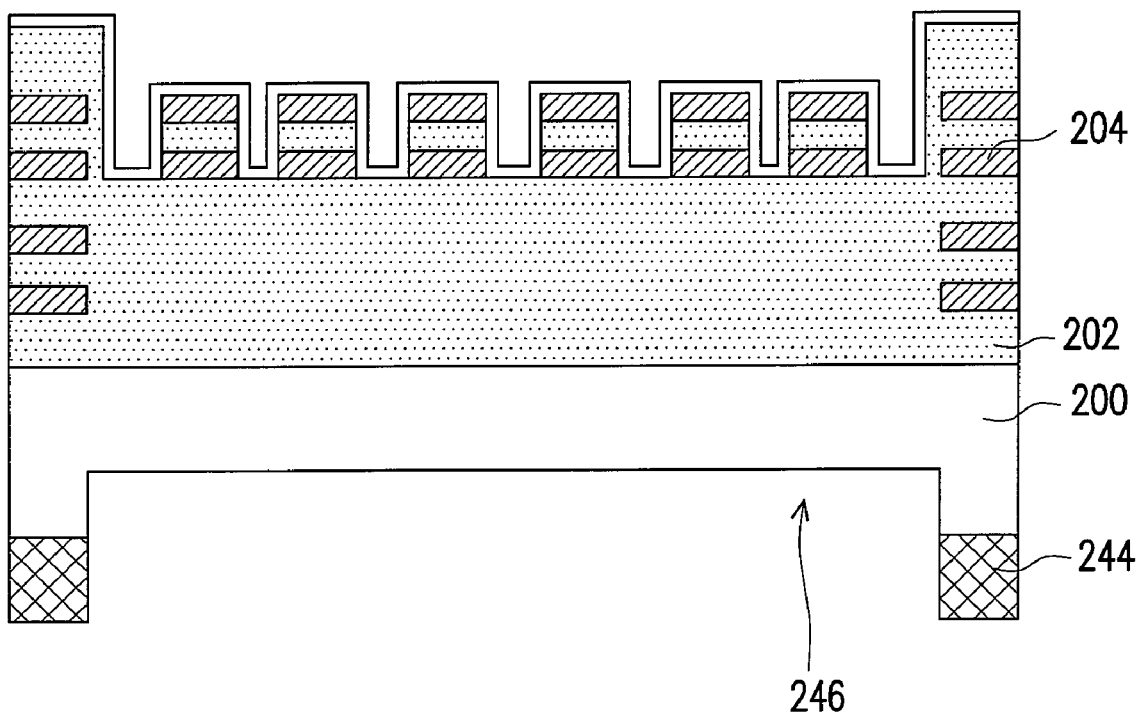
Figure 34E:
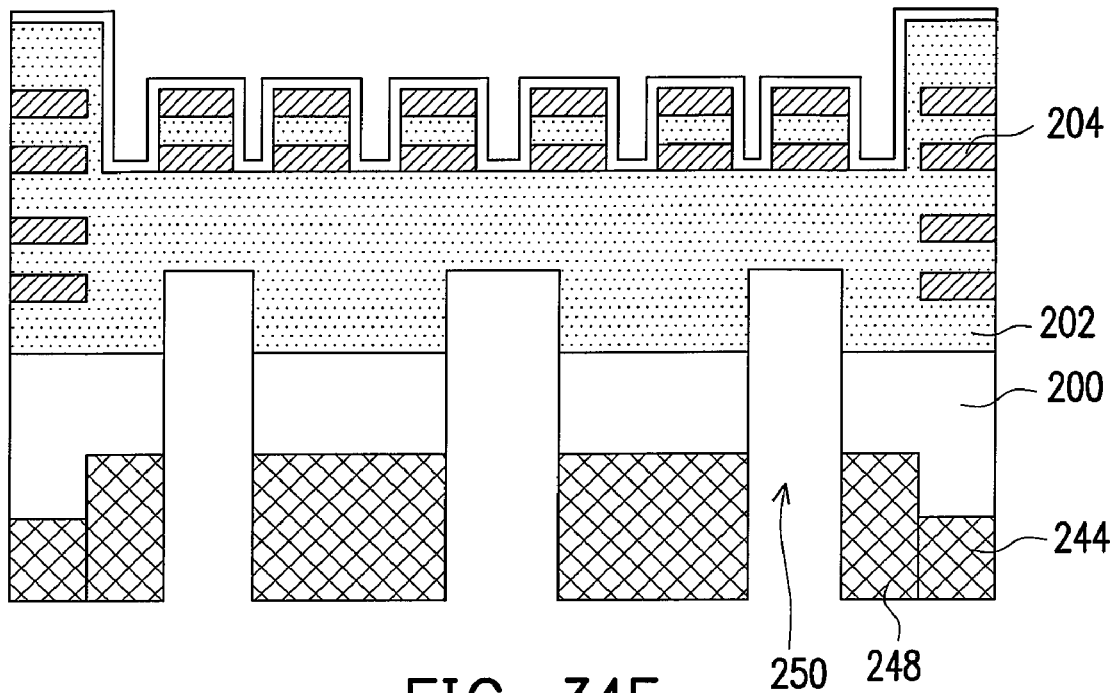
Figure 34F:
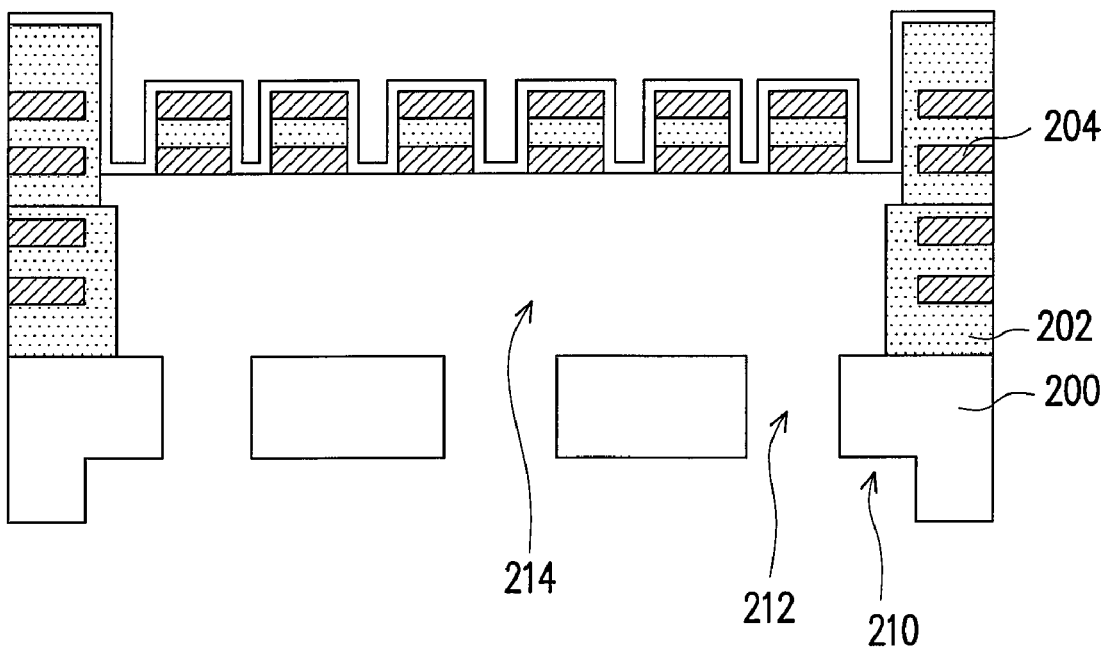

In FIG. 34C, an etching stop layer is formed over the structural dielectric layer 202, including cover the stacks 208 and the bottom surface of the holes 242. In FIG. 34D, the photoresist layer 244 is formed on the backside of the substrate 200. The photoresist layer 244 is used as the etching mask. Then, the substrate 200 is etched by the etching process from the backside, so as to form a concave region 246. In FIG. 34E, another photoresist layer 248 is formed together with the photoresist layer 248 with a hole pattern 250 to expose the substrate 200 within the concave region 210. Then, another etching process is performed to etch the substrate 200, so as to form the perforating holes 212 (see FIG. 34F) to expose the structural dielectric layer 202. In FIG. 34F, the same etching process etch the substrate 200 to form the perforating holes 212 and may be continuously performed to remove a portion of the structural dielectric layer 202 is removed to form the chamber 214. Alternatively, another etching process with different etching condition is performed so as to remove the portion of the structural dielectric layer 202 to form the chamber 214. The etching process can stop at the etching stop layer and the conductive pattern 204. As a result, the MEMS device can be accomplished.

Figure 35A:
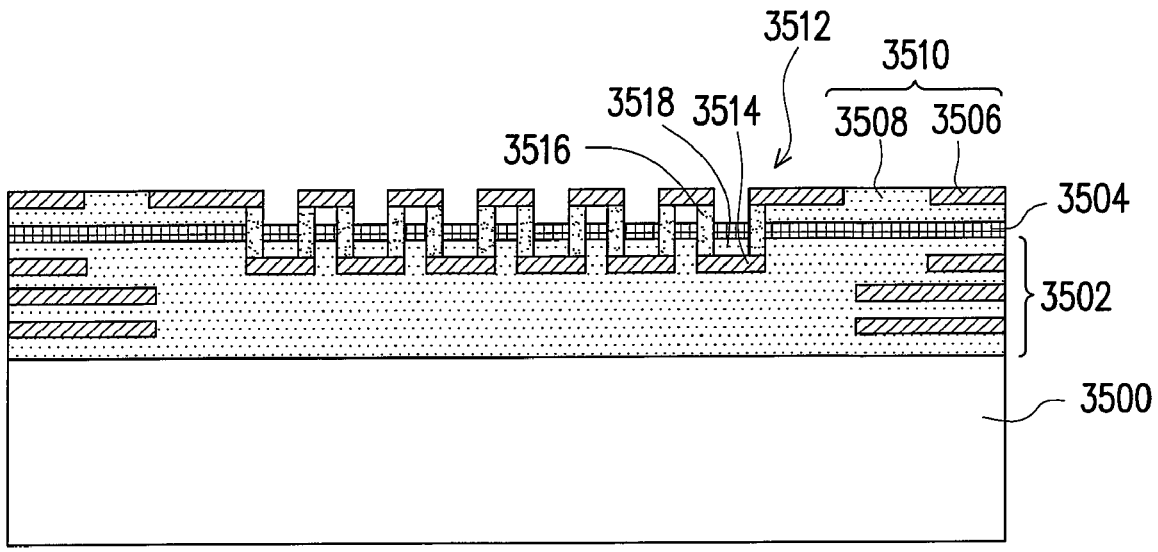
FIGS. 35A-35E are cross-sectional views, schematically illustrating a process flow for fabricating another semiconductor MEMS device, according to an embodiment of the invention.

FIGS. 35A-35E are cross-sectional views, schematically illustrating a process flow for fabricating another semiconductor MEMS device, according to an embodiment of the invention. The processes can fabricate the structure in FIG. 19. In FIG. 35A, a structural dielectric layer 3502 is formed on the substrate 3500. The structural dielectric layer 3502, as previously described, includes, for example, a dielectric layer with embedded metal. An etching stop layer 3504 is formed on the first structural dielectric layer 3502. A second structural dielectric layer 3510, including the dielectric layer 3508 and the conductive layer 3506, is formed on the etching stop layer 3504. However, a structure 3512 is formed in the first structural dielectric layer 3502, the second structural dielectric layer 3510, and the etching stop layer 3504. The structure 3512 includes the metal layer 3514 and the metal via 3516. The dielectric portion 3518 between the etching stop layer 3504 and the metal layer 3514 still remain.

Figure 35B:
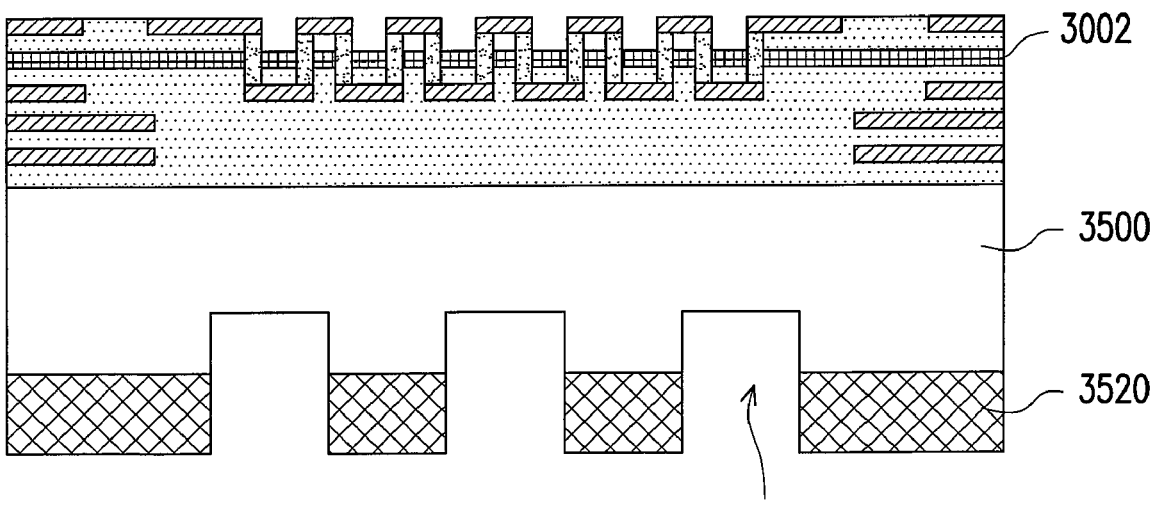

In FIG. 35B, a photoresist layer 3520 with a pattern is formed on the back side of the substrate 3500. The substrate 3500 is then etched, using the photoresist layer as the mask, to have the holes 3522 with a desired depth.

Figure 35C:
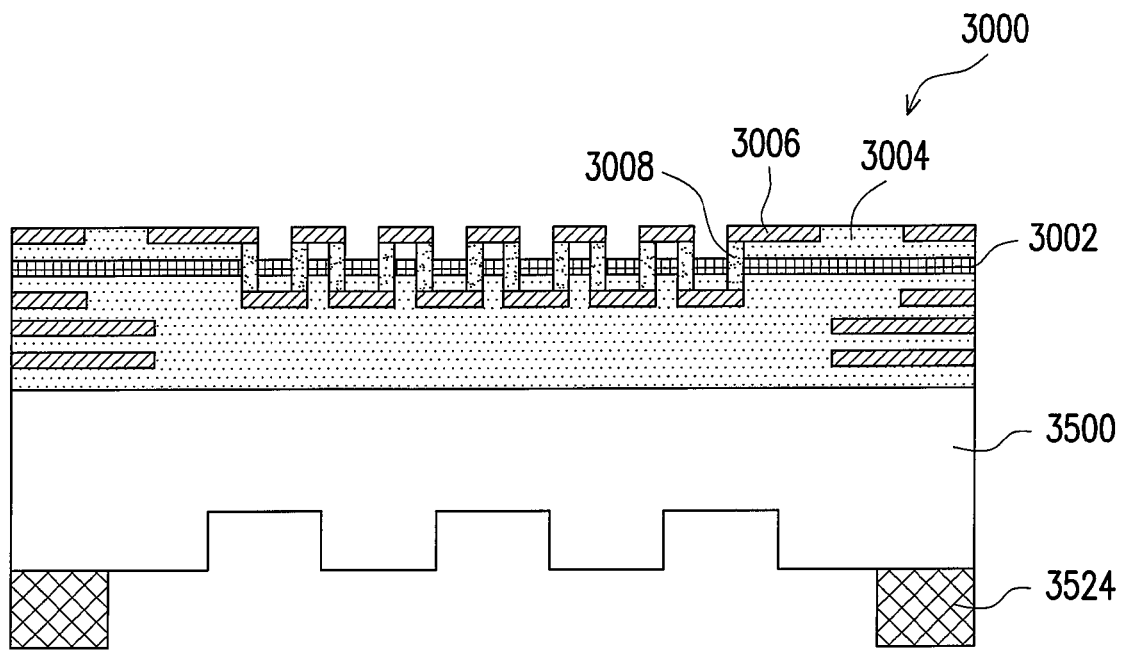
Figure 35D:
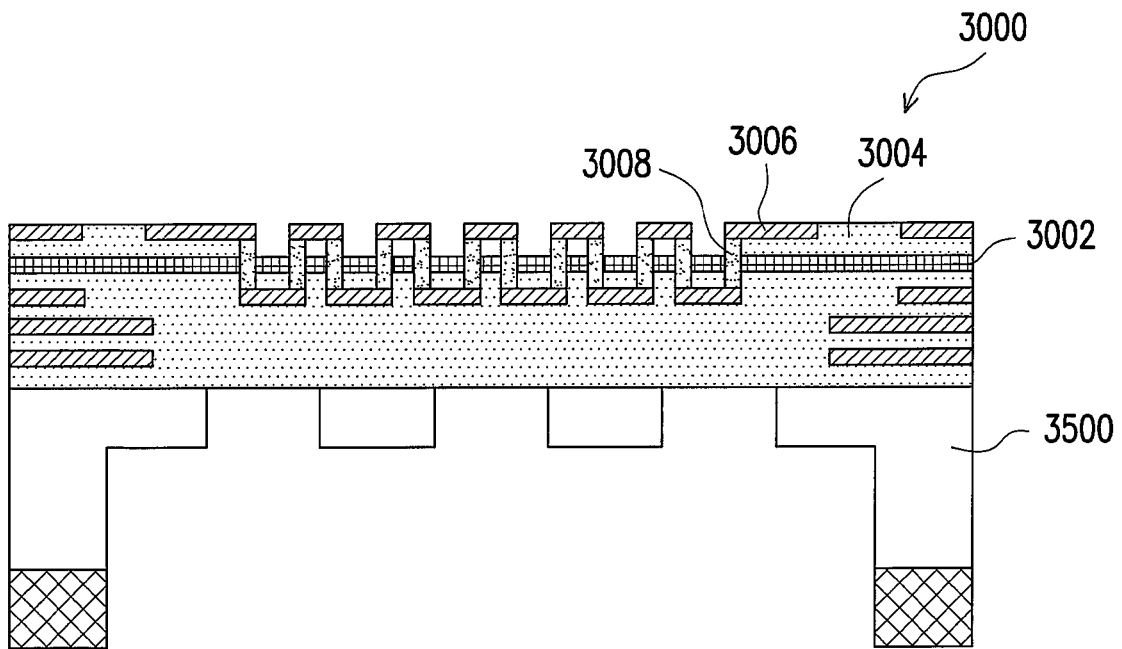
Figure 35E:
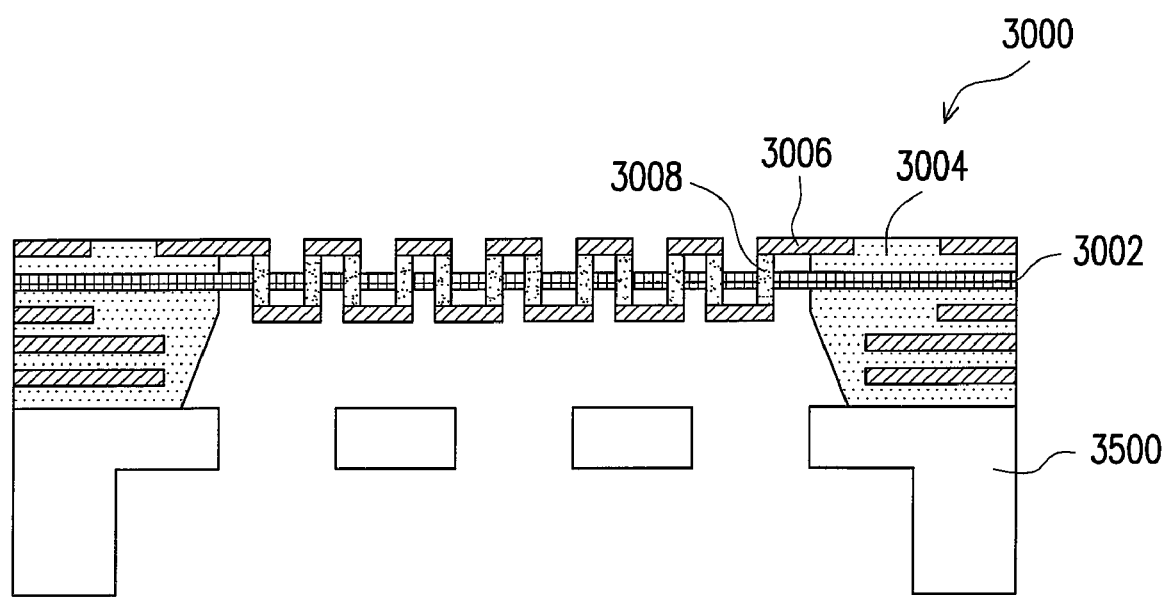

In FIG. 35C, another photoresist layer 3524 is also formed on the back side of the substrate 3500 to further expose the substrate 3500. In FIG. 35D, the substrate 3500 is again etched, using the photoresist layer 3524 as the mask, to expose the first structural dielectric layer 3502. Here, since the depth of the hole is predetermined, the remaining portion of the substrate 3500 has the desired depth for the cavity. In FIG. 35E, the first structural dielectric layer 3502 can be etched through the hole 3522, so as to form the chamber, as shown in FIG. 19.

Basically, the first structural layer 3502 and the second structural layer 3510 can be considered as a single structural dielectric layer. The conductive etching stop layer may include the metal layers 3506 and 3514 with different levels, and the metal via 3516. The conductive etching stop layer is disposed over the structural dielectric layer. A plurality of dielectric stacks 3518 and 3504 are disposed on the structural dielectric layer. The conductive etching stop layer and the dielectric stacks serve as at least a part of a micro-machine diaphragm, and cover over the opening of the first structural dielectric layer to form a chamber between the micro-machine diaphragm and the back-plate substrate. The etchings stop layer 3504 is at a level between the two levels of the metal layers 3514 and 3506.

Figure 36A:
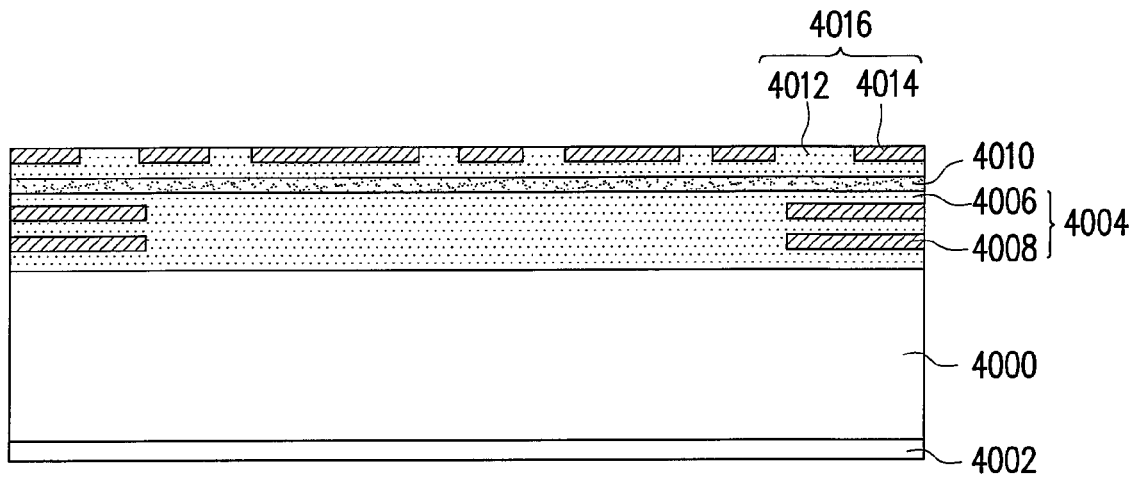
FIGS. 36A-36F are cross-sectional views, schematically illustrating a process flow for fabricating another semiconductor MEMS device, according to an embodiment of the invention.

FIG. 36A-36F are cross-sectional views, schematically illustrating a process flow for fabricating another semiconductor MEMS device, according to an embodiment of the invention. In FIG. 36A, a substrate 4000 has a hard mask layer 4002 on the back side and a first structural dielectric layer 4004 on the top side of the substrate 4000. The first structural dielectric layer 4004, as previously described, includes the dielectric layer 4006 with the embedded metal layer 4008. An etching stop layer 4010 is on the first structural dielectric layer 4004. A second structural dielectric 4016, having the dielectric layer 4012 with the embedded metal layer 4014.

Figure 36B:
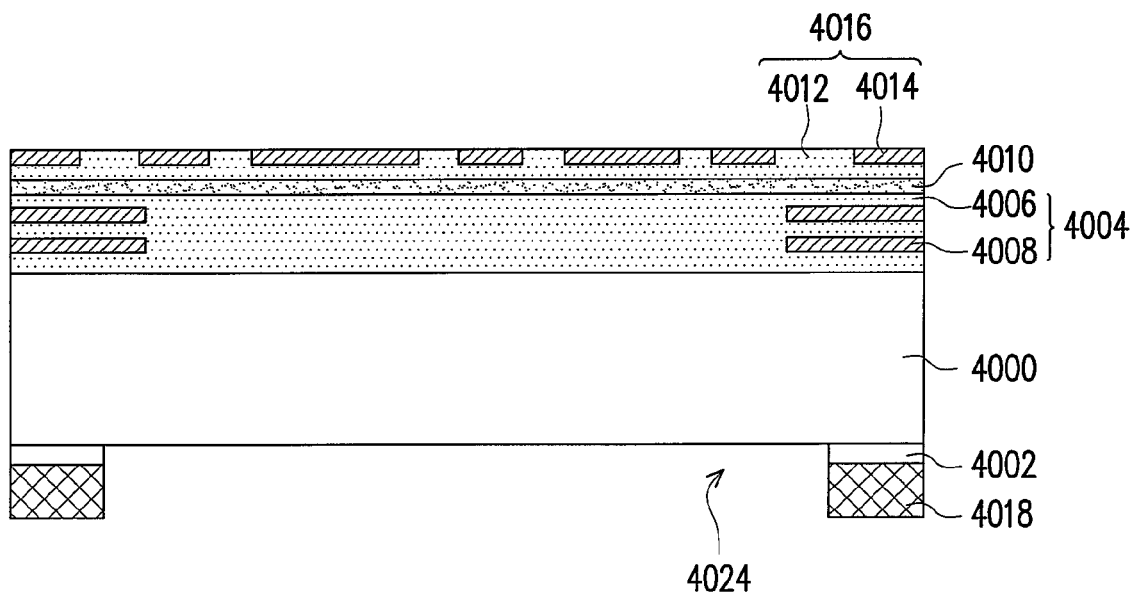
Figure 36C:
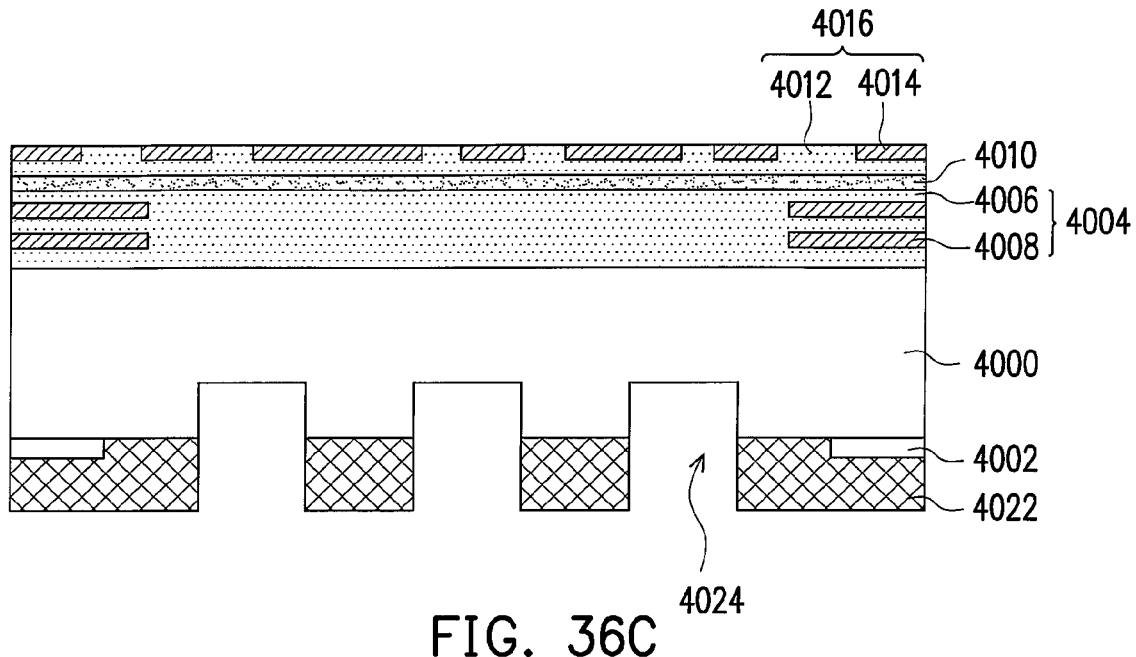
Figure 36D:
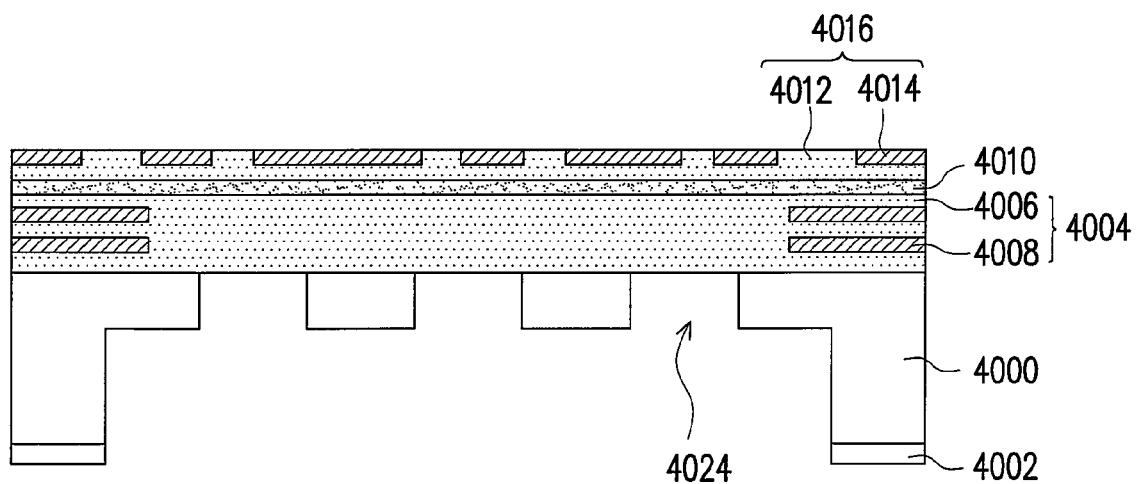

In FIG. 36B, a photoresist layer 4018 is formed on the hard mask layer 4002. The photoresist layer 4018 has the opening 4020 to expose the hard mask layer 4002. Then, a portion of the hard mask layer 4002 is etched to expose the substrate 4000. In FIG. 36C, another photoresist layer 4022 is formed over the substrate 4000. The photoresist layer 4022 has another opening to expose the substrate 4000. The substrate 4000 is etched to have a hole 4024 with a desired depth, using the photoresist layer 4022 as the mask. In FIG. 36D, the photoresist layer 4022 is removed. The substrate 4000 is then etched by using the hard mask layer 4002 as the etching mask. The first structural dielectric layer is then exposed by the hole 4024.

Figure 36E:
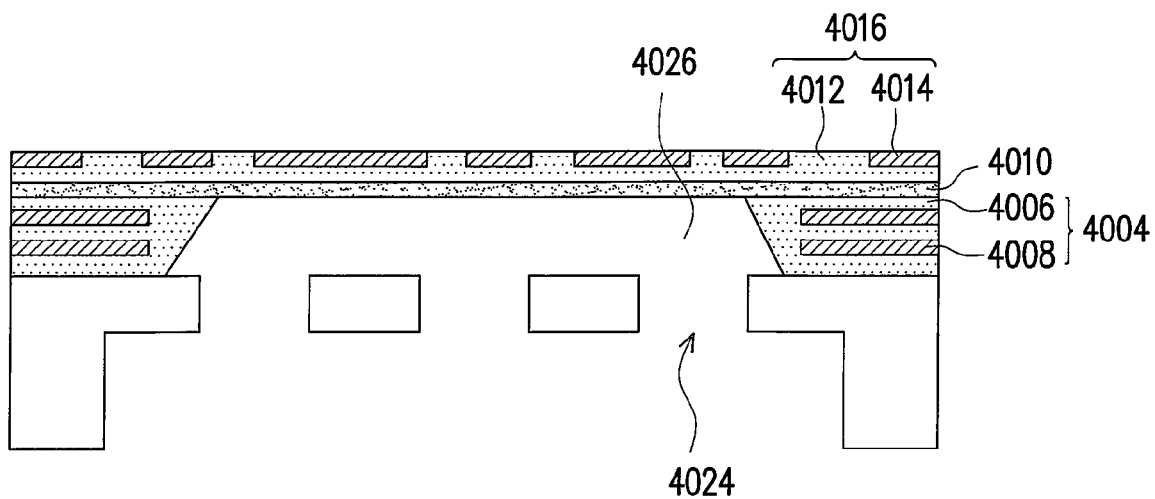
Figure 36F:
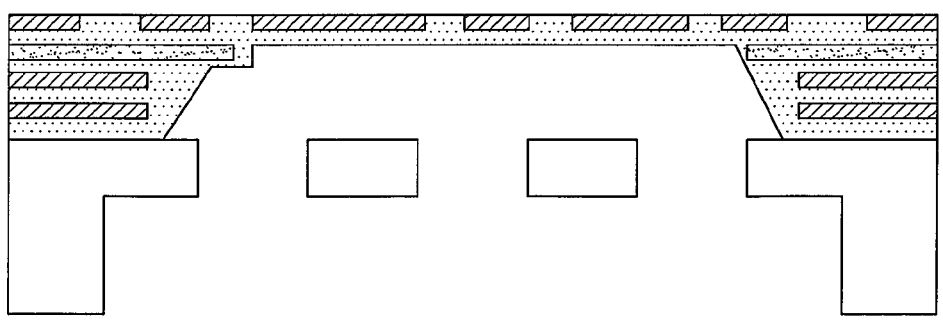

In FIG. 36E, the first structural dielectric layer 4004 is etched through the hole 4024, so as to form the chamber 4026 to expose the etching stop layer 4010. In FIG. 36F, if it is desired in an example, a portion of the etching stop layer 4004 can be then further removed.

It should be noted that in some embodiments as described above, the process is to form the vent hole beforehand. Then, after the substrate is etched the vent hole and the cavity are formed together. Further, the hard mask layer instead of photoresist on the back side of the substrate can also ensure the etching process on the substrate with better quality.

Figure 37:
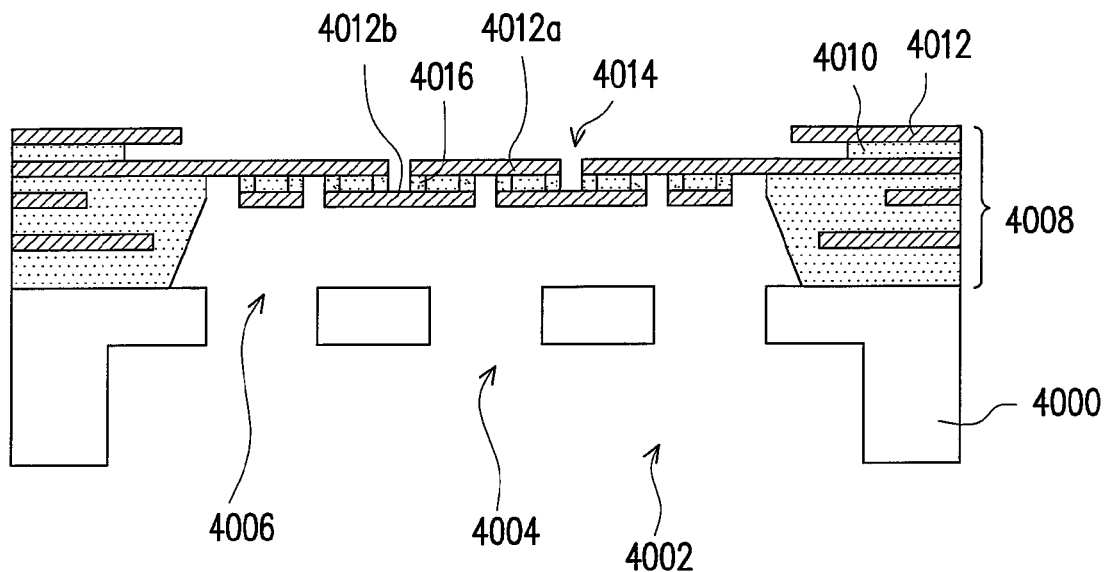
FIG. 37 is a cross-sectional view, schematically illustrating another semiconductor MEMS device, according to an embodiment of the invention.

Alternatively, similar to the structures in FIGS. 18 and 19, the structure can be further modified for the micro-diaphragm. FIG. 37 is a cross-sectional view, schematically illustrating another semiconductor MEMS device, according to an embodiment of the invention. In FIG. 37, the substrate 4000 has a cavity 4002 and several perforating holes 4004 within the cavity 4002. The dielectric structural layer 4008 is formed over the substrate 4000. The dielectric structural layer 4008 includes a dielectric layer 4010 and the metal layer 4012 embedded in the dielectric structural layer 4008. A portion of the dielectric layer 4010 is removed to form a chamber 4006. A portion of the metal layer 4012 and a portion of the dielectric layer 4010, above the chamber 4006 form a micro-diaphragm 4014. The micro-diaphragm 4014 includes the metal layer 4012a, the metal layer 4012b and the metal via 4016. In order to form the diaphragm, the metal layer 4012a and the metal layer 4012b in two levels are joined together by the metal via 4016 and a portion of the dielectric layer 4010. In other words, the structural conductive etching stop layer has two metal layers in different levels and a metal via vertically connects the two metal layers. The metal via is in pair to wrap the dielectric layer as a dielectric block.

Figure 38A:
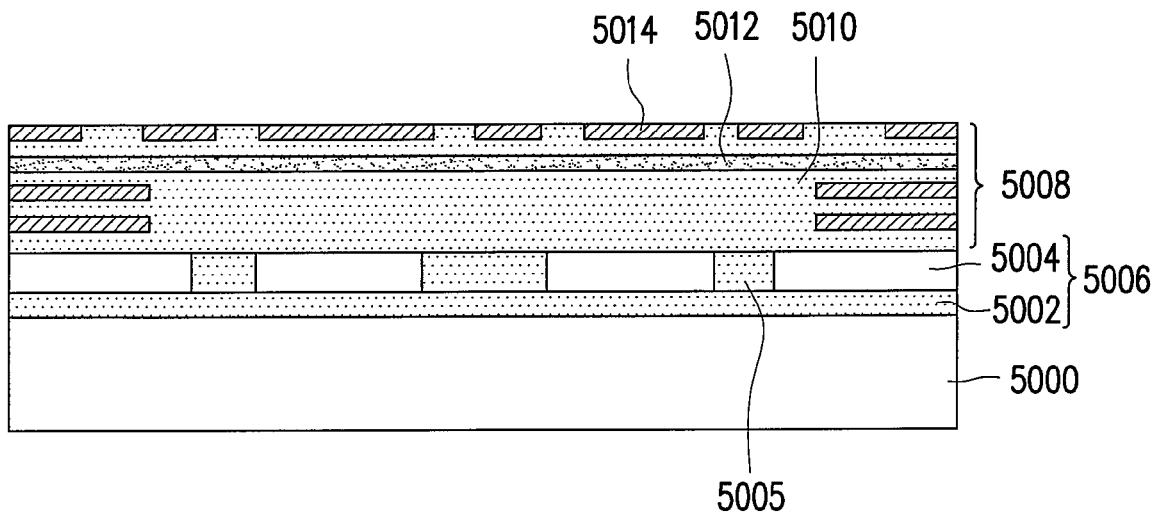
FIGS. 38A-38C are cross-sectional views, schematically illustrating a process flow for fabricating the semiconductor MEMS device with SOI structure, according to an embodiment of the invention.
Figure 38B:
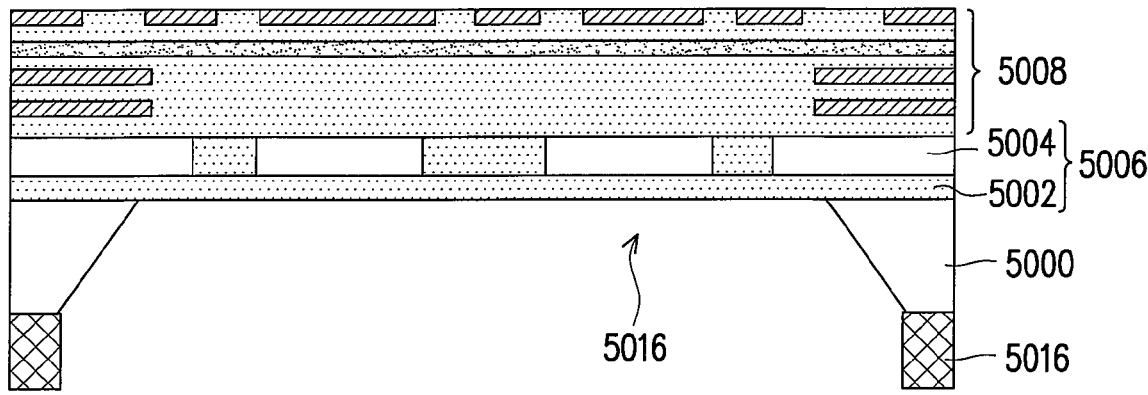
Figure 38C:
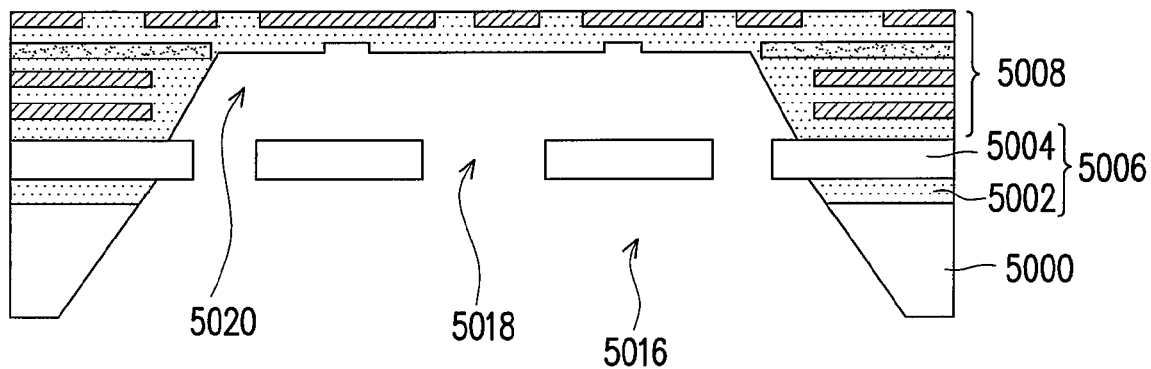

Further, in order to fabricate the MEMS device with SOI layer, such as the structure in FIG. 20, the fabrication process floe is described, for example. FIGS. 38A-38C are cross-sectional views, schematically illustrating a process flow for fabricating the semiconductor MEMS device with SOI structure, according to an embodiment of the invention. In FIG. 38A, a substrate 5000 has a SOI layer 5006 on top. The SOI layer 5006 has an insulating layer 5002 and a silicon layer 5004. A shallow trench isolation (STI) 5005 is formed in the silicon layer 5004. A structural dielectric layer 5008 is formed over the STI layer 5006. The structural dielectric layer 5008 can include the dielectric layer 5010, an etching stop layer 5012 and the embedded metal layer 5014. In FIG. 38B, a photoresist layer 5016 is formed one the back side of the substrate 5000, serving as the etching mask. An etching process is performed to etch the substrate 5000 from the back side to expose the insulating layer 5002.

Then in FIG. 38C, another etching process is performed, wherein the insulating layer 5002 and further a portion of the STI layer 5005, the dielectric layer 5010 and the etching stop layer 5012 in option are removed. As a result, the chamber 5020 is formed. In other words, the etching process can be performed from the back side of the substrate 5000, in the invention.

It can be understood that the provided embodiment employs the etching stop layer to achieve the MEMS structure based on the semiconductor fabrication process. As a result, the MEMS device can be integrated in the semiconductor circuit to form a single chip, without needing the packaging process. The applications of the MEMS device can be wider and easier.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for forming a micro-electro-mechanical systems (MEMS) device, comprising:
    providing a substrate;
    forming a first structural dielectric layer over the substrate, wherein the first structural dielectric layer including a conductive pattern embedded therein;
    forming an etching stop layer over the first structural dielectric layer;
    forming a second structural dielectric layer over the etching stop layer, wherein the second structural dielectric layer serves as at least a part of a micro-machine diaphragm;
    patterning the substrate from a back side to form a plurality of perforating openings in the substrate to expose the first structural dielectric layer; and
    patterning the first structural dielectric layer through the perforating openings of the substrate to form a chamber in the first structural dielectric layer under the second structural dielectric layer, wherein the etching stop layer is used as a stop when etching the first structural dielectric layer.

2. The method of claim 1, further comprising forming a device structure on the substrate before forming the structural dielectric layer.

3. The method of claim 1, wherein the first structural dielectric layer is simultaneously formed while a metal-oxide semiconductor (MOS) device is formed over the substrate at a region other the MEMS device.

4. The method of claim 1, the etching stop layer has a hole-distribution pattern or a blanket layer.

5. The method of claim 1, wherein in the step of patterning the substrate comprising using a hard mask layer as an etching stop layer for etching the substrate.

6. The method of claim 1, wherein in the step of patterning the substrate comprising forming the perforating hole in the substrate; and etching the substrate to let the perforating hole to expose the first structural dielectric layer.

7. A method for forming a micro-electro-mechanical systems (MEMS) device, comprising:
    providing a substrate;
    forming a first structural dielectric layer over the substrate, wherein the first structural dielectric layer including a conductive pattern embedded therein;
    forming a micro-machine membrane over the first structural dielectric layer;
    patterning the substrate from a back side to form a plurality of perforating openings in the substrate to expose the first structural dielectric layer; and
    patterning the first structural dielectric layer from the perforating openings of the substrate to form a chamber in the first structural dielectric layer under the micro-machine membrane.

8. The method of claim 7, wherein in the step of patterning the substrate comprising using a hard mask layer as an etching stop layer for etching the substrate.

9. The method of claim 7, wherein in the step of patterning the substrate comprising forming the perforating hole in the substrate; and etching the substrate to let the perforating hole to expose the first structural dielectric layer.

10. The method of claim 7, wherein the first structural dielectric layer is simultaneously formed while a metal-oxide semiconductor (MOS) device is formed over the substrate at a region other the MEMS device.

11. The method of claim 7, wherein the micro-machine membrane is used as a stop when patterning the first structural dielectric layer.

* * * * *